United States Patent
Yamada et al.

(10) Patent No.: US 9,991,221 B2
(45) Date of Patent: Jun. 5, 2018

(54) SEMICONDUCTOR INTEGRATED CIRCUIT DEVICE

(71) Applicant: Renesas Electronics Corporation, Koutou-ku, Tokyo (JP)

(72) Inventors: Jun Yamada, Kanagawa (JP); Takafumi Betsui, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/782,182

(22) Filed: Oct. 12, 2017

(65) Prior Publication Data

US 2018/0047696 A1 Feb. 15, 2018

Related U.S. Application Data

(63) Continuation of application No. 14/523,862, filed on Oct. 25, 2014, now Pat. No. 9,818,715.

(30) Foreign Application Priority Data

Oct. 28, 2013 (JP) ................................. 2013-223104

(51) Int. Cl.
*H05K 7/10* (2006.01)
*H05K 7/12* (2006.01)
(Continued)

(52) U.S. Cl.
CPC ............ *H01L 24/33* (2013.01); *H01L 23/145* (2013.01); *H01L 23/31* (2013.01); *H01L 23/481* (2013.01);
(Continued)

(58) Field of Classification Search
USPC .......................................... 361/767; 174/260
See application file for complete search history.

(56) References Cited

U.S. PATENT DOCUMENTS 5,670,802 A 9/1997 Koike
6,223,429 B1 * 5/2001 Kaneda ............... H01L 23/3121
174/260

(Continued)

FOREIGN PATENT DOCUMENTS

JP 08-274127 A 10/1996
JP 2008-004714 A 1/2008
(Continued)

*Primary Examiner* — Andargie M Aychillhum
(74) *Attorney, Agent, or Firm* — Shapiro, Gabor and Rosenberger, PLLC

(57) ABSTRACT

A semiconductor integrated circuit chip, in which multi-core processors are integrated, is usually mounted over an organic wiring board by FC bonding to form a BGA package by being integrated with the substrate. In such a structure, power consumption is increased, and hence the power supplied only from a peripheral portion of the chip is insufficient, so that a power supply pad is also provided in the chip central portion. However, because of an increase in the wiring associated with the integration of a plurality of CPU cores, etc., there occurs a portion between the peripheral portion and the central portion of the chip, where a power supply pad cannot be arranged. According to the outline of the present application, in a semiconductor integrated circuit device such as a BGA, etc., in which a semiconductor chip is mounted over an interposer, such as a multilayer organic wiring board, in a face-up manner, a first group of metal through electrodes, which are provided in the semiconductor chip to supply a power supply potential to a core circuit, etc., and a first metal land over the interposer are interconnected by a first conductive adhesive member film.

9 Claims, 34 Drawing Sheets

(51) Int. Cl.
*H01L 23/00* (2006.01)
*H01L 25/065* (2006.01)
*H01L 23/538* (2006.01)
*H01L 23/498* (2006.01)
*H01L 23/48* (2006.01)
*H01L 23/14* (2006.01)
H01L 23/31 (2006.01)
H05K 3/32 (2006.01)

(52) U.S. Cl.
CPC .. *H01L 23/49822* (2013.01); *H01L 23/49827* (2013.01); *H01L 23/49894* (2013.01); *H01L 23/5383* (2013.01); *H01L 23/5384* (2013.01); *H01L 24/05* (2013.01); *H01L 24/13* (2013.01); *H01L 24/32* (2013.01); *H01L 24/49* (2013.01); *H01L 24/73* (2013.01); *H01L 25/065* (2013.01); H01L 23/3128 (2013.01); H01L 24/16 (2013.01); H01L 24/29 (2013.01); H01L 24/45 (2013.01); H01L 24/48 (2013.01); H01L 2224/0401 (2013.01); H01L 2224/04042 (2013.01); H01L 2224/05009 (2013.01); H01L 2224/05022 (2013.01); H01L 2224/05027 (2013.01); H01L 2224/0557 (2013.01); H01L 2224/05124 (2013.01); H01L 2224/05554 (2013.01); H01L 2224/05567 (2013.01); H01L 2224/05568 (2013.01); H01L 2224/05572 (2013.01); H01L 2224/05573 (2013.01); H01L 2224/05611 (2013.01); H01L 2224/05624 (2013.01); H01L 2224/133 (2013.01); H01L 2224/13009 (2013.01); H01L 2224/1329 (2013.01); H01L 2224/13147 (2013.01); H01L 2224/13564 (2013.01); H01L 2224/13565 (2013.01); H01L 2224/13578 (2013.01); H01L 2224/13611 (2013.01); H01L 2224/13686 (2013.01); H01L 2224/16146 (2013.01); H01L 2224/16237 (2013.01); H01L 2224/16238 (2013.01); H01L 2224/293 (2013.01); H01L 2224/2929 (2013.01); H01L 2224/32145 (2013.01); H01L 2224/32225 (2013.01); H01L 2224/335 (2013.01); H01L 2224/33515 (2013.01); H01L 2224/45124 (2013.01); H01L 2224/45139 (2013.01); H01L 2224/45144 (2013.01); H01L 2224/45147 (2013.01); H01L 2224/45164 (2013.01); H01L 2224/48091 (2013.01); H01L 2224/48227 (2013.01); H01L 2224/48465 (2013.01); H01L 2224/49 (2013.01); H01L 2224/73203 (2013.01); H01L 2224/73204 (2013.01); H01L 2224/73207 (2013.01); H01L 2224/73215 (2013.01); H01L 2224/73257 (2013.01); H01L 2224/73265 (2013.01); H01L 2924/13091 (2013.01); H01L 2924/1579 (2013.01); H01L 2924/15333 (2013.01); H01L 2924/15788 (2013.01); H01L 2924/181 (2013.01); H05K 3/323 (2013.01)

(56) References Cited

U.S. PATENT DOCUMENTS 6,373,127 B1 * 4/2002 Baudouin ........... H01L 23/4951
257/666
2011/0242714 A1 10/2011 Hirota

FOREIGN PATENT DOCUMENTS

| JP | 2008-300469 A | 12/2008 |
|----|---------------|---------|
| JP | 2011-216592 A | 10/2011 |
| JP | 2012-044042 A | 3/2012 |

* cited by examiner

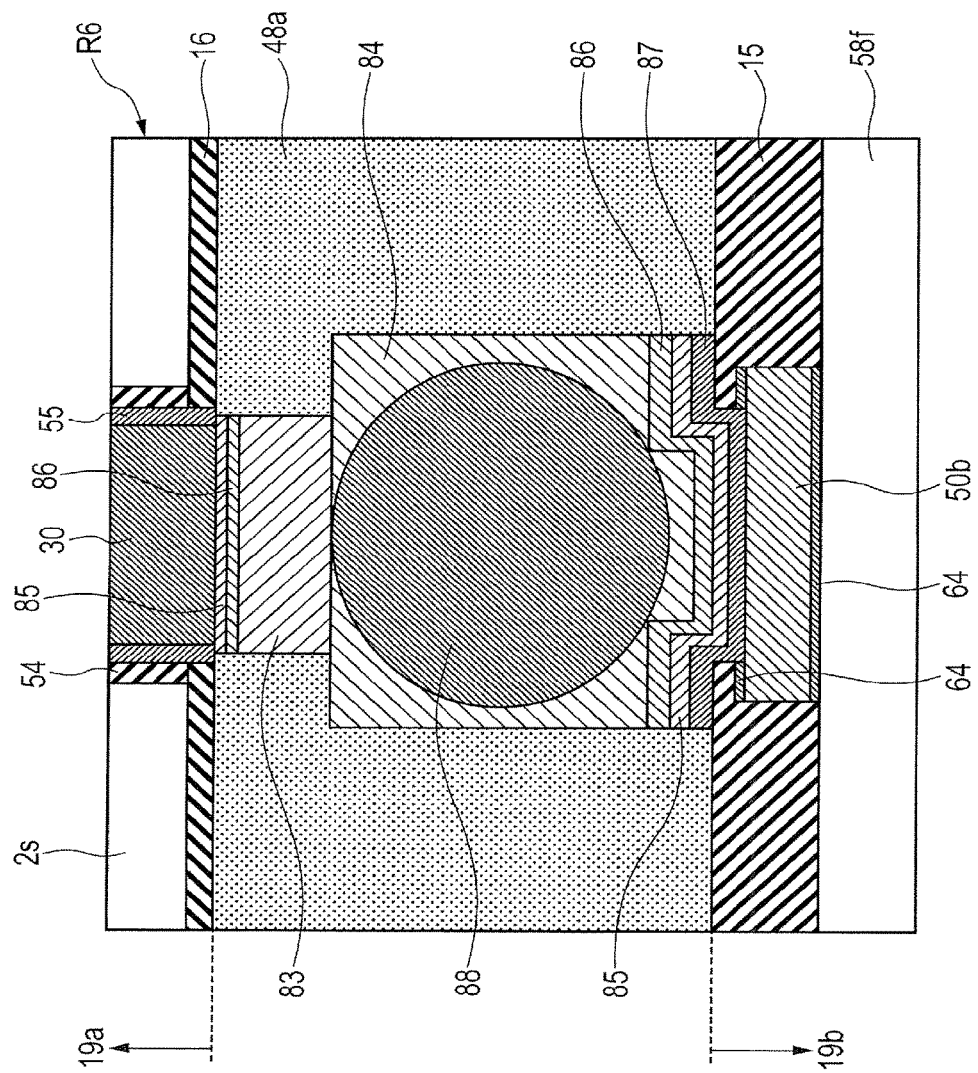

SEMICONDUCTOR INTEGRATED CIRCUIT DEVICE

CROSS-REFERENCE TO RELATED APPLICATIONS

The disclosure of Japanese Patent Application No. 2013-223104 filed on Oct. 28, 2013 including the specification, drawings and abstract is incorporated herein by reference in its entirety.

BACKGROUND

The present application relates to a semiconductor integrated circuit device (or semiconductor device), and can be applied, for example, to a device in which a semiconductor chip is mounted over a wiring board.

Japanese Unexamined Patent Application Publication No. 2008-300469 (Patent Document 1) relates to a laminated chip using a TSV (Through-Silicon Via) technique. In Patent Document 1, a chip laminated structure is disclosed, in which the uppermost layer chip is connected to lower chips including a power supply via a TSV, and further connected to the outside via a bonding wire.

Japanese Unexamined Patent Application Publication No. 1996-274127 (Patent Document 2) or U.S. Pat. No. 5,670,802 (Patent Document 3) corresponding to Patent Document 2 relates to an LSI (Large Scale Integration) having many terminals. In Patent Document 2 and Patent Document 3, a technique is disclosed, in which a power supply terminal, etc., in an interface circuit and that in an internal circuit are taken out independently by using bonding wires.

Japanese Unexamined Patent Application Publication No. 2008-4714 (Patent Document 4) relates to a laminated chip using a TSV technique. In Patent Document 4, a technique is disclosed, in which power and a reference potential are supplied to upper chips via bonding pads and bonding wires, and signals are communicated from upper chips to lower chips via through electrodes and capacitive coupling.

Japanese Unexamined Patent Application Publication No. 2011-216592 (Patent Document 5) or U.S. Unexamined Patent Application Publication No. 2011-242714 (Patent Document 6) corresponding to Patent Document 5 relates to ESD (Electrostatic discharge) regarding the interface of a semiconductor chip. In Patent Document 5 and Patent Document 6, a technique is disclosed, in which ground terminals are used in common in an internal circuit and an interface circuit in order to reduce the number of electrode pads.

RELATED ART DOCUMENTS

Patent Documents

[Patent Document 1] Japanese Unexamined Patent Application Publication No. 2008-300469
[Patent Document 2] Japanese Unexamined Patent Application Publication No. 1996-274127
[Patent Document 3] U.S. Pat. No. 5,670,802
[Patent Document 4] Japanese Unexamined Patent Application Publication No. 2008-4714
[Patent Document 5] Japanese Unexamined Patent Application Publication No. 2011-216592
[Patent Document 6] U.S. Unexamined Patent Application Publication No. 2011-242714

SUMMARY

For example, a semiconductor integrated circuit chip, in which multi-core processors are integrated, is usually mounted over an organic wiring board by FC (flip-chip) bonding to form a BGA (Ball Grid Array) package by being integrated with the substrate.

Since power consumption is increased in such a structure, the power supplied only from a peripheral portion of the chip (peripheral pad) is insufficient, so that a power supply pad is also provided in a central portion of the chip (chip area portion).

However, as a result of the study by the present inventors, it has been made clear that, because of an increase in the wiring associated with the integration of a plurality of CPU (Central Processing Unit) cores and GPUs (Graphics Processing Units), etc., there occurs a portion between the peripheral portion and the central portion of a chip, where a power supply pad cannot be arranged. It has also been made clear that, if the above problem is intended to be avoided by miniaturizing an organic wiring board, i.e., an interposer, cost is greatly increased.

If there is a portion where a power supply pad cannot be arranged in this way, there occurs the problem that a power supply voltage drop becomes remarkable in the portion, etc.

Hereinafter, means, etc., for solving such a problem will be described, and other problems and new features will be made clear from the description and the accompanying drawings in the present application.

Of preferred embodiments disclosed in the present application, the outline of a typical one will be briefly described as follows.

That is, in a semiconductor integrated circuit device such as a BGA, in which a semiconductor chip is mounted, in a face-up manner, over an interposer such as a multi-layer organic wiring board, a first group of metal through electrodes, which are provided in the semiconductor chip to supply a power supply potential to a core circuit, etc., and a first metal land over the interposer are interconnected by a first conductive adhesive member film.

An advantage obtained by the typical embodiment, of preferred embodiments disclosed in the present application, will be briefly described as follows.

That is, according to the one embodiment of the present application, an undesired power supply voltage drop in a partial region of a semiconductor chip can be avoided.

BRIEF DESCRIPTION OF THE DRAWINGS

FIG. 34 is an enlarged sectional view of the connection region R6 between the memory chips in FIG. 19, for explaining a variation of FIG. 21 (the metal adhesive layer 70, etc., is illustrated in a state before junction is formed, according to custom; the same shall apply hereinafter).

DETAILED DESCRIPTION

Outline of Embodiments

Figure 1:
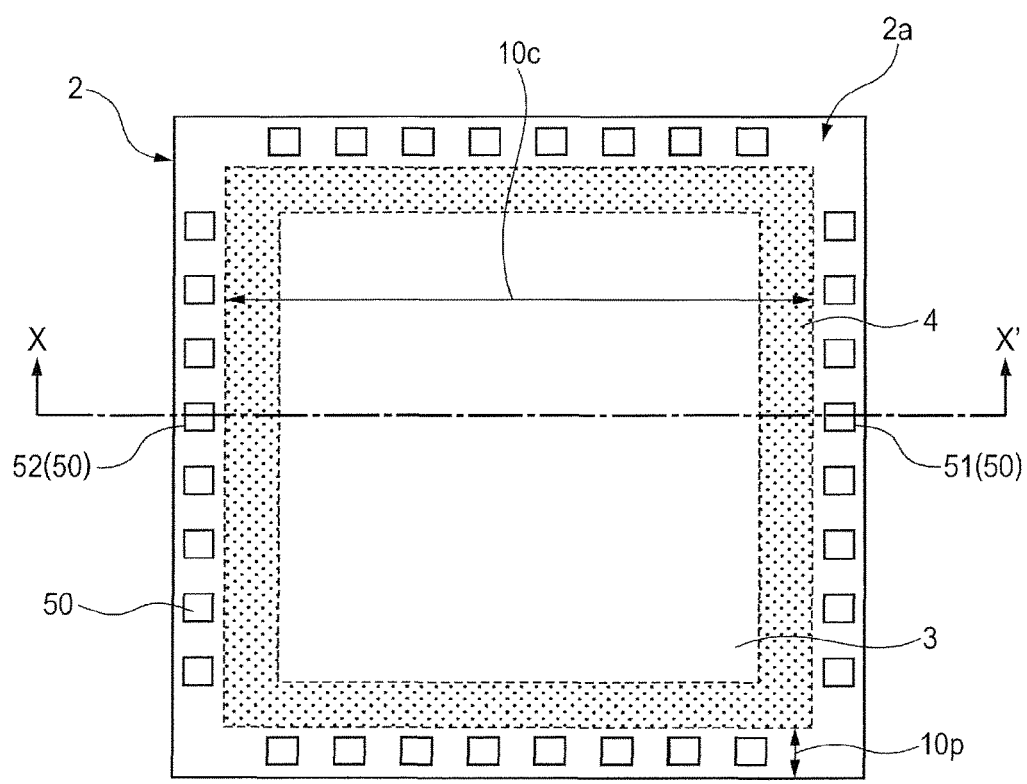
FIG. 1 is an overall top view of a system chip, etc., that forms one main part of a BGA (Ball Grid Array), etc., that is an example of a target device in a semiconductor integrated circuit device of one embodiment of the present application.

The outline of a typical embodiment disclosed in the present application will be first described.

1. A semiconductor integrated circuit device including:
(a) a first organic wiring board having a top surface and a rear surface;
(b) a first metal land formed over the top surface of the first organic wiring board;
(c) a semiconductor chip that has a first main surface and a second main surface and is mounted on the top surface side of the first organic wiring board via the second main surface;
(d) a first integrated circuit region and a second integrated circuit region, which are provided on the first main surface side of the semiconductor chip;
(e) a first group of metal through electrodes that penetrate a space between the first main surface and the second main surface of the semiconductor chip to supply a power supply potential to the first integrated circuit region; and
(f) a first conductive adhesive member film that is provided between the top surface of the first organic wiring board and the second main surface of the semiconductor chip to electrically connect the first metal land and the first group of the metal through electrodes with one another.

2. The semiconductor integrated circuit device according to Item 1, in which the first integrated circuit region is an internal circuit region and the second integrated circuit region is an I/O circuit region.

3. The semiconductor integrated circuit device according to Item 1 or Item 2 further including:
(g) a first bonding pad formed over the first main surface side of the semiconductor chip to supply a power supply potential to the second integrated circuit region;
(h) a second metal land formed over the top surface of the first organic wiring board; and
(i) a first bonding wire connecting the first bonding pad and the second metal land with one another.

4. The semiconductor integrated circuit device according to Item 3 further including:
(j) a third metal land formed over the top surface of the first organic wiring board;
(k) a second group of metal through electrodes that penetrate a space between the first main surface and the second main surface of the semiconductor chip;
(l) a second conductive adhesive member film that is provided between the top surface of the first organic wiring board and the second main surface of the semiconductor chip to electrically connect the third metal land and the second group of the metal through electrodes with one another;
(m) a second bonding pad formed over the first main surface side of the semiconductor chip to supply a ground potential to the second integrated circuit region;
(n) a fourth metal land formed over the top surface of the first organic wiring board; and
(o) a second bonding wire connecting the second bonding pad and the fourth metal land with one another, in which the second group of the metal through electrodes supply a ground potential to the first integrated circuit region.

5. The semiconductor integrated circuit device according to Item 4, in which the first conductive adhesive member film and the second conductive adhesive member film include a conductive paste member.

6. The semiconductor integrated circuit device according to Item 4, in which the first conductive adhesive member film and the second conductive adhesive member film include a solder member.

7. The semiconductor integrated circuit device according to any one of Items 4 to 6, in which the first conductive adhesive member film and the second conductive adhesive member film are isolated, in plan view, from each other by a solder resist film over the top surface of the first organic wiring board.

8. The semiconductor integrated circuit device according to any one of Items 4 to 7, in which a lower end of each of the first group of the metal through electrodes and the first conductive adhesive member film are directly and electrically connected with one another, while a lower end of each of the second group of the metal through electrodes and the second conductive adhesive member film are directly and electrically connected with one another.

9. The semiconductor integrated circuit device according to any one of Items 4 to 8 further including:
(p) a third I/O signal bonding pad formed over the first main surface side of the semiconductor chip to exchange signals with the second integrated circuit region;
(q) a fifth metal land formed over the top surface of the first organic wiring board; and
(r) a third bonding wire connecting the third bonding pad and the fifth metal land with one another.

10. The semiconductor integrated circuit device according to any one of Items 1 to 9 further including:
(s) a memory chip laminated body for interconnecting groups of metal through electrodes, which is mounted over the first main surface of the semiconductor chip.

11. A semiconductor integrated circuit device including:
(a) a first organic wiring board having a top surface and a rear surface;
(b) a first metal land formed over the top surface of the first organic wiring board;
(c) a semiconductor chip that has a first main surface and a second main surface and is flip-chip bonded to a portion on the top surface side of the first organic wiring board via a first group of bump electrodes and a second group of bump electrodes, which are formed over the first main surface;
(d) a first integrated circuit region and a second integrated circuit region, which are provided on the first main surface side of the semiconductor chip;
(e) a first group of metal through electrodes that penetrate a space between the first main surface and the second main surface of the semiconductor chip; and
(f) a first bonding wire stretched between the second main surface of the semiconductor chip and the top surface of the first organic wiring board to electrically connect the first metal land and the first group of the metal through electrodes with one another.

12. The semiconductor integrated circuit device according to Item 11, in which the first integrated circuit region is an internal circuit region and the second integrated circuit region is an I/O circuit region.

13. The semiconductor integrated circuit device according to Item 11 or Item 12, in which the first group of the bump electrodes supply a power supply potential to the first integrated circuit region.

14. The semiconductor integrated circuit device according to any one of Items 11 to 13, in which the first group of the metal through electrodes supply a power supply potential to the second integrated circuit region.

15. The semiconductor integrated circuit device according to any one of Items 11 to 14, in which the second group of the bump electrodes supply a ground potential to the first integrated circuit region.

16. The semiconductor integrated circuit device according to any one of Items 11 to 15 further including:

(g) a second metal land formed over the top surface of the first organic wiring board;

(h) a second group of metal through electrodes that penetrate a space between the first main surface and the second main surface of the semiconductor chip; and (h) a second bonding wire stretched between the second main surface of the semiconductor chip and the top surface of the first organic wiring board to electrically connect the second metal land and the second group of the metal through electrodes with one another, in which the second group of the metal through electrodes supply a ground potential to the second integrated circuit region.

17. The semiconductor integrated circuit device according to Item 16 further including:

(g) a third metal land formed over the top surface of the first organic wiring board;

(h) a third group of metal through electrodes that penetrate a space between the first main surface and the second main surface of the semiconductor chip; and (h) a third bonding wire stretched between the second main surface of the semiconductor chip and the top surface of the first organic wiring board to electrically connect the third metal land and the third group of the metal through electrodes with one another, in which the third group of the metal through electrodes are used for exchanging signals with the second integrated circuit region.

Explanation of Description Form, Basic Terms, and Usage Thereof in Present Application 1. In the present application, an embodiment is sometimes described by being divided into multiple sections, if necessary and for convenience. However, unless otherwise indicated explicitly, these are not independently separated from each other, but they form respective parts of an example, or one represents partial detailed description of the others or represents a variation of part or all of the others. In addition, description of like parts will not be repeated in principle. In addition, respective components in an embodiment are not essential, except the cases where: otherwise indicated explicitly; it is theoretically limited to the number; and it is obviously not true from the context.

In addition, the "semiconductor device" or "semiconductor integrated circuit device" used in the present application mainly means: a single body of various transistors (active elements); a component in which a resistor and a capacitor, etc., are integrated, centered on the single body, over a semiconductor chip, etc., (e.g., a single crystal silicon substrate); or a component in which a semiconductor chip and the like are packaged. Herein, typical transistors of the various transistors can be exemplified by MISFETs (Metal Insulator Semiconductor Field Effect Transistors) represented by MOSFETs (Metal Oxide Semiconductor Field Effect Transistors). Typical integrated circuit configurations can be exemplified by CMIS (Complementary Metal Insulator Semiconductor) type integrated circuits represented by CMOS (Complementary Metal Oxide Semiconductor) type integrated circuits in which an N-channel type MISFET and a P-channel type MISFET are combined.

The wafer step for today's semiconductor integrated circuit devices, i.e., LSIs (Large Scale Integrations) is taken into consideration by usually being divided into two parts. That is, the first part is an FEOL (Front End of Line) step including from a step in which silicon wafer is brought in as a raw material and almost to a premetal step (in which: an interlayer insulating film between the lower end of an 1 wiring layer and a gate electrode structure is formed; a contact hole is formed; a tungsten plug is embedded; and the like). The other part is a BEOL (Back End of Line) step including from a step in which the M1 wiring layer is formed and almost to a step in which a pad opening is formed in a final passivation film over an aluminum-based pad electrode (in the case of a wafer level package process, the process is also included).

In the present application, focusing on the layer of an interlayer insulating film, wiring and a via belonging to the same interlayer insulating film are called with the same name of the layer for convenience. That is, a via between first layer embedded wiring and second layer embedded wiring is called a second layer via.

2. Similarly, when a material, composition, or the like, is described in such a way that "X includes A" in the description of embodiments, etc., a material, composition, or the like including an element other than A as one of principal components should not be excluded, except the cases where: otherwise indicated explicitly; or it is obviously not true from the context. For example, with respect to a component, the "X includes A" means that "X includes A as a principal component", etc. For example, when it is described as "a silicon member", etc., it should not be limited to pure silicon, and it is needless to say that SiGe alloy, a multi-component alloy whose principal component is silicon, and a member including other additives, are also included.

Similarly, even when it is described as a "silicon oxide film", "silicon oxide-based insulating film", or the like, an insulation film including not only relatively pure undoped silicon dioxide, but also other silicon oxides as its principal components is included. Silicon oxide-based insulating films, in which impurities, such as, for example, TEOS-based silicon oxide, PSG (Phosphorus Silicate Glass), and BPSG (Borophosphosilicate Glass), have been doped, are also included in the silicon oxide film. In addition, thermal oxide films, CVD oxide films, and coating type films such as SOG (Spin On Glass) and NSC (Nano-Clustering Silica), are also included in the silicon oxide film or the silicon oxide-based insulating film. Other than these, low-k insulating films such as FSG (Fluorosilicate Glass), SiOC (Silicon Oxicarbide), carbon-doped silicon oxide, and OSG (Organosilicate Glass) are also included in the silicon oxide film or the silicon oxide-based insulating film. In addition, silica-based low-k insulating films (porous insulating films, when referred to as "porous", a molecular porous film is also included), the silica-based low-k insulating films being obtained by introducing holes in the members similar to those described above, are also included in the silicon oxide film or the silicon oxide-based insulating film.

In addition, the silicon-based insulating films that are normally used along with the silicon oxide-based insulating films in the semiconductor field include silicon nitride-based insulating films. Examples of the material included in this system include SiN, SiCN, SiNH, and SiCNH, etc. Herein, the "silicon nitride" includes both SiN and SiNH, unless otherwise indicated explicitly. Similarly, the "SiCN" includes both SiCN and SiCNH, unless otherwise indicated explicitly.

SiC has properties similar to those of SiN, but SiON is rather classified into a silicon oxide-based insulating film in many cases; however, when used as an etch-stop film, SiON is close to SiC, and SiN, etc.

A silicon nitride film is heavily used as an etch-stop film in an SAC (Self-Aligned Contact) technique, i.e., used as a CESL (Contact Etch-Stop Layer), and also used as a stress applying film in an SMT (Stress Memorization Technique).

3. When referred to as a "wafer", it normally means a single crystal silicon wafer, over which a semiconductor integrated circuit (a semiconductor device or an electronic device is the same) is formed, but it is needless to say that it includes compound wafers formed of an insulating substrate such as an epitaxial wafer, SOI substrate, LCD glass substrate, or the like, and a semiconductor layer, etc.

4. Views, positions, and attributes, etc., are exemplified by preferred examples, and it is needless to say that they should not be limited thereto, except the cases where: otherwise indicated explicitly; or it is obviously not true from the context. Accordingly, for example, "square" includes approximate square, "intersection at right angles" includes intersection at approximately right angles, and "matching" includes approximate matching. The same is true for "parallel" and "right angle". Accordingly, the case where two objects are shifted from each other by approximately 10° from a completely parallel state is included in a parallel state.

When a region is referred to as "whole of a region", "all of a region", or the like, it includes "almost all of a region" or "almost the whole of a region". Accordingly, for example, 80% or more of a region can be referred to as "the whole of a region" or "all of a region". The same is true for "whole circumference" and "whole length", etc.

When the shape of an object is referred to as a "rectangle", it includes an "approximate rectangle". Accordingly, when an area of a portion different from a rectangle is smaller than approximately 20% with respect to the whole area, it can be referred to as a rectangle. In this case, the same is true for "annularity". When an annular object is separated in this case, a portion obtaining by interpolating or extrapolating the separated element portion is assumed to be part of the annular object.

When referred to as being "periodic" with respect to periodicity, it includes being approximately periodic, and each element, the period of which is shifted, for example, by less than approximately 20%, can be referred to as being "periodic". In addition, when the number of elements, the period of each of which is out of this range, is less than, for example, approximately 20% with respect to the number of the whole elements that are targets of the periodicity, it can be referred to as being "periodic" as a whole.

The definitions made in this section are common, and when a different definition is made in the following specific description, the different definition is preferentially adopted in the portion. However, a portion where specific description is not specified, the definitions and stipulations made in this section are still effective, unless they are denied explicitly.

5. Even when a specific value or amount is referred to, a value that is larger or smaller than the specific value may be acceptable, except the cases where: otherwise indicated explicitly; it is theoretically limited to the number; and it is obviously not true from the context.

6. When referred to as a "group of metal through electrodes" in the present application, it refers to a set of metal through electrodes, i.e., a set of TSV (Through-Silicon Via) electrodes. In this case, a set including one metal through electrode is also included in the "group of the metal through electrodes" in the application. However, a set including none of metal through electrodes is not included therein, unlike the case of mathematics.

In the present application, a "via" means both a connection hole and a connection electrode embedded therein, unless confusion is caused. When the above two are particularly distinguished from each other, the former is referred, for example, to as a "via", while the latter as a "via electrode", etc.

In the present application, the TSV process is classified as follows in principle: that is, a via process in which an opening is formed from a top surface is referred to as a "top surface via process", while a via process in which an opening is formed from a rear surface is referred to as a "rear surface via process". The rear surface via process is practically considered to be a sub-classification of a via last process.

Depending on a timing at which a TSV is opened, the TSV process is classified into a "via first process", a "via middle process", and the "via last process". In the via first process, a TSV is opened before a basic portion of an active device such as a MISFET over a semiconductor substrate is completed (including from a step where a device is not formed over a semiconductor substrate to a step before a premetal step is performed).

In the via middle process, a TSV is opened after the premetal step (usually including from a step after the premetal step is roughly completed to a step before a wiring step) (i.e., a "via middle process" in a narrow sense).

In the via last process, a TSV is opened after an uppermost layer wiring step is roughly completed. The via last process includes a "top surface via last process" and a "rear surface via last process".

Besides these, examples of the top surface via process include a "via after middle process" in which a TSV is opened at an interim timing between those in the via middle process and the top surface via last process.

Additionally, the "bump electrode" in the present application means a concept including both "meltable bump electrodes" such as a solder bump electrode and "unmeltable bump electrodes" such as a copper bump electrode and a gold bump electrode. Accordingly, a "post electrode" and a "pillar electrode", etc., are naturally included.

Additionally, the "interposer" in the present application refers to a wiring board over which a semiconductor chip that forms a BGA, etc., is mounted, or a wiring board that is arranged between or over chips to be laminated in order to interconnect them. The interposer is classified into an "organic interposer" and an "Si interposer", depending on its principal material.

Additionally, the "conductive adhesive member film" in the present application means a concept including a "solder member" and "conductive paste"; and typical examples of the solder member include lead-free solder, etc., and those of the conductive paste include silver paste, etc.

In the present application, an "insulating adhesive layer" interposed between a wiring board and a chip or between laminated chips is referred to as different names such as "flow underfill", "no-flow underfill", "insulating spacer", "sheet-shaped underfill", and "filling type resin sealed layer", depending on its function and feature to which attention is focused. After a device is completed, however, they form insulating adhesive layers almost similar to each other.

Details of Embodiments

The embodiments will be further described in detail. The same or similar parts in each view will be denoted with the same or similar symbols or reference numerals, and description thereof will not be repeated in principle.

In the accompanying drawings, there are sometimes the cases where, even in a sectional view, hatching lines, etc., are omitted when the view becomes complicated or the distinction with a space is clear. In relation to this, when it is clear from the description, etc., the contour line of a background is sometimes omitted even with a planarly-closed hole. Conversely, hatching lines are sometimes drawn even in a non-sectional view, in order to explicitly illustrate that the portion is not a space.

Additionally, when one side is referred to as "first", etc., and the other as "second", etc., for alternative naming, typical embodiments may be described by being named thus; however, it is needless to say that, even when referred to, for example, as "first", the embodiment is not limited to the choice.

1. Description of Structure of BGA (Ball Grid Array), etc., One Example of Target Device in Semiconductor Integrated Circuit Device of One Embodiment of Present Application (Mainly FIGS. 1 to 8)

In this section, a BGA (Ball Grid Array) will be specifically described as one example in which a system chip, such as an SOC (System-On-Chip) type semiconductor chip, CPU (Central Processing Unit) chip, logic chip, or the like, is mounted over, for example, an organic multilayer wiring board (interposer) in a face-up manner. However, it is needless to say that the present embodiment can be widely applied to devices in which a semiconductor chip is mounted over a wiring board in a face-up manner, without limiting to the BGA.

In general, the number of TSVs (metal through electrodes), pads, and lands, etc., (collectively referred to as "structures") provided over a chip or interposer is significantly large; in these views, however, the number of them is limited to a number by which the appearance of their distribution can be indicated (or by which they can be illustrated) for convenience of illustration.

In the following description, a copper via middle process will be specifically described as an example of the metal through electrode; however, it is needless to say that a polysilicon or tungsten via first process, a copper via last process, and a copper via after middle process, etc., may be adopted.

In the following description, ball bonding will be specifically described as an example of wire bonding, but it is needless to say that other bonding methods may be adopted. Also, in the following examples, a wire bonding method, in which a first bonding point is located near to a chip and a second bonding point is located near a the wiring board, will be mainly and specifically described as an example. However, it is needless to say that, without limiting thereto, another wire bonding method (reverse wire bonding) in which a first bonding point is located near to a wiring board and a second bonding point is located near to a chip, may be adopted.

Figure 2:
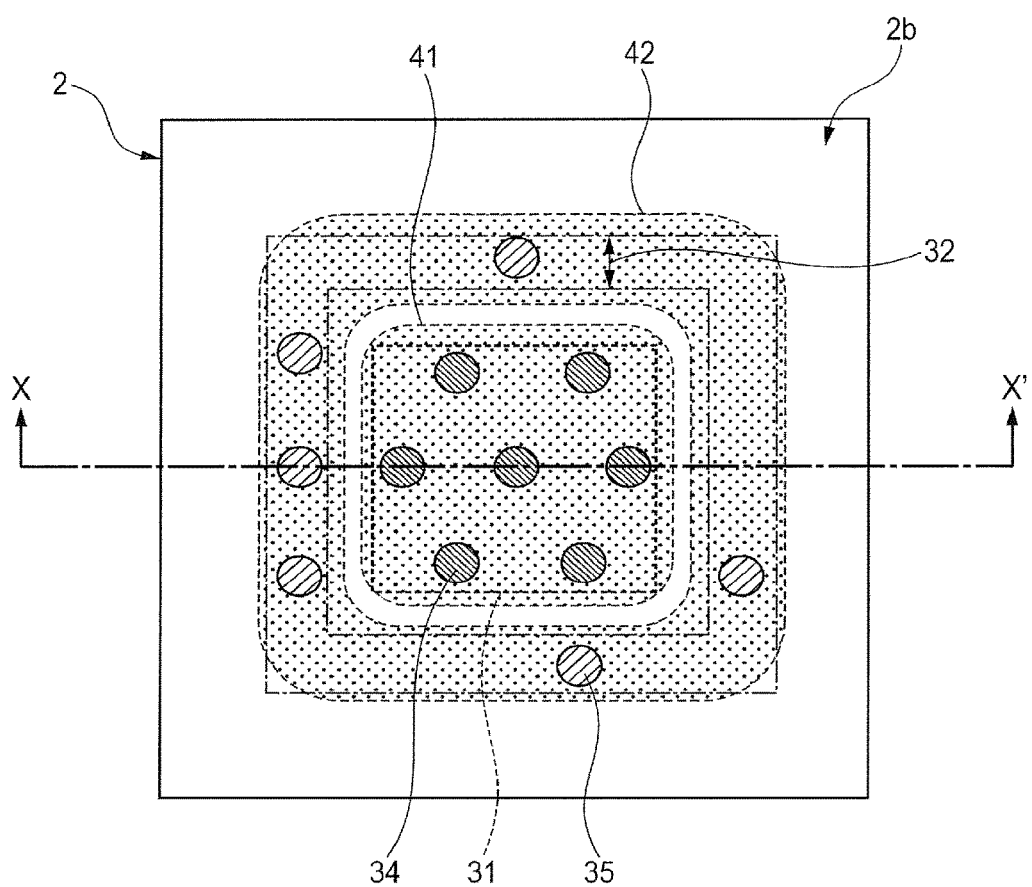
FIG. 2 is an overall bottom view of the system chip, etc., in which the relationship between the system chip, etc., in FIG. 1 and an organic wiring board (BGA interposer) that forms another main part of the BGA, etc., is illustrated.
Figure 3:
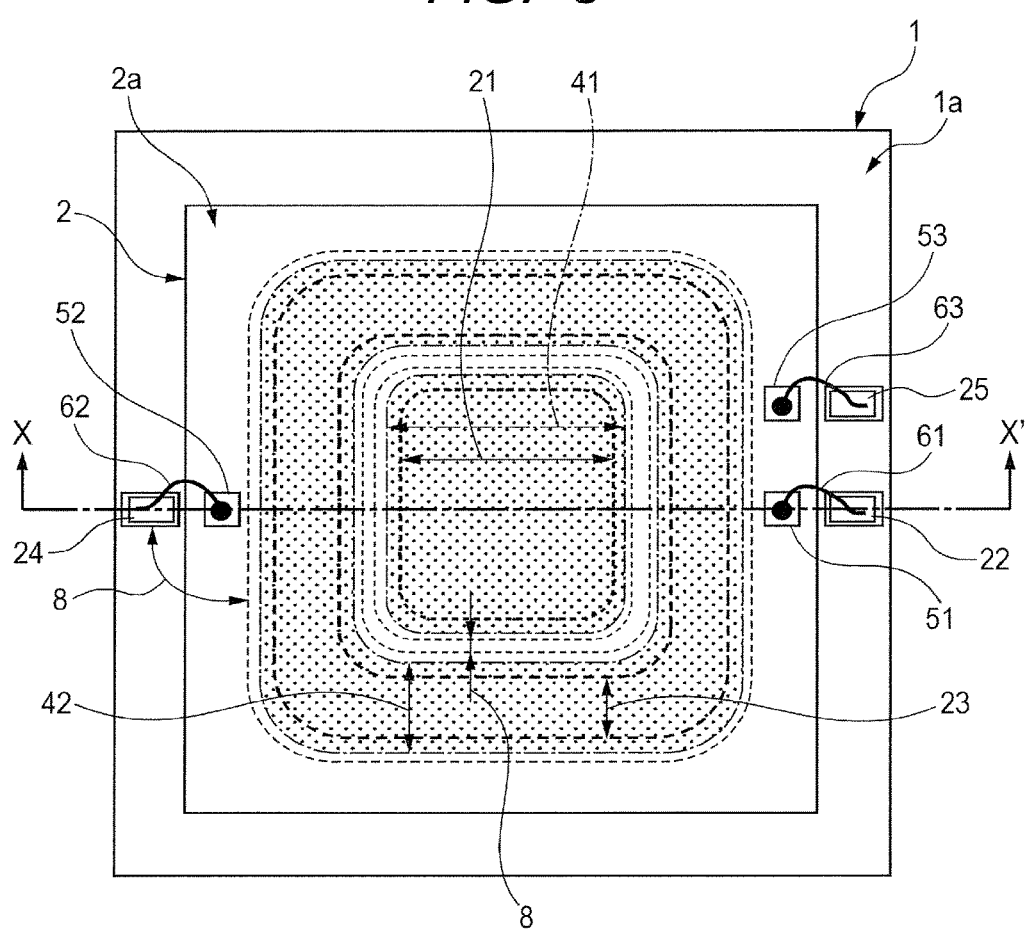
FIG. 3 is an overall top view of a BGA, etc., that is an example of a target device in the semiconductor integrated circuit device of the one embodiment of the application (for convenience of illustration, structures such as a pad, land, and wire, which are requisite minimum, are only illustrated; the same shall apply hereinafter)
Figure 4:
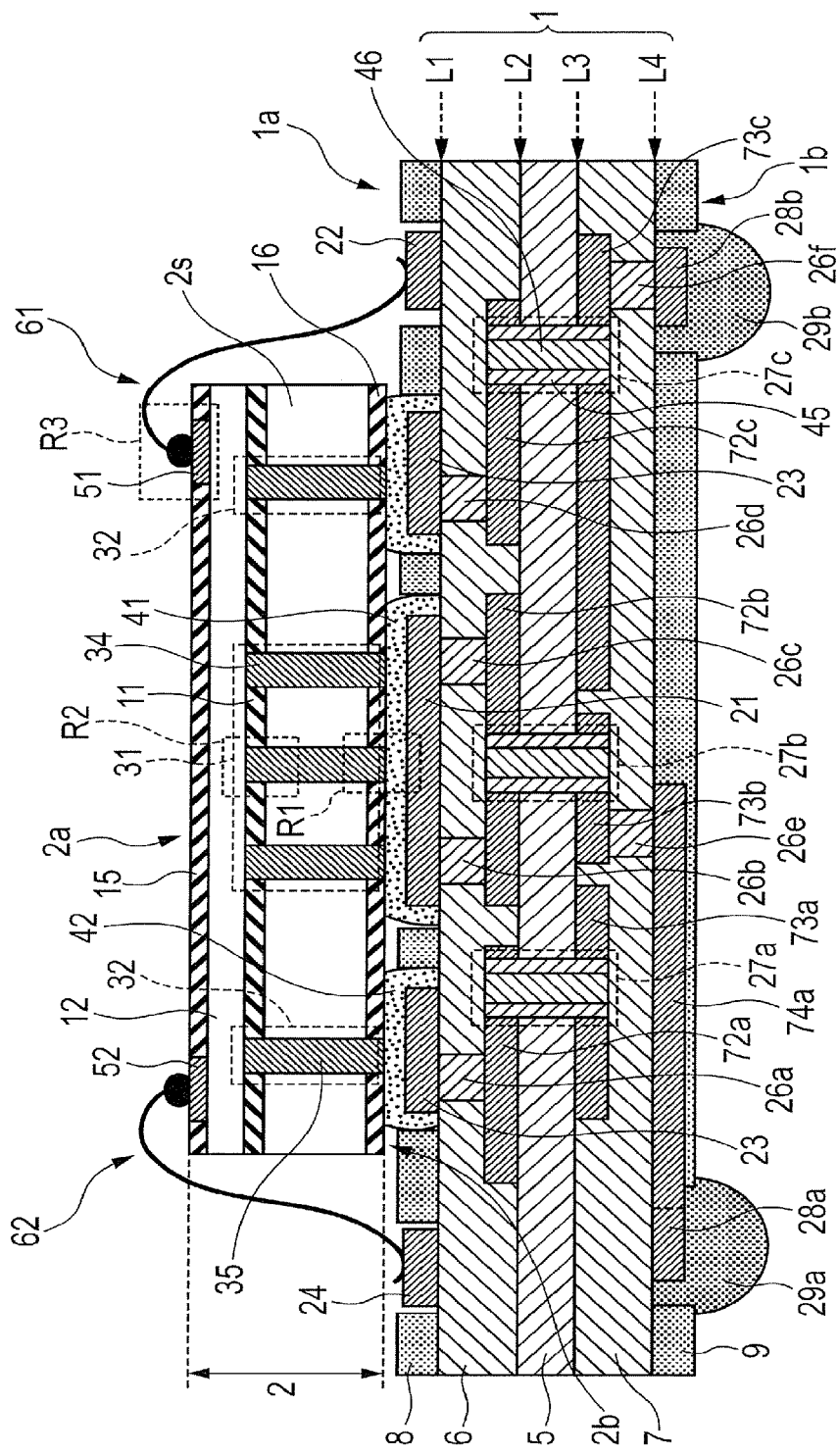
FIG. 4 is an overall sectional view of the BGA, etc., corresponding to the X-X' section in FIG. 3 (before resin sealing)
Figure 5:
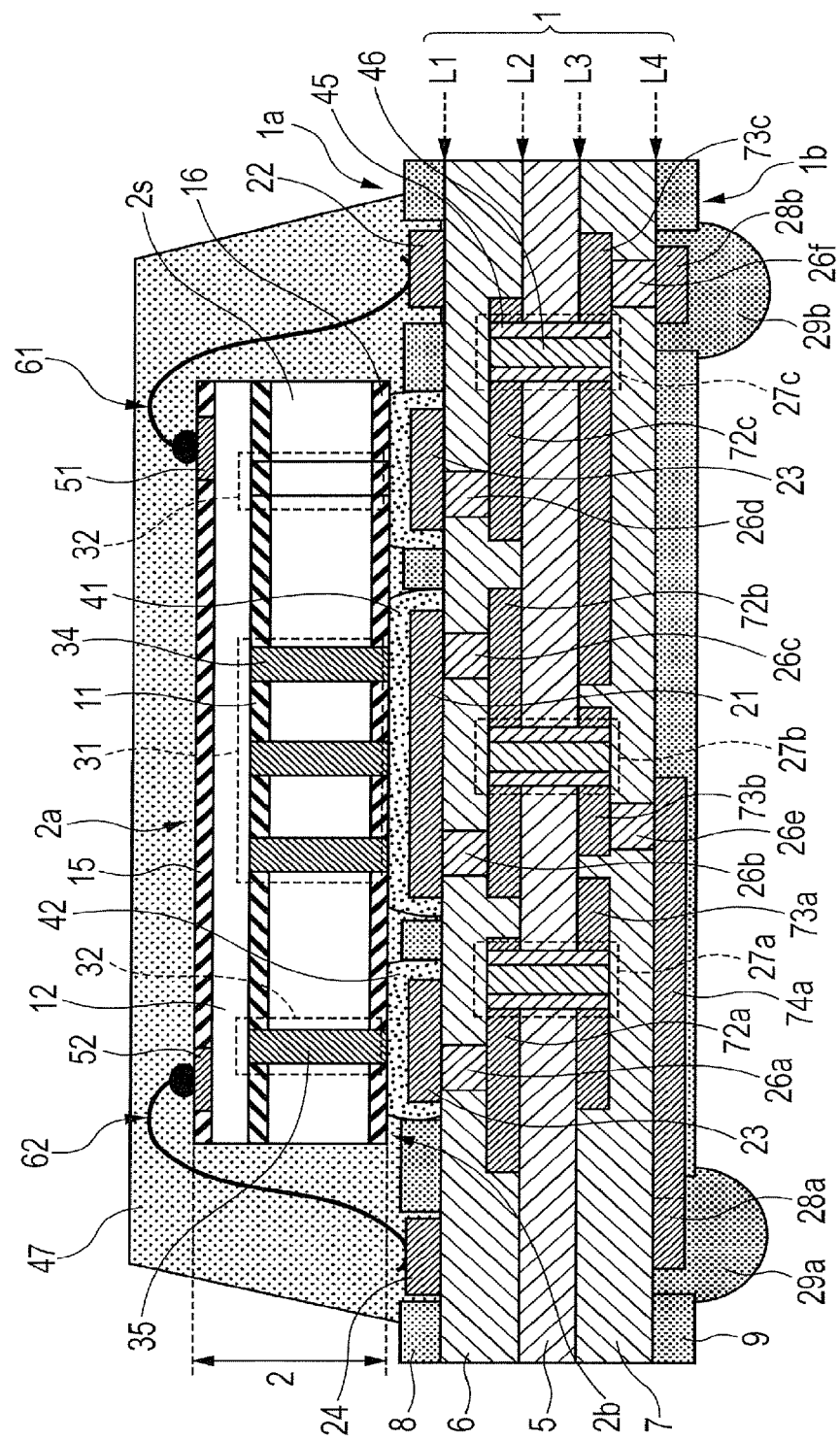
FIG. 5 is an overall sectional view of the BGA, etc., corresponding to the X-X' section in FIG. 3 (after resin sealing)
Figure 6:
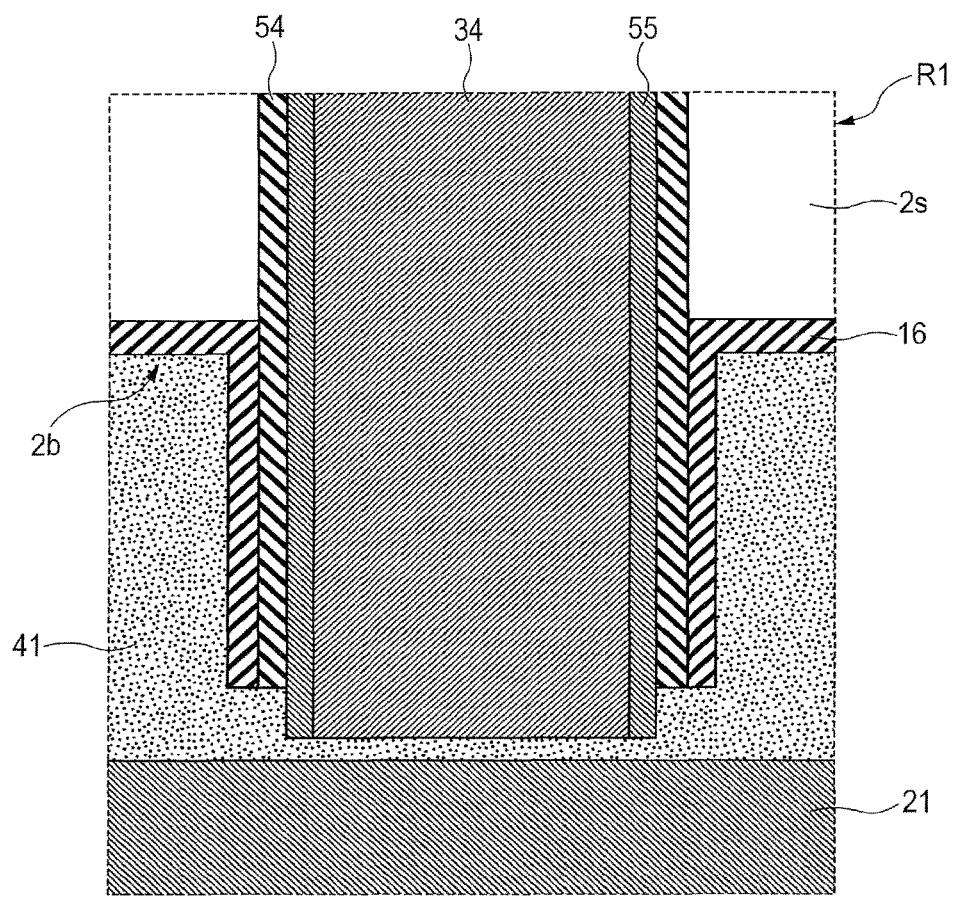
FIG. 6 is an enlarged sectional view of a peripheral region R1 of a lower end portion (of a metal through electrode) in FIG. 4.
Figure 7:
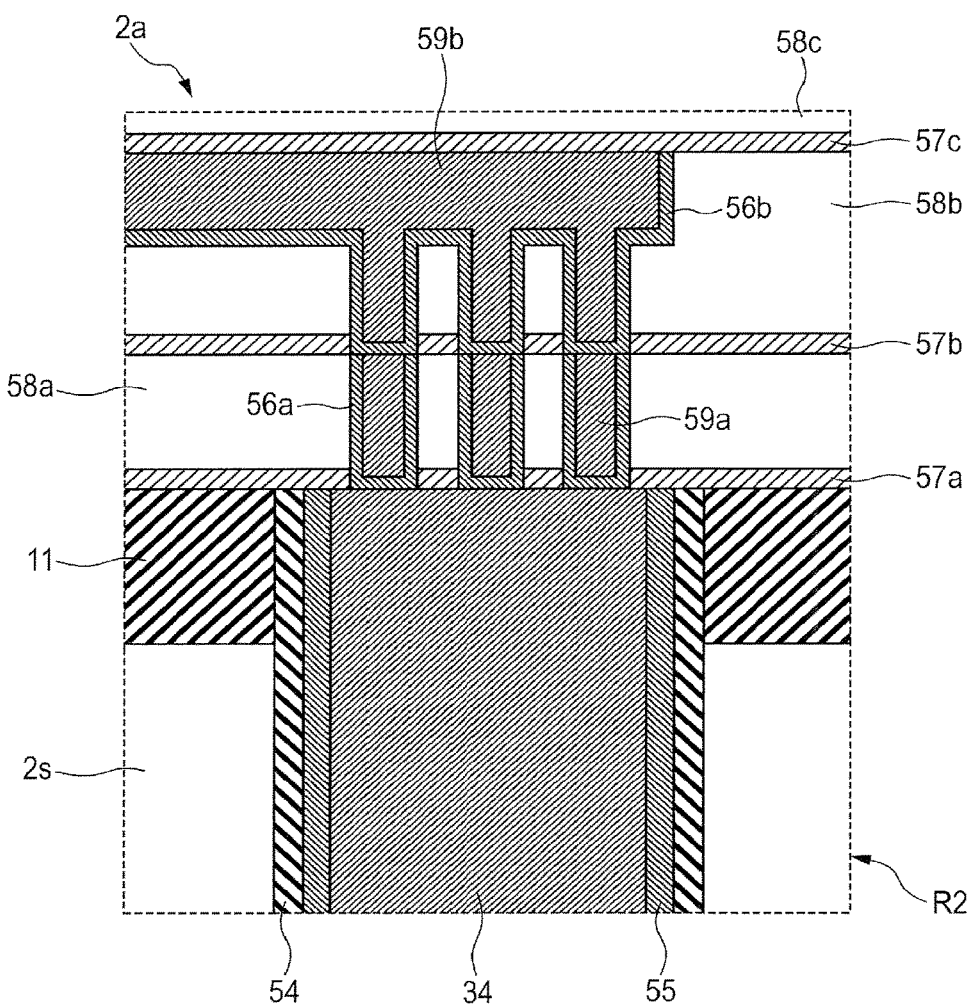
FIG. 7 is an enlarged sectional view of a peripheral region R2 of an upper end portion (of the metal through electrode) in FIG. 4.
Figure 8:
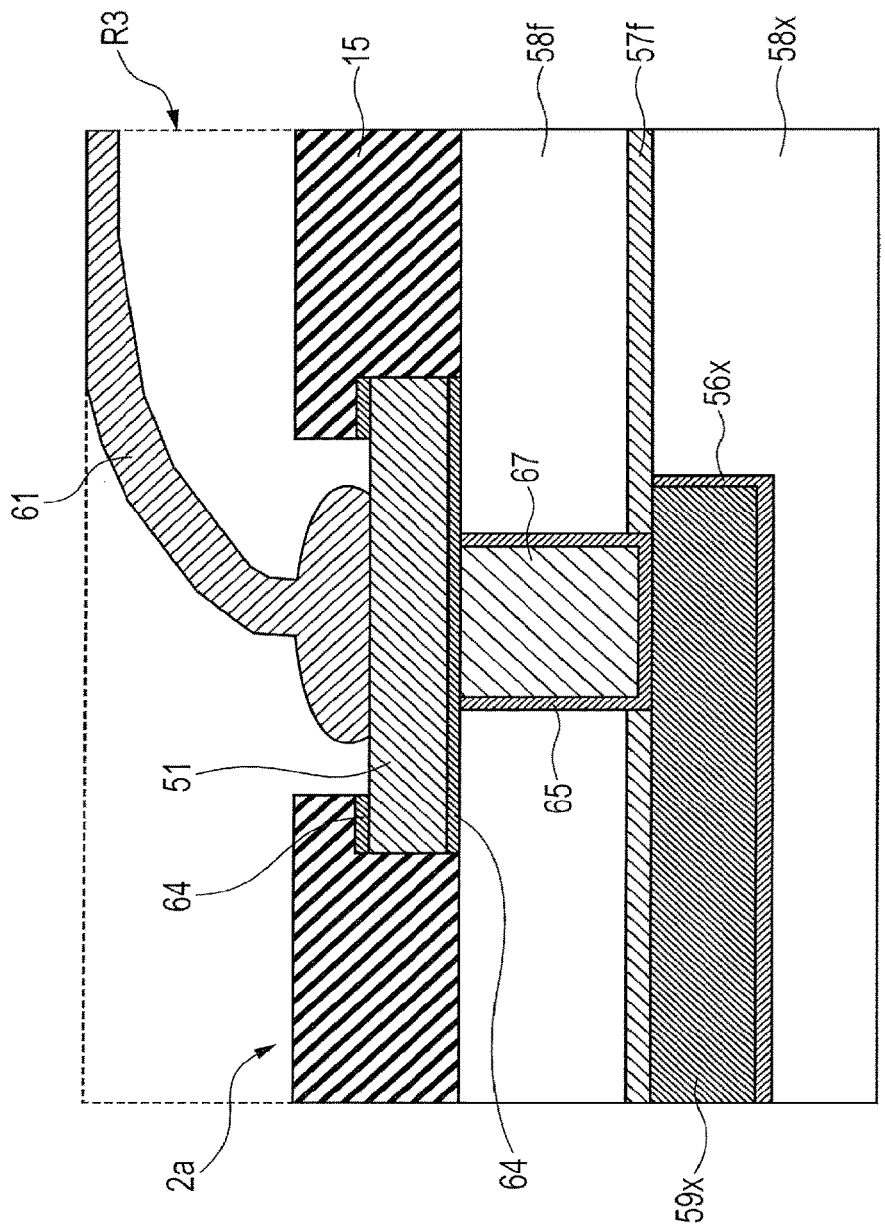
FIG. 8 is an enlarged sectional view of a peripheral region R3 of a bonding pad over the top surface of the chip in FIG. 4.

FIG. 1 is an overall top view of a system chip, etc., that forms one main part of a BGA (Ball Grid Array), etc., that is an example of a target device in a semiconductor integrated circuit device of one embodiment of the present application. FIG. 2 is an overall bottom view of the system chip, etc., in which the relationship between the system chip, etc., in FIG. 1 and an organic wiring board (BGA interposer) that forms another main part of the BGA, etc., is illustrated. FIG. 3 is an overall top view of a BGA, etc., that is an example of a target device in the semiconductor integrated circuit device of the one embodiment of the application (for convenience of illustration, structures such as a pad, land, and wire, which are requisite minimum, are only illustrated; the same shall apply hereinafter). FIG. 4 is an overall sectional view of the BGA, etc., corresponding to the X-X' section in FIG. 3 (before resin sealing). FIG. 5 is an overall sectional view of the BGA, etc., corresponding to the X-X' section in FIG. 3 (after resin sealing). FIG. 6 is an enlarged sectional view of a peripheral region R1 of a lower end portion (of a metal through electrode) in FIG. 4. FIG. 7 is an enlarged sectional view of a peripheral region R2 of an upper end portion (of the metal through electrode) in FIG. 4. FIG. 8 is an enlarged sectional view of a peripheral region R3 of a bonding pad over the top surface of the chip in FIG. 4. The structure, etc., of a BGA (Ball Grid Array), etc., that is one example of a target device in the semiconductor integrated circuit device of one embodiment of the application will be described with reference to these views.

The outline of the top surface layout of a system chip, one main element, will be first described with reference to FIG. 1. As illustrated in FIG. 1, for example, a first integrated circuit region 3 (internal circuit region) and a second integrated circuit region 4 (I/O circuit region) are provided over the top surface 2a (first main surface) of a system chip 2. The internal circuit region 3 is for example, a core logic region, and is provided not necessarily, but usually in an internal region 10c in the chip 2. On the other hand, the I/O circuit region 4 is provided not necessarily, but usually in a peripheral portion of the internal region 10c in the chip 2. Many bonding pads 50 are provided in a peripheral region 10p over the top surface 2a of the system chip 2, and they include a first bonding pad 51 and a second bonding pad 52, etc. The first bonding pad 51 is used for supplying a power supply potential to, for example, the I/O circuit region 4 in this example. Since a power supply potential is thus supplied to the I/O circuit region 4 via the first bonding pad 51, a sufficient power supply potential can be supplied, even when it is not supplied from other pathways (or even when it is not sufficiently supplied from other pathways).

In this case, a power supply potential may be supplied to the I/O circuit region 4 via this pathway alone or pathways combined with another. The number of the first bonding pad (pads) 51 may be one or more. When multiple first bonding pads 51 are provided, a voltage drop can be sufficiently avoided that much.

The second bonding pad 52 is used for supplying a ground potential to, for example, the I/O circuit region 4 in this example. Since a ground potential is thus supplied to the I/O circuit region 4 via the second bonding pad 52, a sufficient ground potential can be supplied, even when it is not supplied from other pathways (or even when it is not sufficiently supplied from other pathways).

In this case, a ground potential may be supplied to the I/O circuit region 4 via this pathway alone or pathways combined with another. The number of the second bonding pad (pads) 52 may be one or more. When multiple second bonding pads 52 are provided, a voltage variation, etc., can be sufficiently avoided that much.

Subsequently, the rear surface 2b (second main surface) of the system chip 2 will be illustrated in FIG. 2. As illustrated in FIG. 2, a first group 31 of metal through electrodes including a plurality of first metal through electrodes 34 are provided in the central portion in this example. The first group 31 of the metal through electrodes are used for supplying a power supply potential to, for example, the internal circuit region 3 in this example. Since a power supply potential is thus supplied from below to the internal circuit region 3 via the first group 31 of the metal through electrodes, a sufficient power supply potential can be supplied, even when it is not supplied from other pathways (or even when it is not sufficiently supplied from other pathways).

In this case, a power supply potential may be supplied to the internal circuit region 3 via this pathway alone or pathways combined with another. The number of the metal through electrodes that form the first group 31 of the metal through electrodes may be one or more. When multiple metal through electrodes are provided, a voltage drop can be sufficiently avoided that much.

On the other hand, a second group 32 of metal through electrodes including a plurality of second metal through electrode 35 are provided around the first group 31 of the metal through electrodes so as to surround them. The second group 32 of the metal through electrodes are used for supplying a ground potential to, for example, the internal circuit region 3 in this example. The second group 32 of the metal through electrodes are used for supplying a ground potential to, for example, the internal circuit region 3 in this example. Since a ground potential is thus supplied from below to the internal circuit region 3 via the second group 32 of the metal through electrodes, a sufficient ground potential can be supplied, even when it is not supplied from other pathways (or even when it is not sufficiently supplied from other pathways).

In this case, a ground potential may be supplied to the internal circuit region 3 via this pathway alone or pathways combined with another. The number of the metal through electrodes that form the second group 32 of the metal through electrodes may be one or more. When multiple metal through electrodes are provided, a voltage variation, etc., can be sufficiently avoided that much.

Herein, the arrangement of the first group 31 of the metal through electrodes almost corresponds to the later-described first conductive adhesive member film 41, while that of the second group 32 of the metal through electrodes almost corresponds to the later-described second conductive adhesive member film 42.

Subsequently, an example of the upper surface structure, etc., of the BGA will be illustrated in FIG. 3. As illustrated in FIG. 3, for example, a first metal land 21, a second metal land 22, a third metal land 23, a fourth metal land 24, and a fifth metal land 25, etc., are formed over a top surface 1a of a BGA interposer 1, and most of the remaining top surface 1a is covered with a top surface solder resist film 8. The relationship between the top surface solder resist film 8 and each land, etc., is one according to an NSMD (Non-Solder Mask Defined) method in this example, but it is needless to say that the relationship may be one according to an SMD (Solder Mask Defined) method. However, the NSMD method generally has the advantage that an arrangement density of lands, etc., can be increased.

The first bonding pad 51, the second bonding pad 52, and a third bonding pad 53, etc., are formed over the top surface 2a (first main surface) of the system chip 2. The first bonding pad 51 and the second metal land 22 are electrically connected with one another by a first bonding wire 61. Similarly, the second bonding pad 52 and the fourth metal land 24 are electrically connected with one another by a second bonding wire 62. Further, the third bonding pad 53 and the fifth metal land 25 are electrically connected with one another by a third bonding wire 63. The second bonding pad 52 is used for supplying a ground potential to, for example, the I/O circuit region 4 in this example, and the third bonding pad 53 is an I/O signal pad that exchanges signals with the I/O circuit regions 4.

The first conductive adhesive member film 41 (singly bonded two-dimensional structure), which is two-dimensionally integrated, is formed over the first metal land 21 and around the outside of an external region of the first metal land 21, over the top surface 1a of the BGA interposer 1. On the other hand, the second conductive adhesive member film 42 (doubly bonded two-dimensional structure), which is two-dimensionally integrated, is formed over the third metal land 23 and around the outside of an external and internal regions of the third metal land 23. The first conductive adhesive member film 41 and the second conductive adhesive member film 42 are respectively used for electrically connecting the first group 31 of the metal through electrodes and the first metal land 21 with one another and the second group 32 of the metal through electrodes and the third metal land 23 with one another (including the cases where they connect alone and secondarily). Since the first group 31 of the metal through electrodes and the first metal land 21 are thus connected by the first conductive adhesive member film 41, a process can be further simplified in comparison with other connection methods. Similarly, because the second group 32 of the metal through electrodes and the third metal land 23 are connected by the second conductive adhesive member film 42, a process can be further simplified in comparison with other connection methods.

As preferred materials for the first conductive adhesive member film 41 and the second conductive adhesive member film 42, for example, coating type conductive paste (generally conductive paste, specifically organic paste whose principal component is an epoxy resin, etc.), such as silver paste, can be cited as an example. Other than conductive paste, solder members such as lead-free solder can be cited as the preferred materials. When the coating type conductive paste is used, a process can be particularly and easily simplified. When a solder member is used (a process in which solder paste is reflowed, etc., is adopted), there is the advantage that low connection resistance can be obtained by a relatively simple process. Since the range of the conductive adhesive member film is self-alignedly defined by a surrounding solder resist film, the conductive adhesive member film has the advantage of not requiring high coating accuracy, etc. That is, the first conductive adhesive member film 41 and the second conductive adhesive member film 42 are isolated from each other by a solder resist film located between them.

Subsequently, the X-X' section in FIG. 3 will be illustrate in FIG. 4. As illustrated in FIG. 4, an organic wiring board 1 (BGA interposer), or the first organic wiring board, is, for example, a build-up four-layered substrate with a glass epoxy-based core substrate, and has an uppermost metal wiring layer L1 (e.g., a copper-based metal film; the same shall apply hereinafter), a second metal wiring layer L2, a third metal wiring layer L3, and a lowermost metal wiring layer L4. Among them, the second metal wiring layer L2 is a so-called power supply plane layer, and the third metal wiring layer L3 is a ground plane layer.

The organic wiring board 1 has, for example: a core organic insulating substrate 5 located at the center; second layer metal wiring 72a, 72b, and 72c formed on the top surface side of the core organic insulating substrate 5; third layer metal wiring 73a, 73b, and 73c formed on the rear surface side of the core organic insulating substrate 5; and embedded through vias 27a, 27b, and 27c each penetrating the core organic insulating substrate 5. A top surface build-up organic insulating layer 6 (e.g., an epoxy-based insulating film) is provided over each of the top surface 1a of the core organic insulating substrate 5 and the second layer metal wiring 72a and 72b, and 72c, while a rear surface build-up organic insulating layer 7 (e.g., an epoxy-based insulating film) is provided over a rear surface 1b of the core organic insulating substrate 5. Each of the embedded through vias 27a, 27b, and 27c has, for example, a metal via portion 45 (e.g., a copper-based metal film) and an insulating resin embedded portion 46 (e.g., an epoxy-based insulating member, almost homogeneous with the top surface build-up organic insulating layer 6, etc., is embedded).

Uppermost layer metal patterns such as the first metal land (e.g., a copper-based metal film; the same shall apply hereinafter), the second metal land 22, the third metal land 23, and the fourth metal land 24, etc., all of which belong to the uppermost metal wiring layer L1, are provided over the top surface build-up organic insulating layer 6. In this example, most of a portion of the top surface build-up organic insulating layer 6, over the portion the uppermost layer metal patterns being not provided, is covered with the top surface solder resist film 8.

Similarly, lowermost metal patterns such as external bump electrode attaching lands 28a and 28b (e.g., copper-based metal films; the same shall apply hereinafter) and lowermost layer metal wiring 74a, all of which belong to the lowermost metal wiring layer L4, are provided over the rear surface build-up organic insulating layer 7. In this example, most of a portion of the rear surface build-up organic insulating layer 7, over the portion the lowermost layer metal patterns being not provided, is covered with a rear surface solder resist film 9.

Blind vias 26a, 26b, 26c, and 26d (each including, for example, a copper-based metal member; the same shall apply hereinafter) are provided in the top surface build-up organic insulating layer 6, while blind vias 26e and 26f are provided in the rear surface build-up organic insulating layer 7.

External bump electrodes 29a and 29b (e.g., lead-free solder bump electrodes) are provided over the external bump electrode attaching lands 28a and 28b, respectively.

A logic chip 2 (an integrated circuit chip having a logic circuit and a CPU, etc.), such as an SOC (System-On-Chip), is mounted over the top surface 1a of the organic wiring board 1 in a face-up manner. The logic chip 2 includes: a semiconductor substrate layer 2s; a rear surface insulating film 16 provided on the rear surface 2b side of the semiconductor substrate layer; a premetal layer 11 provided on the top surface 2a side thereof; a multilayer wiring layer 12 provided over the premetal layer 11; the first bonding pad 51, the second bonding pad 52, and a final passivation film 15, which are provided over the multilayer wiring layer 12; and the like. In this example, the first bonding pad 51 and the second bonding pad 52, etc., are, for example, aluminum-based bonding pads; however, they may be copper-based bonding pads, palladium-based bonding pads, or bonding pads whose principal components are other metal materials. Herein, the first bonding pad 51 is electrically connected to the second metal land 22 via the first bonding wire 61 (e.g., ball bonding). On the other hand, the second bonding pad 52 is electrically connected to the fourth metal land 24 via the second bonding wire 62 (e.g., ball bonding). The principal materials for the bonding wires, such as the first bonding wire 61 and the second bonding wire 62, can be preferably exemplified by a gold-based wire. The principal materials for the bonding wire can be preferably exemplified by a copper-based wire, palladium-based wire, silver-based wire, and aluminum-based wire, etc., other than a gold-based wire. However, a gold-based wire is most preferred in terms of the miniaturization of a wire and the stability of a process, etc.

The logic chip 2 has groups of metal through electrodes such as the first group 31 of the metal through electrodes and the second group 32 of the metal through electrodes each penetrating the semiconductor substrate layer 2s. In this example, the first group 31 of the metal through electrodes have, for example, TSV (Through-Silicon Via) electrodes such as the metal through electrodes 34, while the second group 32 of the metal through electrodes have TSV electrodes such as the second metal through electrodes 35. The lower end portion of each of the first metal through electrodes 34 that form the first group 31 of the metal through electrodes is electrically connected to the first metal land 21 directly or via the first conductive adhesive member film 41. Similarly, the lower end portion of each of the second metal through electrodes 35 that form the second group 32 of the metal through electrodes is electrically connected to the third metal land 23 directly or via the second conductive adhesive member film 42. That is, the first group 31 of the metal through electrodes are electrically connected to the first conductive adhesive member film 41 directly, while the second group 32 of the metal through electrodes are electrically connected to the second conductive adhesive member film 42 directly. Since they are electrically connected with one another directly in this way, good connection resistance can be obtained.

Herein, the principal materials for the conductive adhesive member films, such as the first conductive adhesive member film 41 and the second conductive adhesive member film 42, can be preferably exemplified, for example, by metal powder-containing organic coating members (or conductive paste members) such as silver paste. The principal materials for the conductive adhesive member films can be preferably exemplified by solder members (e.g., lead-free solder), etc., other than conductive paste members. When a conductive paste member, etc., is used, there is the advantage that a process becomes easy.

Subsequently, a sealed body, in which the semiconductor chip 2 and the bonding wires 61 and 62, etc., in FIG. 4 are sealed with a sealing resin (e.g., an epoxy-based sealing resin, i.e., a thermosetting sealing resin), will be illustrated in FIG. 5. As illustrated in FIG. 5, a resin-sealed body 47 is formed near to the top surface 1a of the organic wiring board 1.

Subsequently, an enlarged sectional view of the peripheral region R1 of the lower end portion of each of the metal through electrodes in FIG. 4 will be illustrated in FIG. 6 (the respective TSV electrodes have the same structures as each other, but herein the metal through electrode 34 will be described as an example). As illustrated in FIG. 6, the lower end of the metal through electrode 34 is located close to the first metal land 21 (e.g., the top surface of copper) that is located below, so that the first conductive adhesive member film 41 is interposed between them, in this example. Alternatively, the lower end of the metal through electrode 34 may directly contact the upper surface of the first metal land 21. Almost all of the side surface of the metal through electrode 34 is covered with a TSV barrier metal film 55 such as, for example, a titanium nitride film. Almost all of the side surface of the metal through electrode 34, excluding a portion near to the lower end portion of the side surface, is covered with a liner insulating film 54 such as, for example, a silicon oxide-based insulating film. Further, the portion of the metal through electrode 34, the portion protruding from the rear surface 2*b* of the semiconductor substrate layer 2*s* (single crystal silicon substrate in this example), and the rear surface 2*b* of the semiconductor substrate layer 2*s* are covered with the rear surface insulating film 16 such as, for example, a silicon nitride-based insulating film.

Subsequently, an enlarged sectional view of the peripheral region R2 of the upper end portion of each of the metal through electrodes in FIG. 4 will be illustrated in FIG. 7 (the respective TSV electrodes have the same structures as each other, but herein the metal through electrode 34 will be described as an example). As illustrated in FIG. 7, the premetal layer 11, mainly including, for example, a silicon oxide-based insulating film, etc., is provided over the top surface 2*a* of the semiconductor substrate layer 2*s*, and in this example, the upper end of the metal through electrode 34 is at the same level as that of the upper surface of the premetal layer 11.

A first layer insulating barrier film 57*a*, including, for example, an SiCN-based insulating film, etc., is provided over the premetal layer 11, and thereover a first layer inter-main-layer insulating film 58*a*, including, for example, a non-low-k silicon oxide-based insulating film, etc., is provided. That is, a first layer interlayer insulating film includes the first layer insulating barrier film 57*a* and the first layer inter-main-layer insulating film 58*a*. In this first layer interlayer insulating film, first layer copper embedded wiring 59*a* (including a via) is embedded, and over the side surface and the lower surface of the wiring 59*a*, a first layer copper embedded wiring barrier metal film 56*a* such as, for example, a tantalum film, is provided.

Similarly, a second layer insulating barrier film 57*b*, including, for example, an SiCN-based insulating film, etc., is provided over the first layer interlayer insulating film, and thereover a second layer inter-main-layer insulating film 58*b*, including, for example, a low-k silicon oxide-based insulating film, etc., is provided. That is, the second layer interlayer insulating film includes the second layer insulating barrier film 57*b* and the second layer inter-main-layer insulating film 58*b*. In this second layer interlayer insulating film, second layer copper embedded wiring 59*b* (including a via) is embedded, and over the side surface and the lower surface of the wiring 59*b*, a second layer copper embedded wiring barrier metal film 56*b* such as, for example, a tantalum film, is provided.

Similarly, a third layer insulating barrier film 57*c*, including, for example, an SiCN-based insulating film, etc., is provided over the second layer interlayer insulating film, and thereover a third layer inter-main-layer insulating film 58*c*, including, for example, a low-k silicon oxide-based insulating film, etc., is provided.

Subsequently, an enlarged sectional view of the peripheral region R3 of the bonding pad over the top surface of the chip in FIG. 4 will be illustrated in FIG. 8 (the respective bonding pads have the same structures as each other, unless it is explicitly indicated that they are particularly different from each other; however, the first bonding pad 51 will be described herein as an example). As illustrated in FIG. 8, in an uppermost layer inter-main-layer insulating film 58*x*, including, for example, a low-k silicon oxide-based insulating film, etc., uppermost layer copper embedded wiring 59*x* (including a via) is embedded, and over the side surface and the lower surface of the wiring 59*x*, an uppermost layer copper embedded wiring barrier metal 56*x* such as, for example, a tantalum film, is provided. Herein, the uppermost layer inter-main-layer insulating film 58*x* forms an uppermost layer interlayer insulating film.

An insulating barrier film 57*f*, including, for example, an SiCN-based insulating film (or an SiN-based insulating film), etc., and located immediately below a pad layer, is provided over the uppermost layer interlayer insulating film, and thereover an inter-main-layer insulating film 58*f*, including, for example, a non-low-k silicon oxide-based insulating film, etc., and located immediately below the pad layer, is provided. An interlayer insulating film immediately below the pad layer includes the insulating barrier film 57*f* and the inter-main-layer insulating film 58*f*. In the interlayer insulating film immediately below the pad layer, a tungsten plug 67 is embedded, and over the side surface and the bottom surface of the tungsten plug 67, a barrier metal film 65 such as a titanium nitride film, is provided.

Over the interlayer insulating film immediately below the pad layer, for example, an aluminum metal wiring layer that forms the pad layer is provided, and the aluminum metal wiring layer forms the bonding pads such as the first bonding pad 51 (other bonding pads basically have the same structures as each other, unless otherwise explicitly indicated; however, the first bonding pad 51 will be described herein as an example). The lower surface of the aluminum-based metal wiring layer is a barrier metal film 64 including, for example, a titanium nitride film, etc., and the upper surface thereof, excluding a pad opening portion, etc., is a barrier metal film 64 (antireflection film) similarly including a titanium nitride film, etc.

Over the first bonding pad 51, a gold wire 61, etc. (besides that, a copper wire, aluminum wire, silver wire, and palladium wire, etc., are preferred) is connected, for example, by ball bonding. The final passivation film 15 is provided over a portion of the first bonding pad 51, excluding the pad opening portion, and over the interlayer insulating film immediately below the pad layer.

2. Description of Structures in Various Variations (1 to 3), etc., with respect to Planar Arrangement of Group of Through Electrodes in Semiconductor Integrated Circuit Device of the One Embodiment of Present Application (Mainly FIGS. 9 to 11)

Since the examples in this section are variations of FIG. 2 in Section 1 and other views (portions in FIG. 2 not described in the description, views other than FIG. 2, and the description thereof) are not basically different, different portions will only be described in principle hereinafter.

In FIG. 2, an arrangement of central power supply system-peripheral circular grounding system TSVs (Through-Silicon-Vias), which is comparatively simple, has been described as an example of a planar arrangement of power supply system and grounding system through electrodes, that is, TSVs for power supply, etc. However, a planar arrangement of the TSVs for power supply, etc., is not limited thereto, and various variations can be made, if necessary. Hereinafter, examples of the variations will be described.

Figure 9:
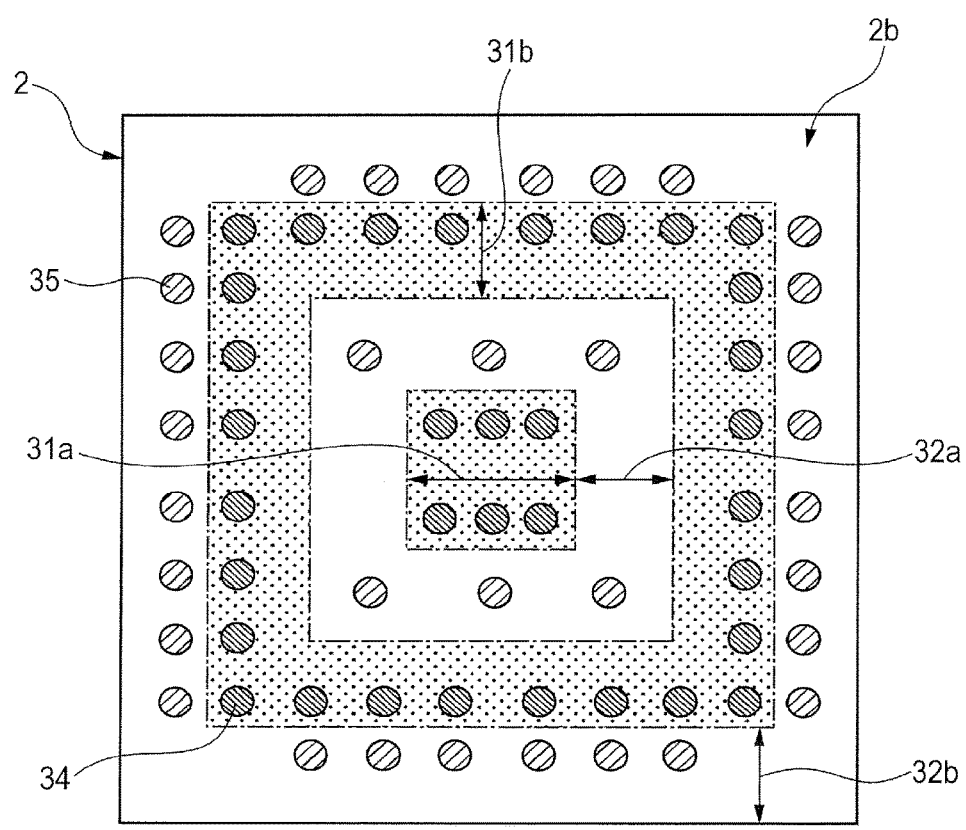
FIG. 9 is an overall bottom view of the system chip, etc., corresponding to FIG. 2, for explaining a structure, etc., of First Variation with respect to a planar arrangement of a group of through electrodes (multiple circular arrangement) in the semiconductor integrated circuit device of the one embodiment of the application.
Figure 10:
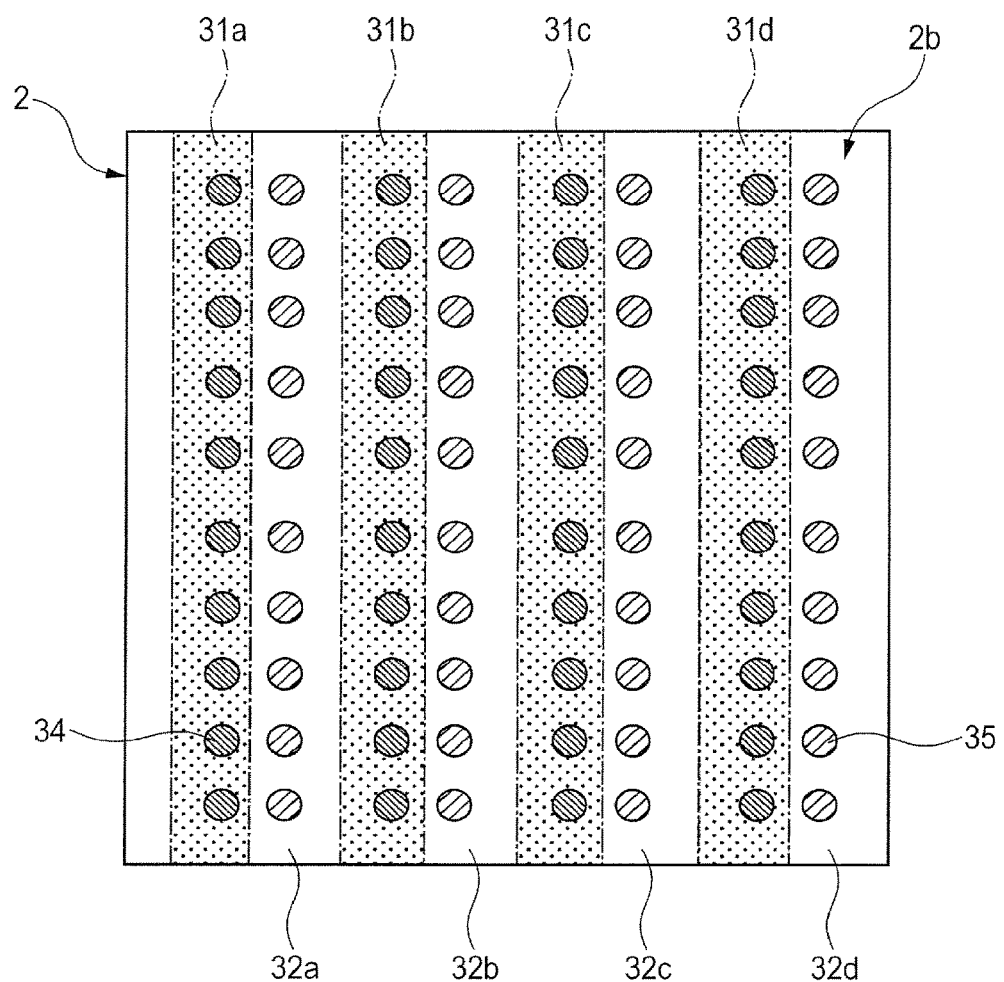
FIG. 10 is an overall bottom view of the system chip, etc., corresponding to FIG. 2, for explaining a structure, etc., of Second Variation with respect to the planar arrangement of the group of through electrodes (alternately repeating arrangement) in the semiconductor integrated circuit device of the one embodiment of the application.
Figure 11:
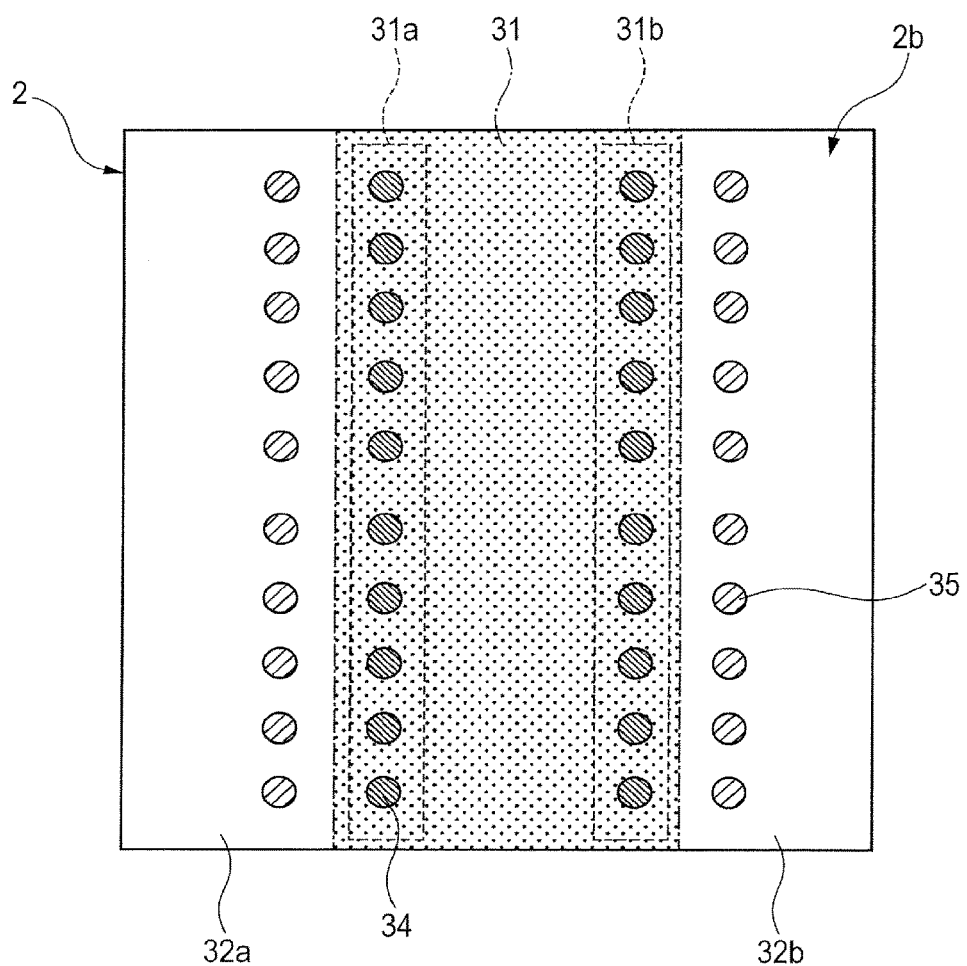
FIG. 11 is an overall bottom view of the system chip, etc., corresponding to FIG. 2, for explaining a structure, etc., of Third Variation with respect to the planar arrangement of the group of through electrodes (power supply center & ground both sides arrangement) in the semiconductor integrated circuit device of the one embodiment of the application.

FIG. 9 is an overall bottom view of the system chip, etc., corresponding to FIG. 2, for explaining a structure, etc., of First Variation with respect to the planar arrangement of the group of through electrodes (multiple circular arrangement) in the semiconductor integrated circuit device of the one embodiment of the present application. FIG. 10 is an overall bottom view of the system chip, etc., corresponding to FIG. 2, for explaining a structure, etc., of Second Variation with respect to the planar arrangement of the group of the through electrodes (alternately repeating arrangement) in the semiconductor integrated circuit device of the one embodiment of the application. FIG. 11 is an overall bottom view of the system chip, etc., corresponding to FIG. 2, for explaining a structure, etc., of Third Variation with respect to the planar arrangement of the group of the through electrodes (power supply center & ground both sides arrangement) in the semiconductor integrated circuit device of the one embodiment of the application. Structures in various variations, etc., with respect to the planar arrangement of the group of through electrodes in the semiconductor integrated circuit device of the one embodiment of the application will be described with reference to these views.

(1) Multiple Circular Arrangement (Mainly FIG. 9):

In the example in FIG. 2 described in Section 1, the first group 31 of the metal through electrodes (e.g., group of through electrodes for power supply) are arranged in the chip 2 and the second group 32 of the metal through electrodes (e.g., group of through electrodes for ground potential supply) are arranged around the first group 32 of the metal through electrodes so as to surround them, in plan view. On the other hand, in this example, a first group 31a of metal through electrodes (part of the first group 31 of the metal through electrodes) are first arranged in the central portion of the chip 2, and a second circular group 32a of metal through electrodes (part of the second group 32 of the metal through electrodes) are arranged around the first group 31a of the metal through electrodes so as to surround them, in plan view and as illustrated in FIG. 9. Further, a first group 31b of metal through electrodes (remaining portion of the first group 31 of the metal through electrodes) are arranged around the second circular group 32a of the metal through electrodes so as to surround them, and a second group 32b of metal through electrodes (remaining portion of the second group 32 of the metal through electrodes) are further arranged around the first group 31b of the metal through electrodes so as to surround them.

That is, in this example, the first group 31 of the metal through electrodes and the second group 32 of the metal through electrodes are divided into two subgroups (first subgroup of the metal through electrodes and second subgroup of the metal through electrodes), respectively.

By arranging them in this way, a more equal power supply potential (ground potential) can be supplied to each portion of the first integrated circuit region 3 (internal circuit region), in comparison with such a simple arrangement as illustrated in FIG. 2.

(2) Alternately Repeating Arrangement (Mainly FIG. 10):

In this example, the first group 31 of the metal through electrodes (e.g., group of through electrodes for power supply) in the example of FIG. 2 described in Section 1 are divided, for example, into four first groups 31a, 31b, 31c, and 31d of metal through electrodes so as to cut the chip 2 longitudinally, as illustrated in FIG. 10. That is, the first group 31 of the metal through electrodes are divided into four first subgroups of metal through electrodes.

On the other hand, the second group 32 of the metal through electrodes in the example of FIG. 2 described in Section 1 are also divided, for example, into four second groups 32a, 32b, 32c, and 32d of metal through electrodes, in this example. That is, the second group 32 of the metal through electrodes are divided into four second subgroups of metal through electrodes.

In this example, the respective first subgroups of the metal through electrodes and second subgroups of the metal through electrodes are arranged horizontally, each of which being arranged in almost a line, and a pair of subgroups of the metal through electrodes that correspond to each other (e.g., the first subgroup 31a of the metal through electrodes and the second subgroup 32a of the metal through electrodes) are arranged so as to be close to each other. Also in this example, each of the first metal through electrodes 34, which forms each of the first subgroups of the metal through electrodes, and each of the second metal through electrode 35, which is located close to the each of the first metal through electrode 34 in a paired manner and forms the second subgroup 32a of the metal through electrodes, are arranged so as to be at almost the same positions as each other in the lines that the respective metal through electrodes form.

By arranging them in this way, a higher-density and more equal power supply potential (ground potential) can be supplied to each portion of the first integrated circuit region 3 (internal circuit region) by a simpler layout, in comparison with such a complicated layout as illustrated in FIG. 9.

(3) Power Supply Center & Ground Both Sides Arrangement (Mainly FIG. 11):

In this example, the first group 31 of the metal through electrodes (e.g., group of through electrodes for power supply) in the example of the FIG. 2 described in Section 1 cuts the chip 2 longitudinally, for example, at the central portion of the chip 2, so that the first group 31 of the metal through electrodes is divided into a pair of first groups 31a and 31b of metal through electrodes (first subgroups of metal through electrodes) that are located close to both the end portions of its arrangement region and extend in almost a line along both the end portions, as illustrated in FIG. 11.

On the other hand, the second group 32 of the metal through electrodes are divided into two subgroups, such as second subgroups 32a and 32b of metal through electrodes, and the two subgroups are respectively arranged almost in a line along both the ends of the region where the first group 31 of the metal through electrodes are arranged, so as to be located close to the first groups 31a and 31b of the metal through electrodes (first subgroups of the metal through electrodes). In the case of this example, each of the first metal through electrodes 34, which forms each of the first subgroups of the metal through electrodes, and each of the second metal through electrode 35, which is located close to the each of the first metal through electrode 34 in a paired manner and forms the second subgroup 32a of the metal through electrodes, are arranged so as to be at almost the same positions as each other in the lines that the respective metal through electrodes form, similarly to the previous example.

By arranging them in this way, a more equal power supply potential (ground potential) can be supplied to each portion of the first integrated circuit region 3 (internal circuit region) by a further simpler layout, in comparison with such complicated layouts as illustrated in FIGS. 9 and 10.

3. Description of Structures in Various Variations, etc., with respect to Memory Stack Structure in Semiconductor Integrated Circuit Device of the One Embodiment of Present Application (Mainly FIGS. 12 to 23)

In this section, various examples (memory stack structures) will be described as variation examples of the electronic device (e.g., BGA) described in Sections 1 and 2, in each of the various examples a memory chip, such as a DRAM (Dynamic Random-Access Memory), being further mounted over the top surface of the system chip.

Hereinafter, a wide I/O-DRAM, etc., will be mainly and specifically described as an example of a memory stack structure; however, the number of the memory stacks to be laminated is not limited to a plural number, but may be one. Additionally, the memory chip is not limited to a DRAM chip, but other memory chips, such as, for example, an NAND-type flash chip, may be adopted.

The example in this Section is a variation of the electronic device (e.g., BGA) described in Sections 1 and 2, and hence the portions, other than the memory stack and the portions related thereto, are basically the same as those described in Sections 1 and 2. Accordingly, only different portions will be described in principle hereinafter.

As described below, by mounting a memory stack structure over a logic chip, a system can be easily obtained, in which the data path between the logic chip and a memory system is large.

Figure 12:
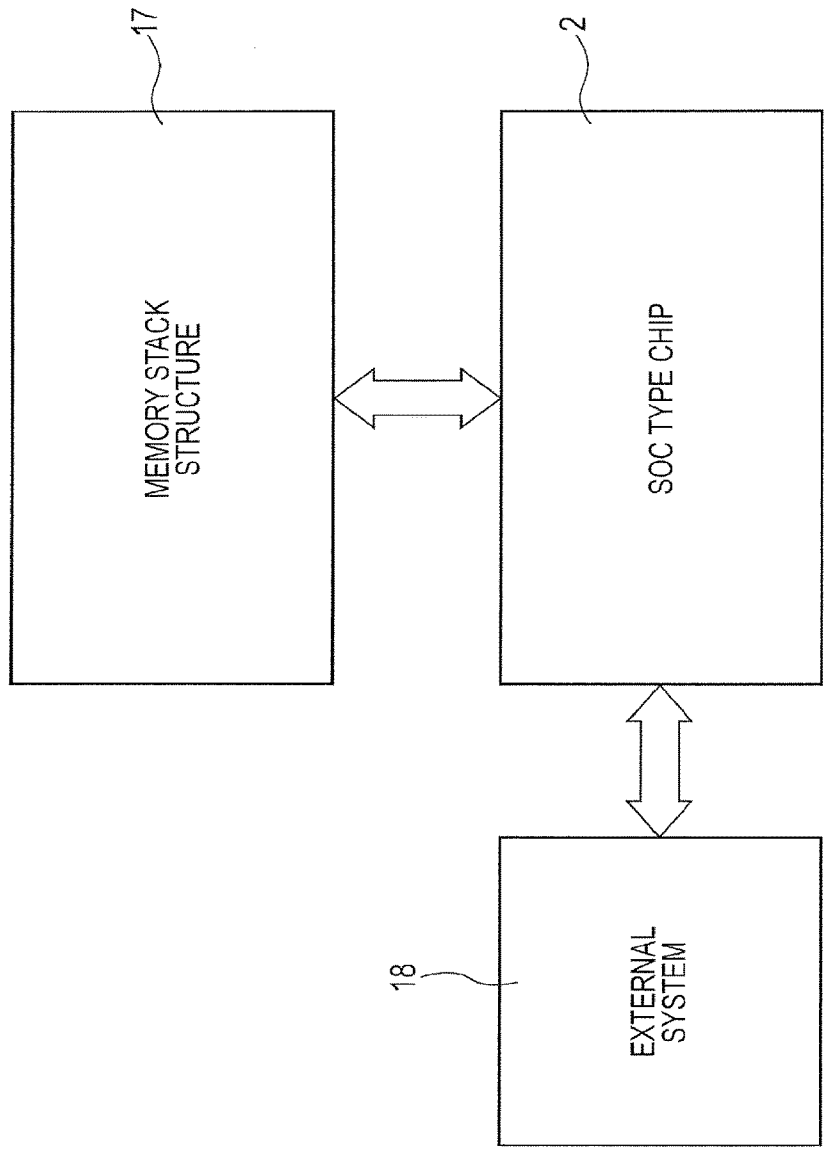
FIG. 12 is a system block view for explaining a structure, etc., of First Variation with respect to a memory stack structure (method of supplying I/O power source, etc., by wire bonding over memory stack uppermost surface) in the semiconductor integrated circuit device of the one embodiment of the application.
Figure 13:
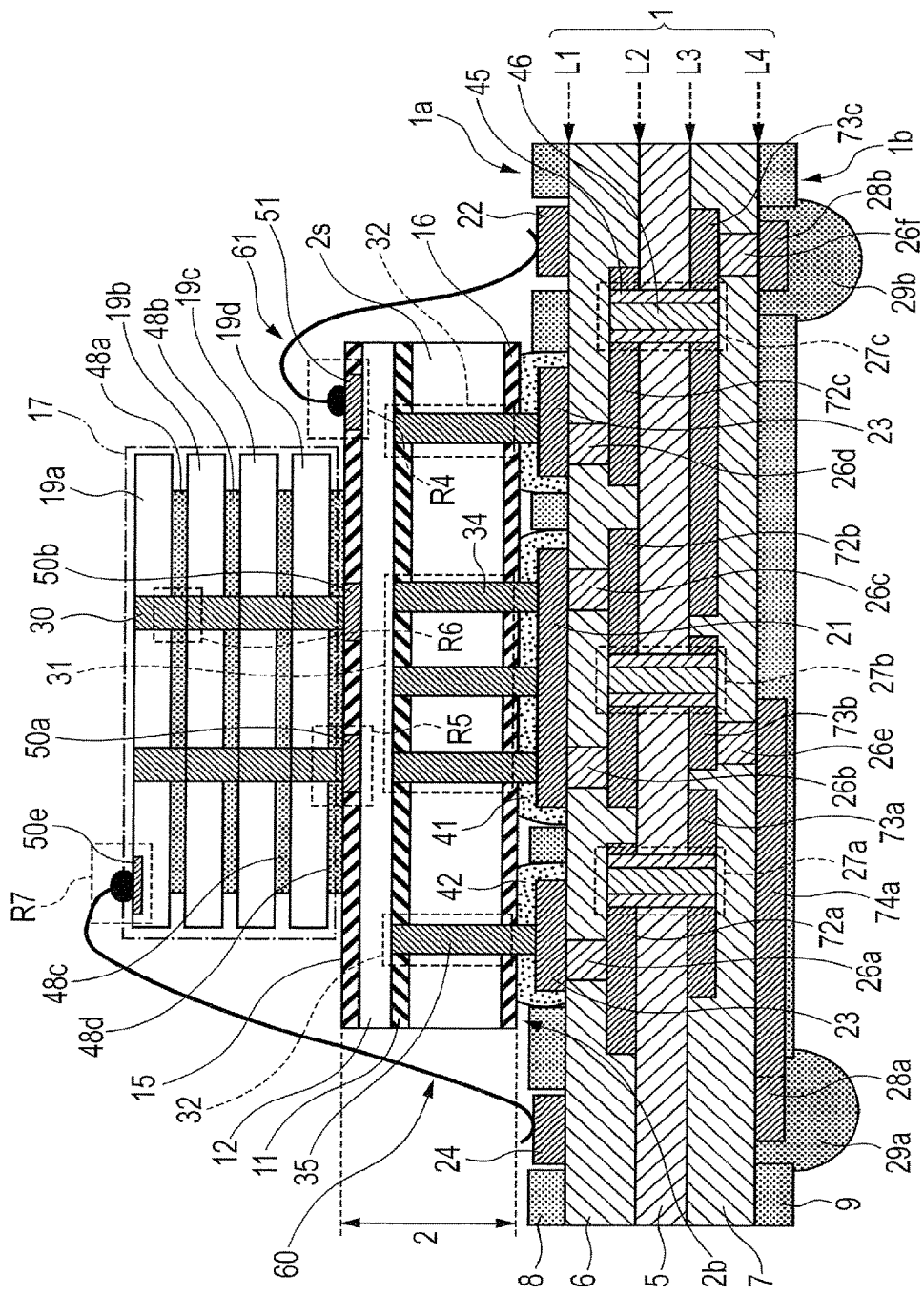
FIG. 13 is an overall sectional view of a BGA, etc., corresponding to FIG. 4 (before resin sealing), for explaining the structure, etc., of First Variation with respect to the memory stack structure (method of supplying I/O power source, etc., by wire bonding over memory stack uppermost surface) in the semiconductor integrated circuit device of the one embodiment of the application.
Figure 14:
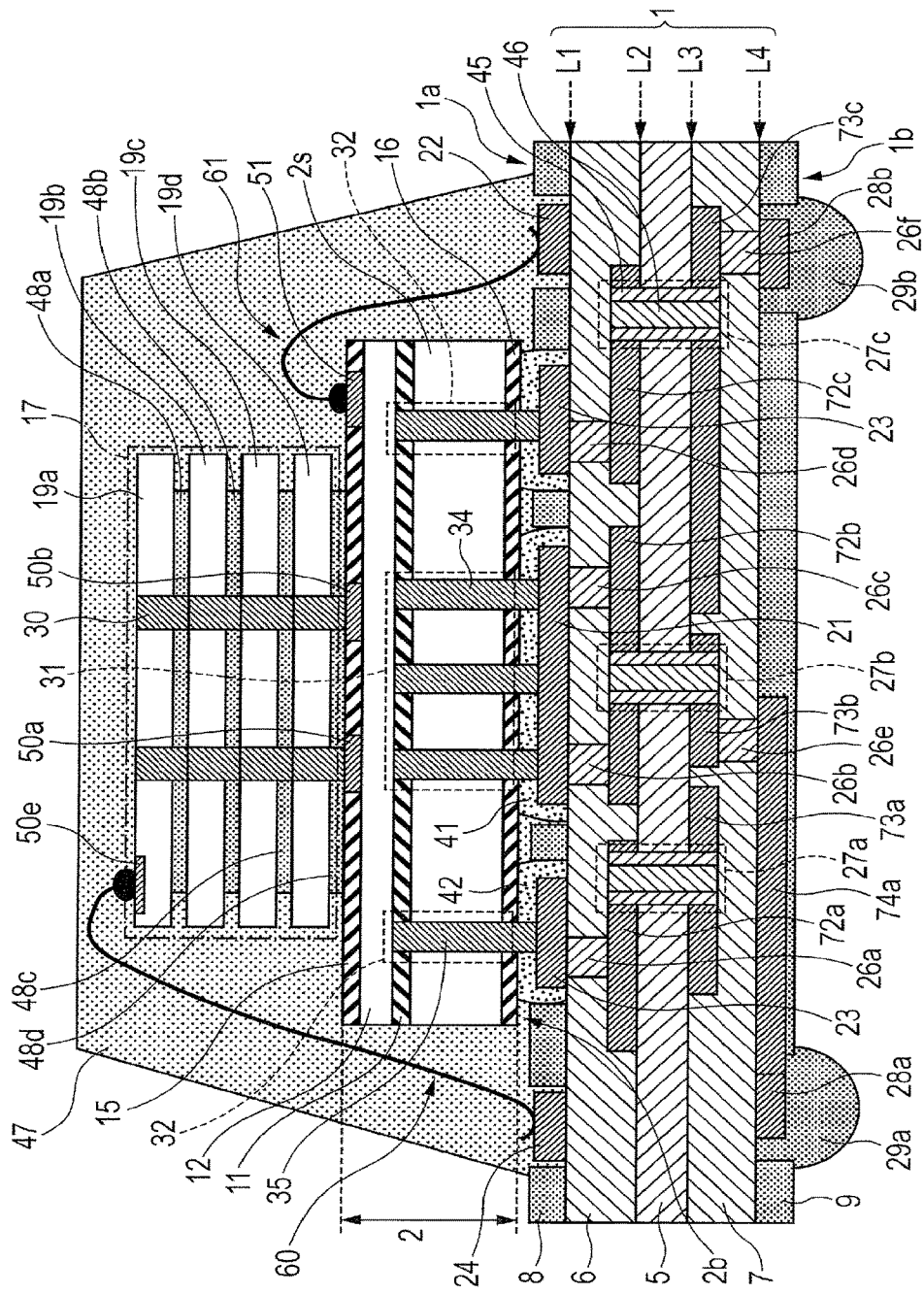
FIG. 14 is an overall sectional view of the BGA, etc., corresponding to FIG. 4 (after resin sealing), for explaining the structure, etc., of First Variation with respect to the memory stack structure (method of supplying I/O power source, etc., by wire bonding over memory stack uppermost surface) in the semiconductor integrated circuit device of the one embodiment of the application.
Figure 15:
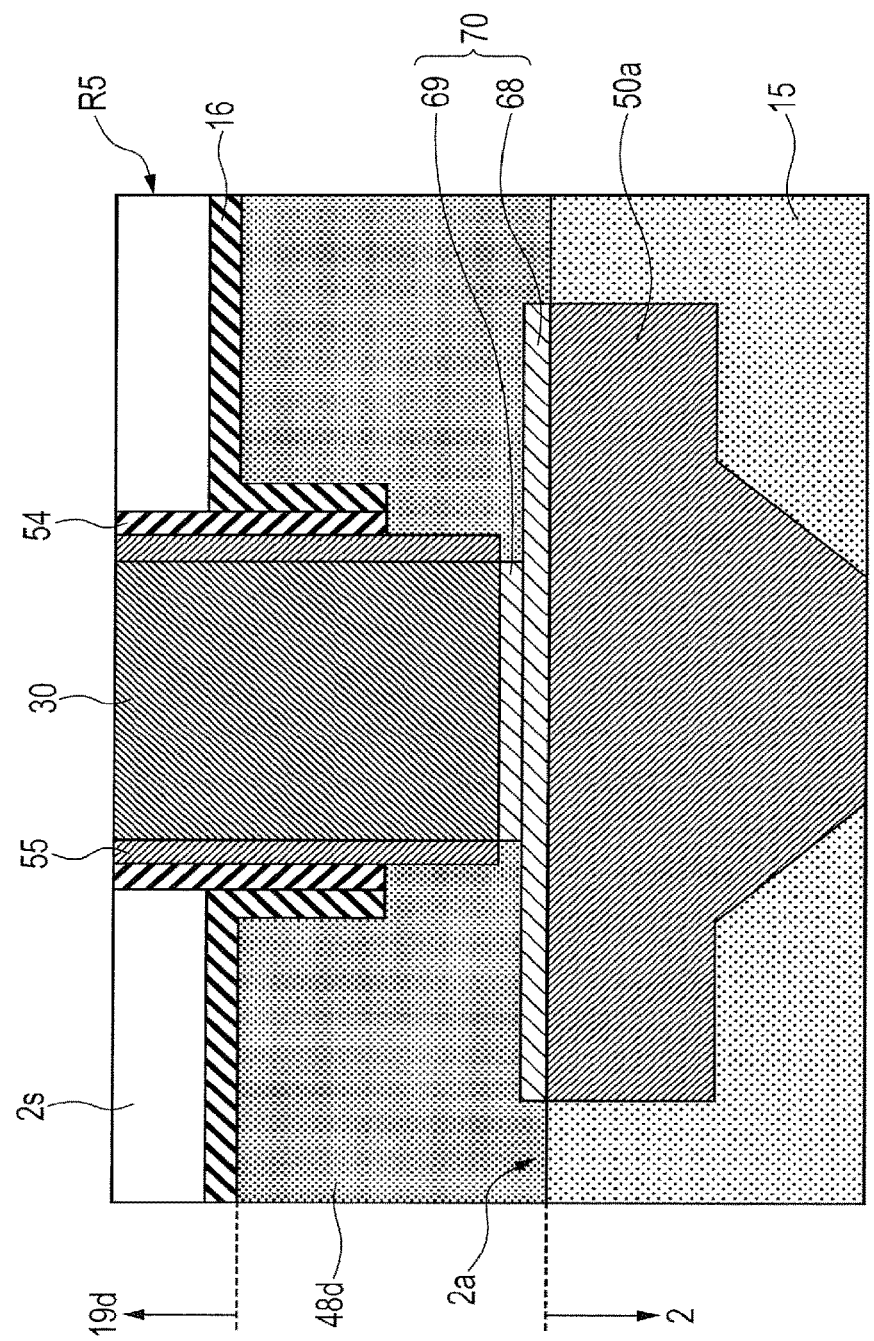
FIG. 15 is an enlarged sectional view of a connection region R5 between the system chip, etc., and a memory chip laminated body in FIG. 13 (a metal adhesive layer 70, etc., is illustrated in a state before junction is formed, according to custom; the same shall apply hereinafter)
Figure 16:
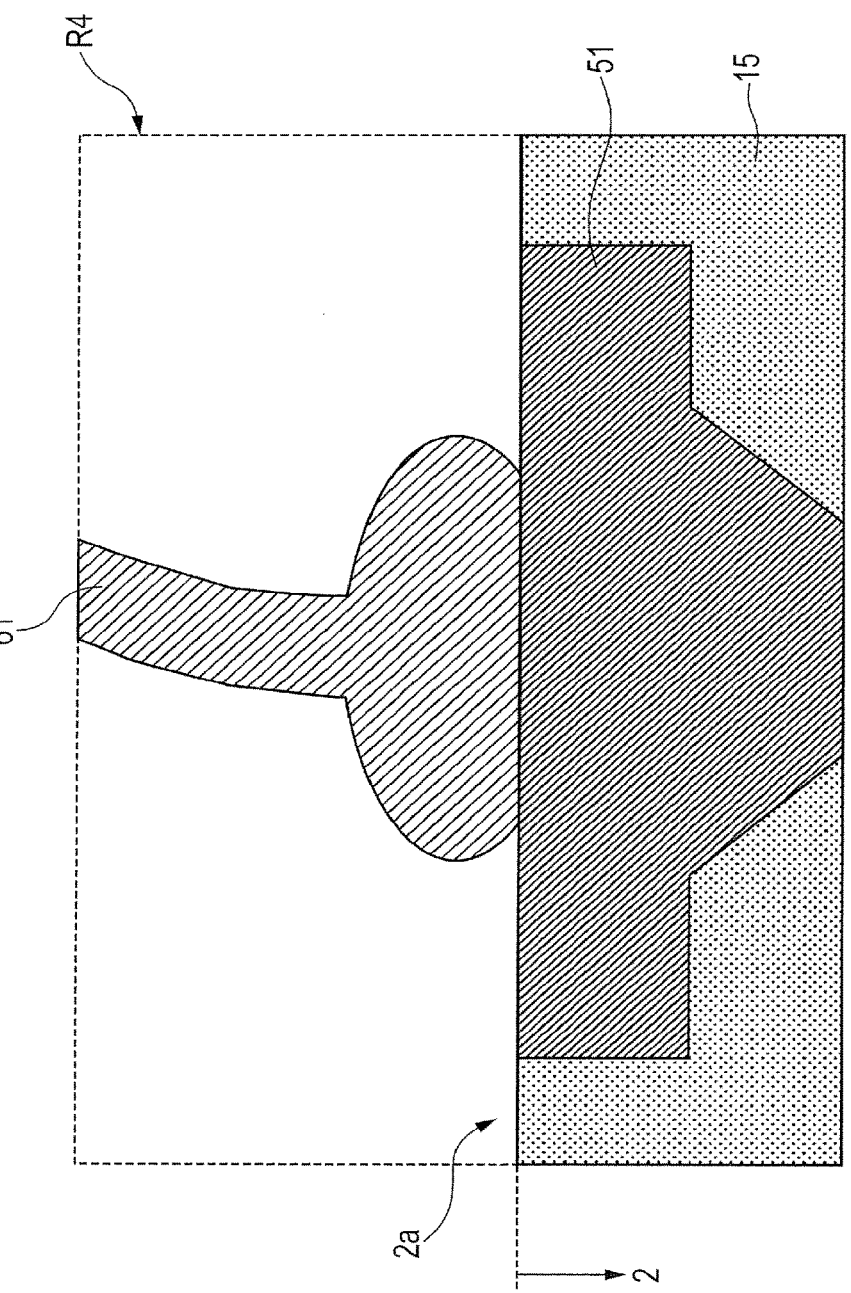
FIG. 16 is an enlarged sectional view of a peripheral region R4 of a bonding pad over the top surface of the chip in FIG. 13.
Figure 17:
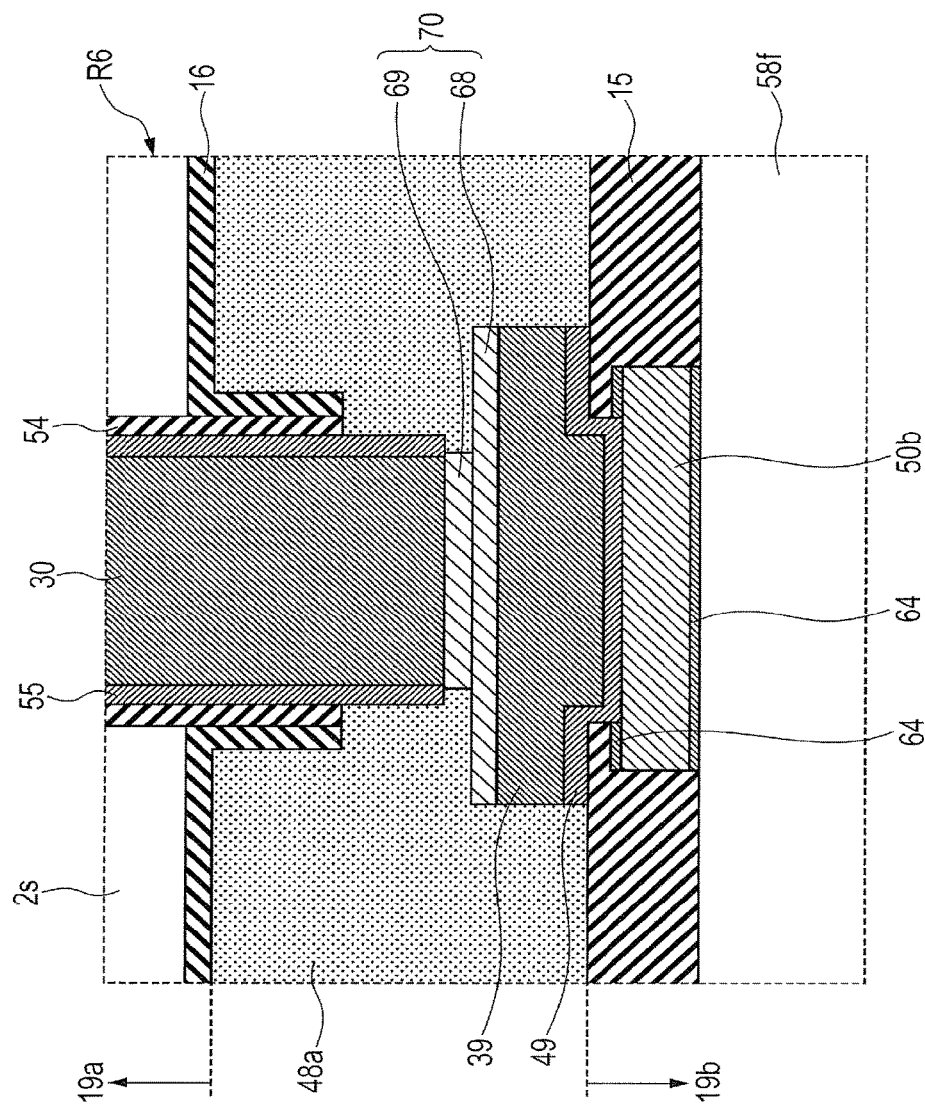
FIG. 17 is an enlarged sectional view of a connection region R6 between memory chips in FIG. 13 (the metal adhesive layer 70, etc., is illustrated in a state before junction is formed, according to custom; the same shall apply hereinafter)
Figure 18:
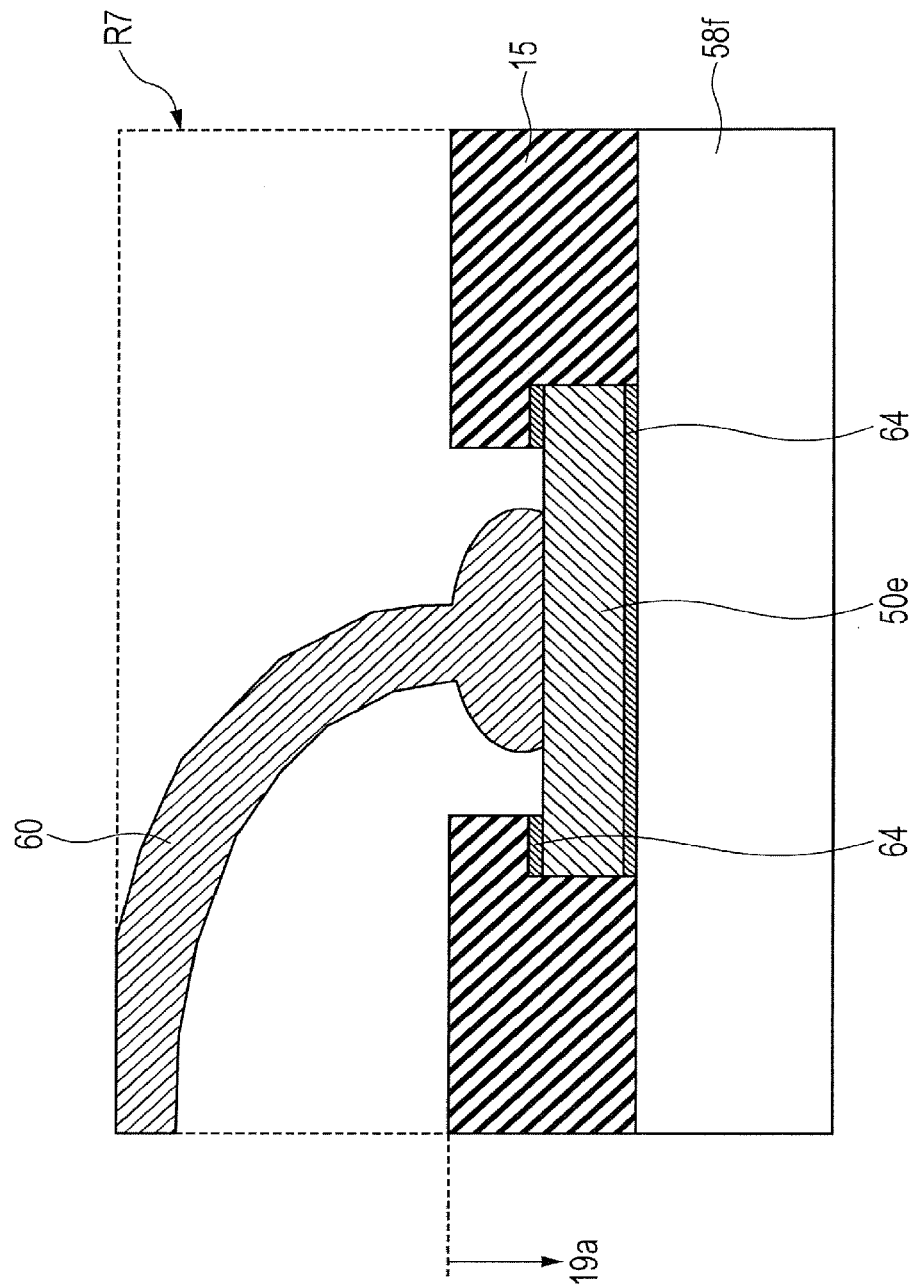
FIG. 18 is an enlarged sectional view of a peripheral region R7 of an uppermost pad in the memory chip laminated body in FIG. 13.
Figure 19:
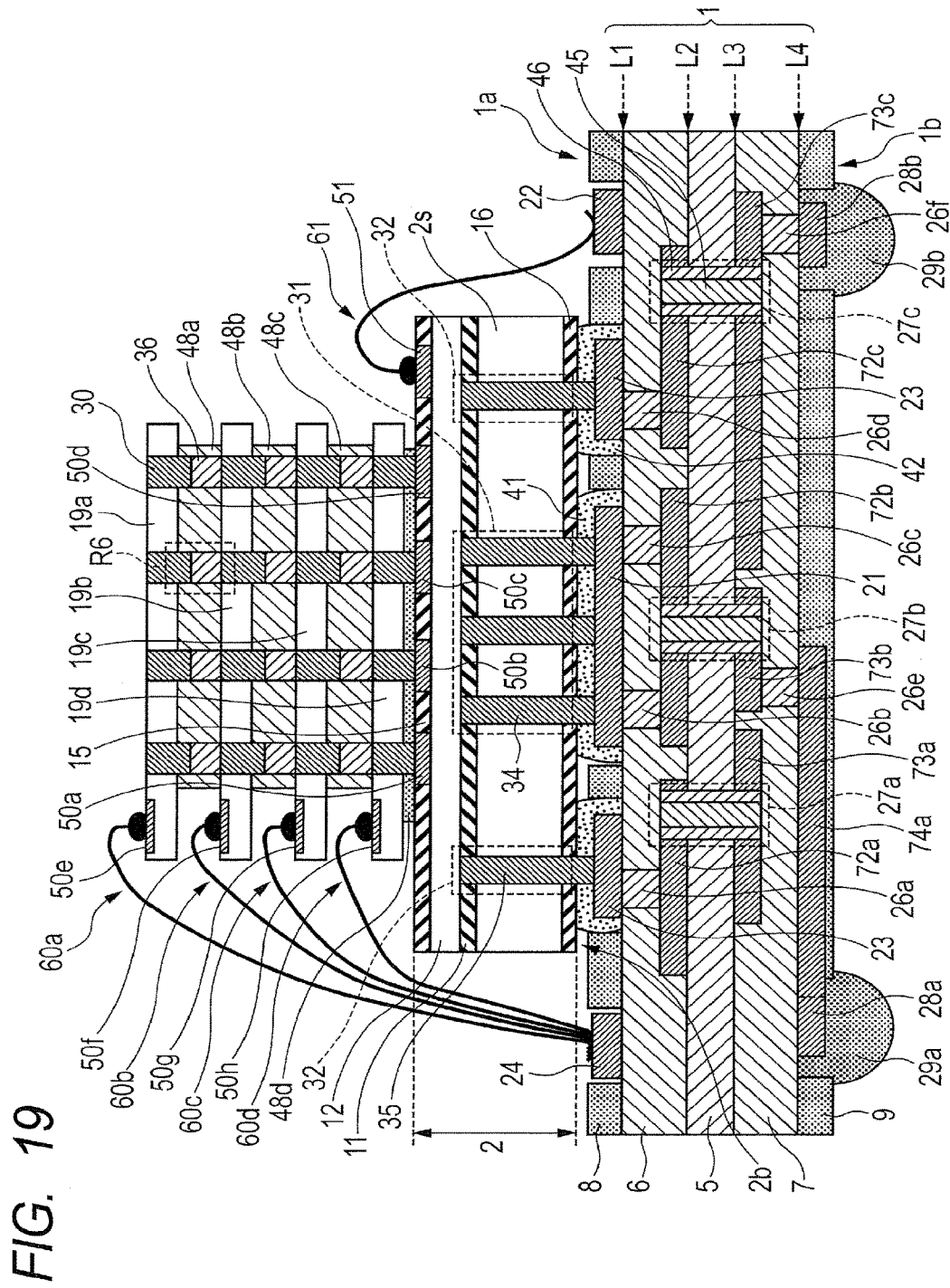
FIG. 19 is an overall sectional view of the BGA, etc., corresponding to FIG. 4 (FIG. 13) (before resin sealing), for explaining a structure, etc., of Second Variation with respect to the memory stack structure (method of supplying I/O power source, etc., by wire bonding in memory stack each layer) in the semiconductor integrated circuit device of the one embodiment of the application.
Figure 20:
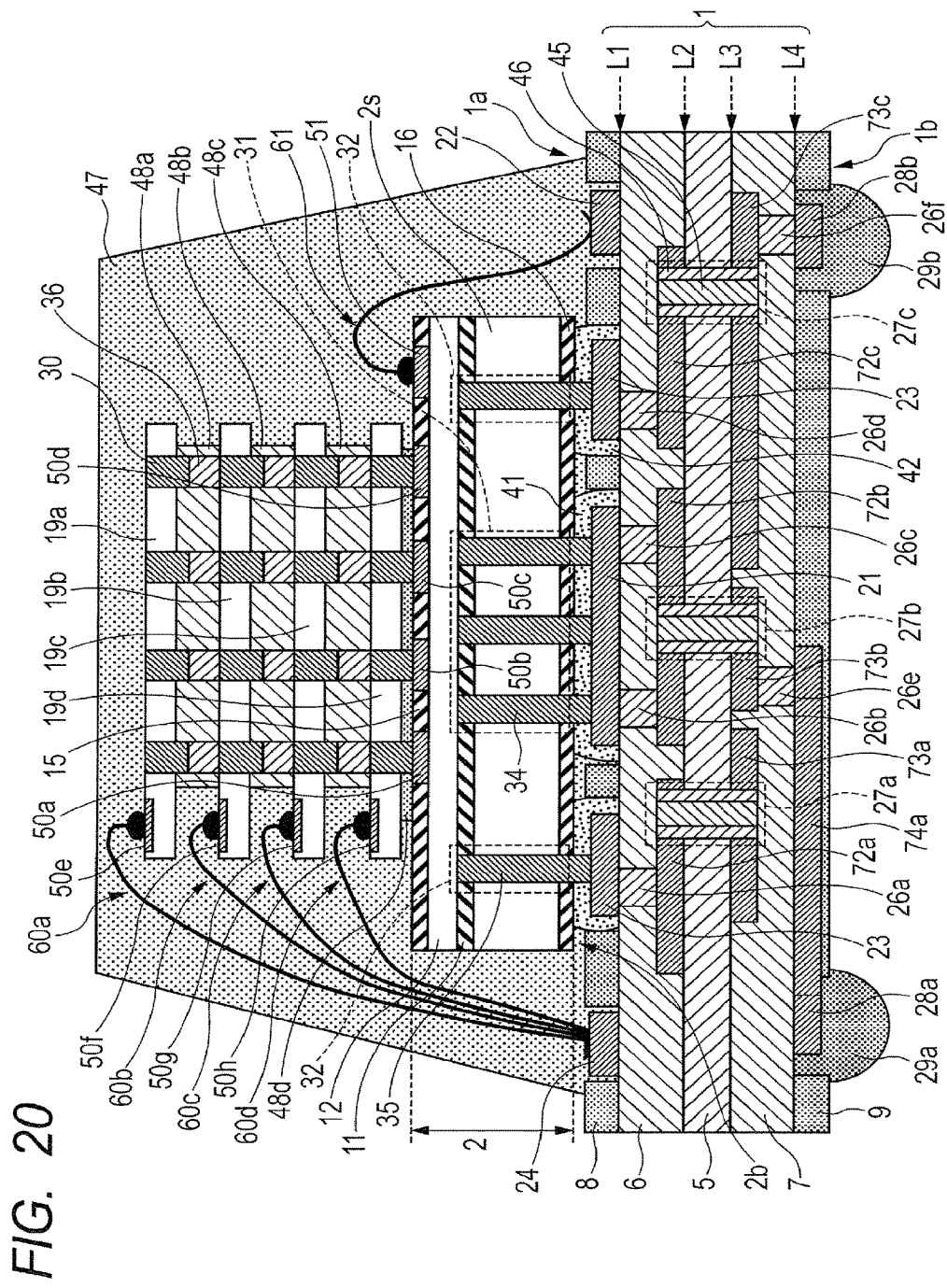
FIG. 20 is an overall sectional view of the BGA, etc., corresponding to FIG. 4 (FIG. 13) (after resin sealing), for explaining the structure, etc., of Second Variation with respect to the memory stack structure (method of supplying I/O power source, etc., by wire bonding in memory stack each layer) in the semiconductor integrated circuit device of the one embodiment of the application.
Figure 21:
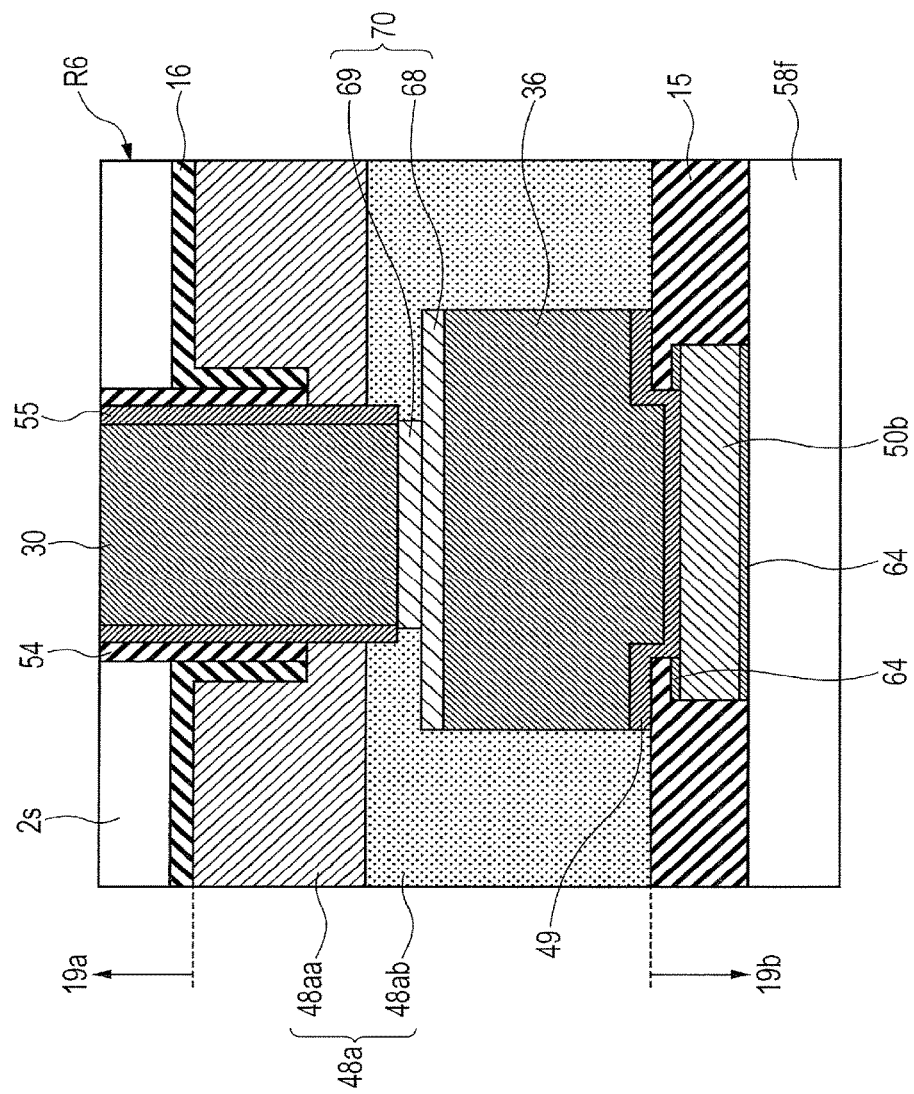
FIG. 21 is an enlarged sectional view of the connection region R6 between the memory chips in FIG. 19 (the metal adhesive layer 70, etc., is illustrated in a state before junction is formed, according to custom; the same shall apply hereinafter)
Figure 22:
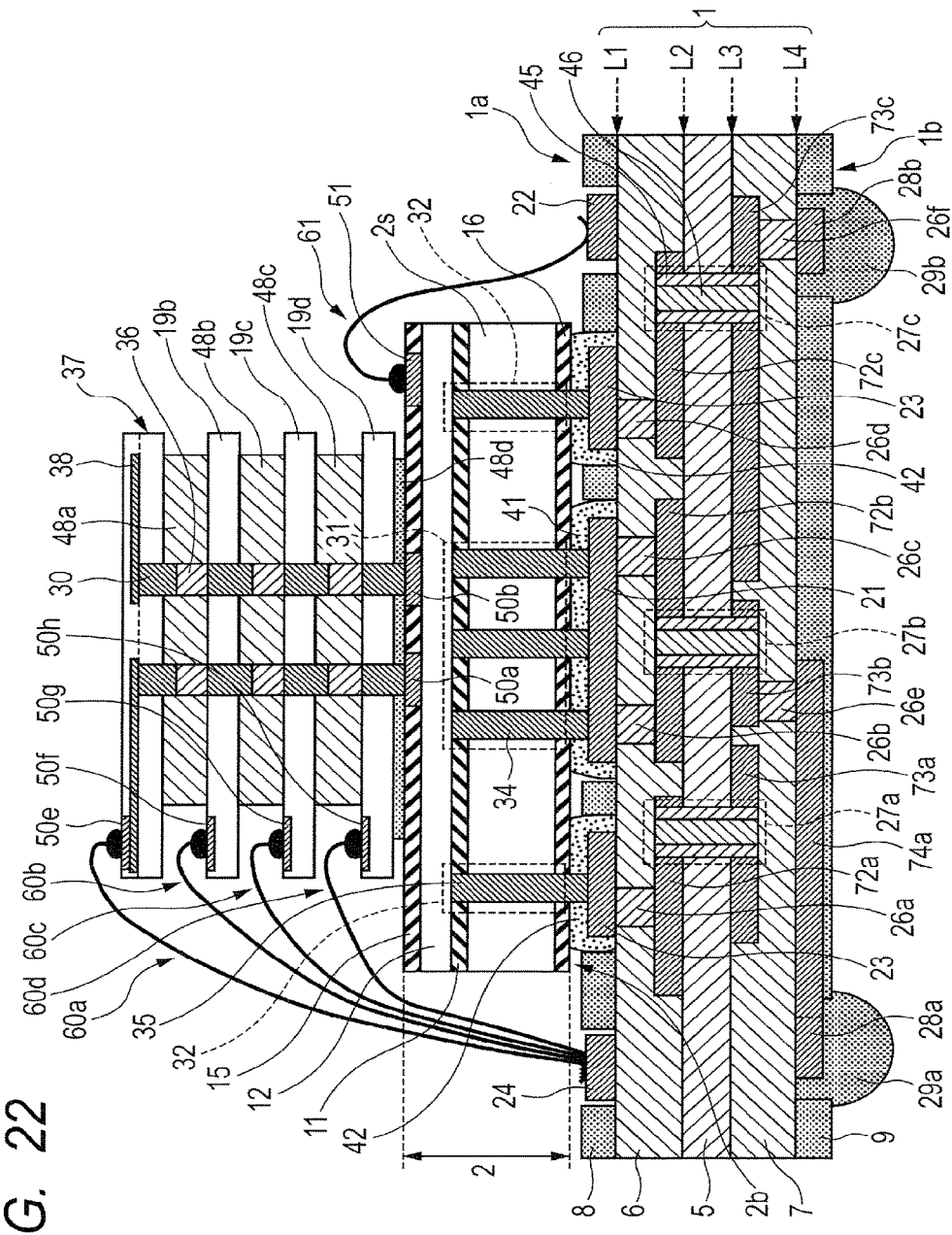
FIG. 22 is an overall sectional view of the BGA, etc., corresponding to FIG. 4 (FIGS. 13 and 19) (before resin sealing), for explaining a structure, etc., of Third Variation with respect to the memory stack structure (method of supplying I/O power source, etc., by wire bonding in memory stack each layer & uppermost layer Si interposer method) in the semiconductor integrated circuit device of the one embodiment of the application.
Figure 23:
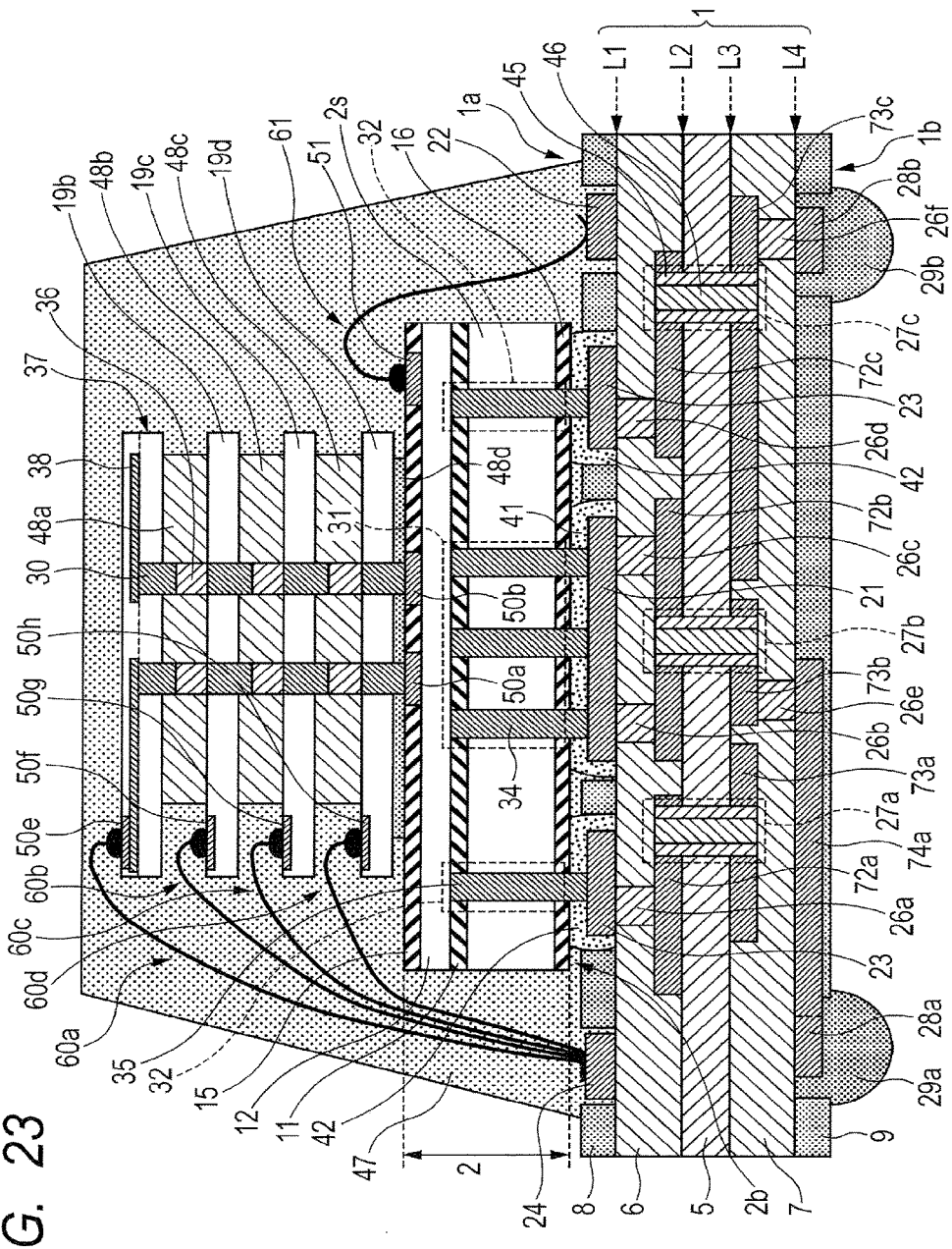
FIG. 23 is an overall sectional view of the BGA, etc., corresponding to FIG. 4 (FIGS. 13 and 19) (after resin sealing), for explaining the structure, etc., of Third Variation with respect to the memory stack structure (method of supplying I/O power source, etc., by wire bonding in memory stack each layer & uppermost layer Si interposer method) in the semiconductor integrated circuit device of the one embodiment of the application.

FIG. 12 is a system block view for explaining a structure, etc., of First Variation with respect to a memory stack structure (method of supplying I/O power source, etc., by wire bonding over memory stack uppermost surface) in the semiconductor integrated circuit device of the one embodiment of the present application. FIG. 13 is an overall sectional view of a BGA, etc., corresponding to FIG. 4 (before resin sealing), for explaining the structure, etc., of First Variation with respect to the memory stack structure (method of supplying I/O power source, etc., by wire bonding over memory stack uppermost surface) in the semiconductor integrated circuit device of the one embodiment of the application. FIG. 14 is an overall sectional view of the BGA, etc., corresponding to FIG. 4, (after resin sealing), for explaining the structure, etc., of First Variation with respect to the memory stack structure (method of supplying I/O power source, etc., by wire bonding over memory stack uppermost surface) in the semiconductor integrated circuit device of the one embodiment of the application. FIG. 15 is an enlarged sectional view of a connection region R5 between the system chip, etc., and a memory chip laminated body in FIG. 13 (a metal adhesive layer 70, etc., is illustrated in a state before junction is formed, according to custom; the same shall apply hereinafter). FIG. 16 is an enlarged sectional view of a peripheral region R4 of a bonding pad over the top surface of the chip in FIG. 13. FIG. 17 is an enlarged sectional view of a connection region R6 between memory chips in FIG. 13 (the metal adhesive layer 70, etc., is illustrated in a state before junction is formed, according to custom; the same shall apply hereinafter). FIG. 18 is an enlarged sectional view of a peripheral region R7 of an uppermost pad in the memory chip laminated body in FIG. 13. FIG. 19 is an overall sectional view of the BGA, etc., corresponding to FIG. 4 (FIG. 13) (before resin sealing), for explaining the structure, etc., of Second Variation with respect to the memory stack structure (method of supplying I/O power source, etc., by wire bonding in memory stack each layer) in the semiconductor integrated circuit device of the one embodiment of the application. FIG. 20 is an overall sectional view of the BGA, etc., corresponding to FIG. 4 (FIG. 13) (after resin sealing), for explaining the structure, etc., of Second Variation with respect to the memory stack structure (method of supplying I/O power source, etc., by wire bonding in memory stack each layer) in the semiconductor integrated circuit device of the one embodiment of the application. FIG. 21 is an enlarged sectional view of the connection region R6 between the memory chips in FIG. 19 (the metal adhesive layer 70, etc., is illustrated in a state before junction is formed, according to custom; the same shall apply hereinafter). FIG. 22 is an overall sectional view of the BGA, etc., corresponding to FIG. 4 (FIGS. 13 and 19) (before resin sealing), for explaining the structure, etc., of Third Variation with respect to the memory stack structure (method of supplying I/O power source, etc., by wire bonding in memory stack each layer & uppermost layer Si interposer method) in the semiconductor integrated circuit device of the one embodiment of the application. FIG. 23 is an overall sectional view of the BGA, etc., corresponding to FIG. 4 (FIGS. 13 and 19) (after resin sealing), for explaining the structure, etc., of Third Variation with respect to the memory stack structure (method of supplying I/O power source, etc., by wire bonding in memory stack each layer & uppermost layer Si interposer method) in the semiconductor integrated circuit device of the one embodiment of the application. Structures in various variations, etc., with respect to the memory stack structure in the semiconductor integrated circuit device of the one embodiment of the application will be described with reference to these views.

FIG. 12, etc., is common among the following respective subsections and most of the others are basically common among the respective subsections, and hence only different portions will be mainly described hereinafter as being basically common.

(1) Method Of Supplying I/O Power Source, etc., by Wire Bonding over Memory Stack Uppermost Surface (Mainly FIGS. 12 to 18):

In this example, a memory stack structure is further mounted over the chip 2 (e.g., SOC type chip) of the FIG. 4 described in Section 1.

A system structure of this example can be exemplified, for example, by the structure illustrated in FIG. 12. As illustrated in FIG. 12, a memory stack structure 17 is mounted over the SOC type chip 2 (generally, logic chip) and the memory stack structure 17 exchanges signals, for example, mainly with the SOC type chip 2, thereby allowing a system structure to be formed, in which the SOC type chip 2 mainly exchanges signals with an external system 18.

Subsequently, the BGA structure of this example will be illustrated in FIG. 13. As illustrated in FIG. 13, bonding pads 50a and 50b are provided in the upper surface (top surface) of the logic chip 2, so that the logic chip 2 and the memory stack structure 17 are electrically connected with one another via these bonding pads and the metal through electrodes 30 in the memory stack structure 17. For example, an inter-chip insulating adhesive layer 48d (under-fill layer) is provided between the lower surface of an undermost memory chip 19d, which forms the memory stack structure 17, and the upper surface of the logic chip 2. Similarly, inter-chip insulating adhesive layers 48a, 48b, and 48c (under-fill layers) are also provided between memory chips 19a and 19b, those 19b and 19c, and those 19c and 19d, respectively. Additionally, the memory chips 19a and 19b, those 19b and 19c, and those 19c and 19d are electrically connected with one another, for example, via the metal through electrodes 30, respectively.

For example, a bonding pad 50e is provided in the upper surface (top surface) of the uppermost memory chip 19a that forms the memory stack structure 17, so that the memory stack structure 17 is electrically connected via a bonding wire 60 to the fourth metal land 24 formed over the top surface 1a of the organic wiring board 1 (BGA interposer). The bonding pad 50e is used for supplying a power supply potential (ground potential), for example, to the I/O circuit region, etc., in the memory stack structure 17 (or may be used for exchanging signals with the I/O circuit regions, etc.) Thus, a power supply potential (ground potential) can be supplied to the I/O circuit region, etc., in the memory stack structure 17, or signals can be exchanged with the I/O circuit region, etc., not only from the below of the memory stack structure 17 but also from the above thereof, and hence reinforcement of power supply (ground potential supply) or exchange of signals with the wiring board without going through an TSV, etc., can be achieved.

Subsequently, a structure formed by resin-sealing the structure in FIG. 13 will be illustrated in FIG. 14. As illustrated in FIG. 14, the main part of the top surface 1*a* of the BGA interposer 1, the whole of the logic chip 2, the whole of the memory stack structure 17, and the whole of the bonding wires 60 and 61 are sealed with a sealing resin (e.g., they are transfer-molded), thereby the resin-sealed body 47 is formed over the top surface 1*a* of the BGA interposer 1.

Subsequently, an example of the detailed sectional structure of the connection region R5 between the system chip, etc., and the memory chip laminated body in FIG. 13 will be illustrated in FIG. 15. As illustrated in FIG. 15, the main part of the top surface 2*a* of the logic chip 2 is covered with the final passivation film 15 (e.g., a polyimide-based buffer film or an insulating film including the buffer film), so that, for example, the bonding pad 50*a* (e.g., a copper bonding pad) is provided there. For example, a tin film 68 is provided over the top surface of the bonding pad 50*a* (before a connection treatment is performed), and a structure is formed, in which the tin film 68 contacts a tin film 69 located on the side of the metal through electrode 30. Herein, a state before the connection treatment is illustrated, although, after the coupling treatment, junction is formed with part of the top surface of the bonding pad 50*a*, part of the lower surface of the metal through electrode 30, part of the tin film 68, etc., and almost all of the tin film 69 forming a copper-tin intermetallic compound film 70 (metal adhesive layer) having a relatively high melting point.

The memory chip 19*d* side will be described. For example, the metal through electrode 30 protrudes from the lower surface of the semiconductor substrate layer 2*s* in the memory chip 19*d*, and a liner insulating film 54 (e.g., silicon oxide-based insulating film) and a TSV barrier metal film 55 (e.g., titanium nitride film) are provided between the metal through electrode 30 and the semiconductor substrate layer 2*s*. For example, the rear surface of the memory chip 19*d* and part of the protruding portion of the metal through electrode 30 are covered with a rear surface insulating film 16 (e.g., silicon nitride-based insulating film), etc. Additionally, for example, an inter-chip insulating adhesive layer 48*d* (under-fill layer) is provided between the rear surface of the memory chip 19*d* and the top surface 2*a* of the logic chip 2.

Subsequently, an example of the detailed sectional structure of the peripheral region R4 of a bonding pad over the top surface of the chip in FIG. 13 will be illustrated in FIG. 16. As illustrated in FIG. 16, the main part of the top surface 2*a* of the logic chip 2 is covered with the final passivation film (e.g., a polyimide-based buffer film or an insulating film including the buffer film), so that, for example, the bonding pad 51 (e.g., a copper bonding pad) is provided there, similarly to the previous description. For example, the first bonding wire 61 (e.g., copper wire), etc., is bonded to the top surface of the bonding pad 51. Herein, the first bonding wire 61 may be a gold wire, silver wire, palladium wire, or the like, other than a copper wire.

Subsequently, an example of the detailed sectional structure of the connection region R6 between the memory chips in FIG. 13 will be illustrated in FIG. 17. As illustrated in FIG. 17, for example, an aluminum-based bonding pad 50*b*, etc., is provided over the inter-main-layer insulating film 58*f* (e.g., a non-Low-k silicon oxide-based insulating film) immediately below the pad layer in the memory chip 19*b*. The structure of the aluminum-based bonding pad 50*b* can be preferably exemplified, for example, by one in which, for example, a titanium nitride-based antireflection film or the barrier metal film 64 is provided over and below an aluminum-based main metal layer.

The upper surface of the memory chip 19*b* and a peripheral portion of the bonding pad 50*b* are covered with the final passivation film 15 including, for example, a silicon oxide-based insulating film, a silicon nitride-based insulating film, or the like, except a pad opening portion, etc. For example, a bump electrode 39 for connection through electrode (e.g., copper bump electrode) is provided over the bonding pad 50*b* via an UBM (Under Bump Metal) film 49, and, for example, the tin film 68 is provided over the upper surface of the bump electrode 39 (before a connection treatment) to form a structure in which the tin film 68 contacts the tin film 69 on the side of the metal through electrode 30. Herein, a state before the connection treatment is illustrated similarly to the previous description, although, after the connection treatment, junction is formed with part of the top surface of the bump electrode 39 for connection through electrode, part of the lower surface of the metal through electrode 30, part of the tin film 68, etc., and almost all of the tin film 69 forming the copper-tin intermetallic compound film 70 (metal adhesive layer) having a relatively high melting point.

The memory chip 19*a* side will be described. For example, the metal through electrode 30 protrudes from the lower surface of the semiconductor substrate layer 2*s* in the memory chip 19*a*, and the liner insulating film 54 (e.g., silicon oxide-based insulating film) and the TSV barrier metal film 55 (e.g., titanium nitride film) are provided between the metal through electrode 30 and the semiconductor substrate layer 2*s*. For example, the rear surface of the memory chip 19*a* and part of the protruding portion of the metal through electrode 30 are covered with the rear surface insulating film 16 (e.g., silicon nitride-based insulating film), etc. Additionally, for example, the inter-chip insulating adhesive layer 48*a* (under-fill layer) is provided between the rear surface of the memory chip 19*a* and the top surface 2*a* of the logic chip 2.

Subsequently, an example of the detailed sectional structure of the peripheral region R7 of the uppermost pad in the memory chip laminated body in FIG. 13 will be illustrated in FIG. 18. As illustrated in FIG. 18, for example, the aluminum-based bonding pad 50*e*, etc., is provided over the inter-main-layer insulating film 58*f* (e.g., a non-Low-k silicon oxide-based insulating film) immediately below the pad layer in the memory chip 19*a*. The structure of the aluminum-based bonding pad 50*e* can be preferably exemplified, for example, by one in which, for example, a titanium nitride-based antireflection film or the barrier metal film 64 is provided over and below an aluminum-based main metal layer.

The upper surface of the memory chip 19*a* and a peripheral portion of the bonding pad 50*e* are covered with the final passivation film 15 including, for example, a silicon oxide-based insulating film, a silicon nitride-based insulating film, or the like, except a pad opening portion, etc. For example, the bonding wire 60 (e.g., gold wire) is connected to a portion over the bonding pad 50*e*. Herein, the bonding wire 60 may be a copper wire, silver wire, palladium wire, or the like, other than a gold wire.

(2) Method Of Supplying I/O Power Source, etc., by Wire Bonding in Memory Stack Each Layer (Mainly FIGS. 19 to 21):

This example is a variation of the example in the subsection (1) in this section. Accordingly, only different portions will be described in principle hereinafter.

As illustrated in FIG. 19, bonding pads 50a, 50b, 50c, and 50d are provided over the upper surface (top surface) of the logic chip 2, so that the logic chip 2 and the memory stack structure 17 are electrically connected with one another via these bonding pads and the metal through electrodes 30 in the memory stack structure 17. For example, the inter-chip insulating adhesive layer 48d (under-fill layer) is provided between the lower surface of the undermost memory chip 19d, which forms the memory stack structure 17, and the upper surface of the logic chip 2. Similarly, the inter-chip insulating adhesive layers 48a, 48b, and 48c (spacer layers) are also provided between the memory chips 19a and 19b, those 19b and 19c, and those 19c and 19d, respectively. Additionally, the memory chips 19a and 19b, those 19b and 19c, and those 19c and 19d are electrically connected with one another, for example, via the metal through electrodes 30, respectively. In more detail, the metal through electrode 30 includes, for example, a main body portion of a metal through electrode and a post electrode 36 for connecting through electrode (a copper post electrode or copper pillar electrode).

For example, the bonding pad 50e is provided in the upper surface (top surface) of the uppermost memory chip 19a that forms the memory stack structure 17, so that the memory stack structure 17 is electrically connected via the bonding wire 60 to the fourth metal land 24 formed over the top surface 1a of the organic wiring board 1 (BGA interposer). Similarly, bonding pads 50f, 50g, and 50h are also provided in the memory chips 19b, 19c, and 19d, respectively, and these memory chips are electrically connected via the bonding pads 60b, 60c, and 60d to the fourth metal land 24 formed over the top surface 1a of the organic wiring board 1 (BGA interposer).

Subsequently, a structure formed by resin-sealing the structure in FIG. 19 will be illustrated in FIG. 20. As illustrated in FIG. 20, the main part of the top surface 1a of the BGA interposer 1, the whole of the logic chip 2, the whole of the memory stack structure 17, and the whole of the bonding wires 60a, 60b, 60c, 60d, and 61, etc., are sealed with a sealing resin (e.g., they are transfer-molded), thereby the resin-sealed body 47 is formed over the top surface 1a of the BGA interposer 1.

Subsequently, an example of the detailed sectional structure of the connection region R6 between the memory chips in FIG. 19 will be illustrated in FIG. 21. As illustrated in FIG. 21, for example, the aluminum-based bonding pad 50b, etc., is provided over the inter-main-layer insulating film 58f (e.g., a non-Low-k silicon oxide-based insulating film) immediately below the pad layer in the memory chip 19b. The structure of the aluminum-based bonding pad 50b can be preferably exemplified, for example, by one in which, for example, a titanium nitride-based antireflection film or the barrier metal film 64 is provided over and below an aluminum-based main metal layer.

The upper surface of the memory chip 19b and the peripheral portion of the bonding pad 50b are covered with the final passivation film 15 including, for example, a silicon oxide-based insulating film, a silicon nitride-based insulating film, or the like, except the pad opening portion, etc. For example, the post electrode 36 for connecting through electrode (e.g., a copper post electrode or copper pillar electrode) is provided over the bonding pad 50b via the UBM (Under Bump Metal) film 49, and, for example, the tin film 68 is provided over the upper surface of the post electrode 36 (before a connection treatment) to form a structure in which the tin film 68 contacts the tin film 69 on the side of the metal through electrode 30. Herein, a state before the connection treatment is illustrated similarly to the previous description, although, after the connection treatment, junction is formed with part of the top surface of the post electrode 36 for connecting through electrode, part of the lower surface of the metal through electrode 30, part of the tin film 68, etc., and almost all of the tin film 69 forming the copper-tin intermetallic compound film 70 (metal adhesive layer) having a relatively high melting point. Herein, the height of the post electrode 36 for connecting through electrode is larger than that of the bump electrode 39 for connecting through electrode in FIG. 17. This is because a space for the bonding by the bonding wires 60b, 60c, and 60d is secured.

The memory chip 19a side will be described. For example, the metal through electrode 30 protrudes from the lower surface of the semiconductor substrate layer 2s in the memory chip 19a, and the liner insulating film 54 (e.g., silicon oxide-based insulating film) and the TSV barrier metal film 55 (e.g., titanium nitride film) are provided between the metal through electrode 30 and the semiconductor substrate layer 2s. For example, the rear surface of the memory chip 19a and part of the protruding portion of the metal through electrode 30 are covered with the rear surface insulating film 16 (e.g., silicon nitride-based insulating film), etc. Additionally, for example, the inter-chip insulating adhesive layer 48a (under-fill layer) is provided between the rear surface of the memory chip 19a and the top surface 2a of the logic chip 2. When this under-fill layer 48a is a no-flow underfill layer, it is desirable that the upper layer is, for example, a silica filler-containing inter-chip insulating adhesive layer 48aa (no-flow underfill layer) and the lower layer is a silica filler-excluding inter-chip insulating adhesive layer 48ab (no-flow underfill layer). It is needless to say that this is not an essential element.

As described above, it is structured that a power supply potential (ground potential) is supplied to the I/O circuit region, etc. (or signals may be exchanged with the I/O circuit region, etc.) in each chip in the memory stack structure 17 via the bonding wires 60a, 60b, 60c, and 60d. Thus, a power supply potential (ground potential) can be supplied to the I/O circuit region, etc., in the memory stack structure 17, or signals can be exchanged with the I/O circuit region, etc., not only from the uppermost layer in the memory stack structure 17 but also from each layer (each chip) therein, and hence reinforcement of power supply (ground potential supply) or exchange of signals with the wiring board without going through an TSV, etc., can be achieved.

(3) Method Of Supplying I/O Power Source, etc., by Wire Bonding in Memory Stack Each Layer & Uppermost Layer Si Interposer Method (Mainly FIG. 22 and FIG. 23):

This example is a further variation of the example in the subsection (2) in this section. Accordingly, only different portions will be described in principle hereinafter.

As illustrated in FIG. 22, this example is characterized by that the uppermost memory chip 19a in FIG. 19 is replaced, for example, by an Si interposer 37. The bonding pad 50e and the metal through electrode 30, etc., are provided in the Si interposer 37, similarly to the uppermost memory chip 19a, and further a wiring 38 in interposer is provided therein.

Subsequently, a structure formed by resin-sealing the structure in FIG. 22 will be illustrated in FIG. 23. As illustrated in FIG. 23, the main part of the top surface 1a of the BGA interposer 1, the whole of the logic chip 2, the whole of the memory stack structure 17, and the whole of the bonding wires 60a, 60b, 60c, 60d, and 61, etc., are sealed with a sealing resin (e.g., they are transfer-molded), thereby the resin-sealed body 47 is formed over the top surface 1a of the BGA interposer 1.

As described above, it is structured that a power supply potential (ground potential) is supplied to the I/O circuit region, etc. (or signals may be exchanged with the I/O circuit region, etc.) in each chip in the memory stack structure 17 via the bonding wires 60a, 60b, 60c, and 60d. In addition to this, a silicon interposer is installed in the uppermost layer such that wires can be bonded to a portion over the uppermost layer. Flexibility in bonding wires to portions over the uppermost layer in the memory stack structure 17 can be improved in this way, and the same advantages as those in FIG. 19 can be obtained in each memory chip. That is, a power supply potential (ground potential) can be supplied to the I/O circuit region, etc., in the memory stack structure 17, or signals can be exchanged with the I/O circuit region, etc., not only from the uppermost layer in the memory stack structure 17 but also from each layer (each chip) therein, and hence reinforcement of power supply (ground potential supply) or exchange of signals with the wiring board without going through an TSV, etc., can be achieved.

4. Description of Structures, etc., of BGA, etc., in Semiconductor Integrated Circuit Device of Another Embodiment of Present Application, (Mainly FIGS. 24 to 27)

Unlike Section 1, a system chip is mounted, for example, over an organic multilayer wiring board (interposer) in a face-down manner (e.g., by flip-chip bonding) in this section, and hereinafter a BGA will be specifically described as an example. However, it is needless to say that the present embodiment can be widely applied to devices in which a semiconductor chip is mounted over a wiring board in a face-down manner, without limiting to the BGA.

The organic multilayer wiring board (interposer), etc., is basically almost the same as that previously described, and hereinafter only different portions will be described in principle.

Figure 24:
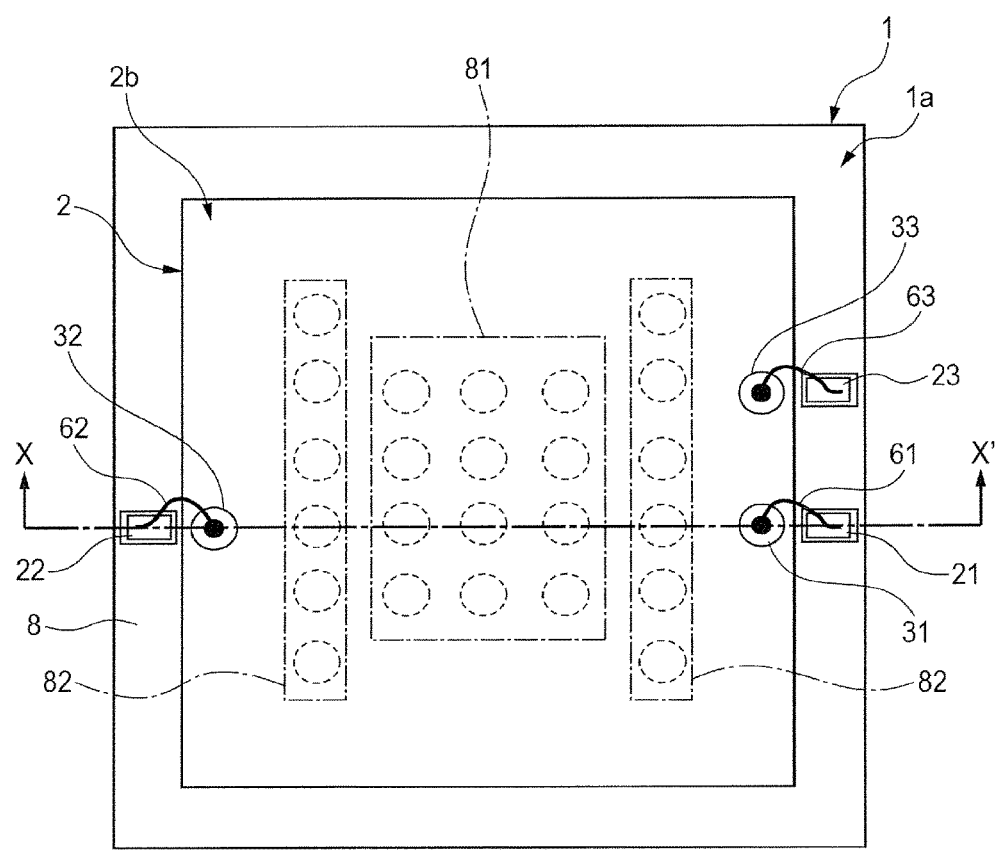
FIG. 24 is an overall top view of a BGA corresponding to FIG. 3, for explaining the structure, etc., of a BGA, etc., in a semiconductor integrated circuit device of another embodiment of the application (for convenience of illustration, structures such as a pad, land, and wire, which are requisite minimum, are only illustrated; the same shall apply hereinafter)
Figure 25:
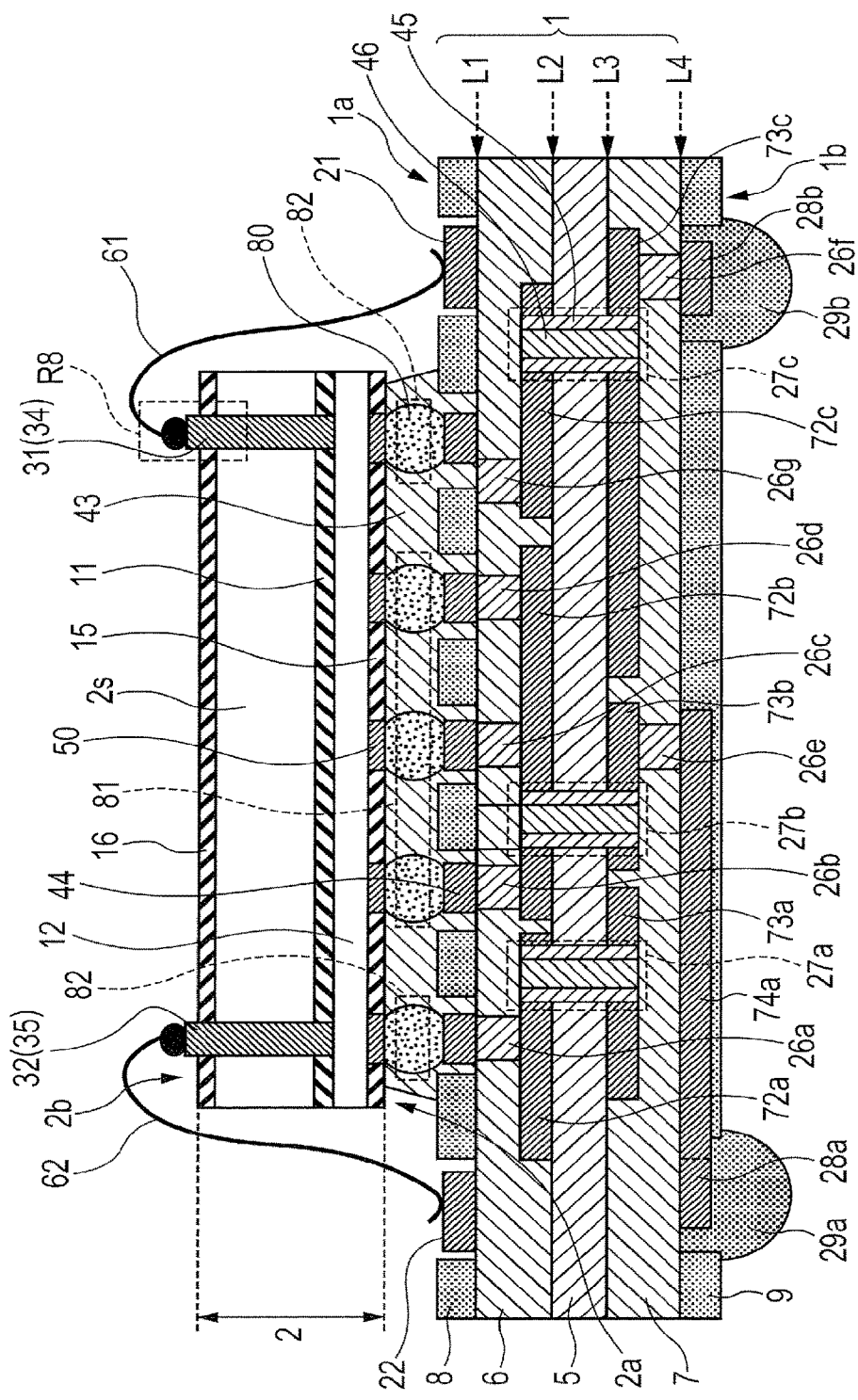
FIG. 25 is an overall sectional view of the BGA, etc., corresponding to the X-X' section in FIG. 24 (before resin sealing)
Figure 26:
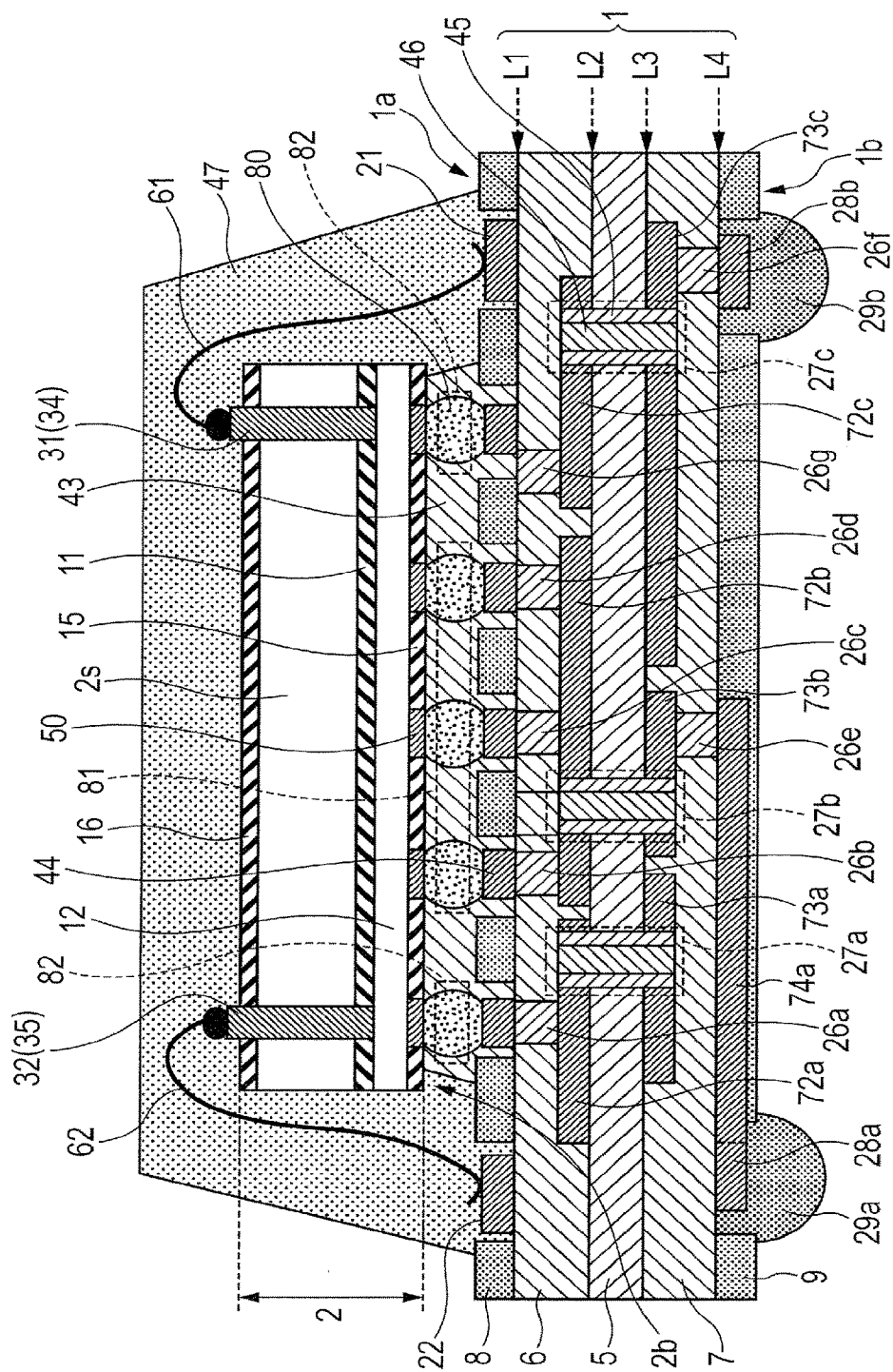
FIG. 26 is an overall sectional view of the BGA etc., corresponding to the X-X' section in FIG. 24 (after resin sealing)
Figure 27:
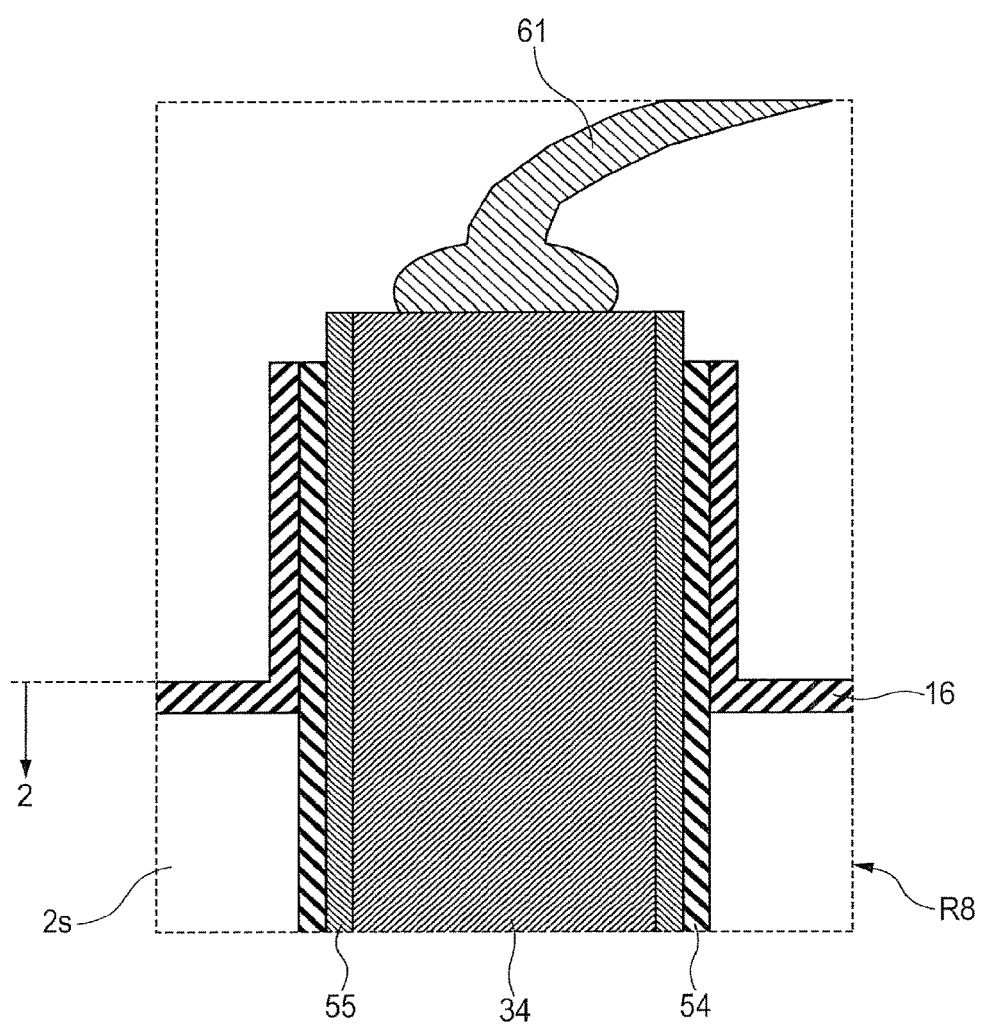
FIG. 27 is an enlarged sectional view of a peripheral region R8 of a bonding pad over the rear surface of the chip in FIG. 25.

FIG. 24 is an overall top view of a BGA corresponding to FIG. 3, for explaining the structure, etc., of a BGA, etc., in a semiconductor integrated circuit device of another embodiment of the present application (for convenience of illustration, structures such as a pad, land, and wire, which are requisite minimum, are only illustrated; the same shall apply hereinafter). FIG. 25 is an overall sectional view of the BGA, etc., corresponding to the X-X' section in FIG. 24 (before resin sealing). FIG. 26 is an overall sectional view of the BGA, etc., corresponding to the X-X' section in FIG. 24 (after resin sealing). FIG. 27 is an enlarged sectional view of a peripheral region R8 of a bonding pad over the rear surface of the chip in FIG. 25. The structure, etc., of a BGA, etc., in the semiconductor integrated circuit device of another embodiment of the application will be described with reference to these views.

An example of the upper surface structure, etc., in the BGA will be first illustrated in FIG. 24. As illustrated in FIG. 24, for example, a first metal land 21, a second metal land 22, and a third metal land 23, etc., are provided over a top surface 1a of a BGA interposer 1, and most of the remaining top surface 1a is covered with a top surface solder resist film 8. The relationship between the top surface solder resist film 8 and each land, etc., is one according to an NSMD (Non-Solder Mask Defined) method in this example, but it is needless to say that the relationship may be one according to an SMD (Solder Mask Defined) method. However, the NSMD method generally has the advantage that an arrangement density of lands, etc., can be increased.

A first group 31 of metal through electrodes, a second group 32 of metal through electrodes, and a third group 33 of metal through electrodes, etc., are provided over a rear surface 2b (second main surface) of the system chip 2 such that one end of each of these metal through electrodes protrudes or is exposed. The second group 32 of the metal through electrodes and the second metal land 22 are electrically connected with one another by a second bonding wire 62. Similarly, the first group 31 of the metal through electrodes and the first metal land 21 are electrically connected with one another by a first bonding wire 61. Further, the third group 33 of the metal through electrodes and the third metal land 23 are electrically connected with one another by a third bonding wire 63. Since each of first metal through electrodes 34, which forms the first group 31 of the metal through electrodes on the rear surface 2b side of the logic chip 2, is thus electrically connected to the third metal land 23, etc., in the upper surface 1a of the wiring board 1 by the first bonding wire 61, etc., the chip 2 and the wiring board 1 can be electrically connected with one another without going through a bump electrode that is flip-chip bonded.

In this example, the first group 31 of the metal through electrodes are used for supplying a power supply potential to, for example, an I/O circuit region 4 (second integrated circuit region). Additionally, the third group 33 of the metal through electrodes are used for exchanging signals with the I/O circuit region 4. Since signals are thus exchanged with the I/O circuit region 4 via the third group 33 of the metal through electrodes, a signal pathway in which a signal delay is small can be provided. Additionally, the second group 32 of the metal through electrodes are used for supplying a ground potential to, for example, the I/O circuit region 4 in this example.

A first group 81 of bump electrodes and a second group 82 of bump electrodes are provided in the top surface 2a (first main surface) of the system chip 2. Herein, the first group 81 of the bump electrodes are used for supplying a power supply potential to a first integrated circuit region 3 (internal circuit region). On the other hand, the second group 82 of bump electrodes are used for supplying a ground potential to the first integrated circuit region 3 (internal circuit region).

Subsequently, the X-X' section in FIG. 24 will be illustrated in FIG. 25. As illustrated in FIG. 25, an organic wiring board 1 (BGA interposer), or a first organic wiring board, is, for example, a build-up four-layered substrate with a glass epoxy-based core substrate, and has an uppermost metal wiring layer L1 (e.g., a copper-based metal film; the same shall apply hereinafter), a second metal wiring layer L2, a third metal wiring layer L3, and a lowermost metal wiring layer L4. Among them, the second metal wiring layer L2 is a so-called power supply plane layer, and the third metal wiring layer L3 is a ground plane layer.

The organic wiring board 1 has, for example: a core organic insulating substrate 5 located at the center; second layer metal wiring 72a, 72b, and 72c provided on the top surface side of the core organic insulating substrate 5; third layer metal wiring 73a, 73b, and 73c provided on the rear surface side of the core organic insulating substrate 5; and embedded through vias 27a, 27b, and 27c each penetrating the core organic insulating substrate 5. A top surface build-up organic insulating layer 6 (e.g., an epoxy-based insulating film) is provided over the top surface 1a of the core organic insulating substrate 5 and the second layer metal wiring 72a and 72b, and 72c, while a rear surface build-up organic insulating layer 7 (e.g., an epoxy-based insulating film) is provided over a rear surface 1b of the core organic insulating substrate 5. Each of the embedded through vias 27a, 27b, and 27c has, for example, a metal via portion 45 (e.g., a copper-based metal film) and an insulating resin embedded portion 46 (e.g., an epoxy-based insulating member, almost homogeneous with the top surface build-up organic insulating layer 6, etc., is embedded).

Uppermost layer metal patterns, such as the first metal land (e.g., a copper-based metal film; the same shall apply hereinafter), the second metal land 22, and a land 44 for flip-chip bonding, all of which belong to the uppermost metal wiring layer L1, are provided over the top surface build-up organic insulating layer 6. In this example, most of portion over the top surface build-up organic insulating layer 6, in the portion the uppermost layer metal patterns being not provided, is covered with the top surface solder resist film 8.

Similarly, lowermost metal patterns such as external bump electrode attaching lands 28a and 28b (e.g., copper-based metal films; the same shall apply hereinafter) and lowermost layer metal wiring 74a, all of which belong to the lowermost layer metal wiring layer L4, are provided over the rear surface build-up organic insulating layer 7. In this example, most of portion over the rear surface build-up organic insulating layer 7, in the portion the lowermost layer metal patterns being not provided, is covered with a rear surface solder resist film 9.

Blind vias 26a, 26b, 26c, 26d, and 26g (each including, for example, a copper-based metal member; the same shall apply hereinafter) are provided in the top surface build-up organic insulating layer 6, while blind vias 26e and 26f are provided in the rear surface build-up organic insulating layer 7.

External bump electrodes 29a and 29b (e.g., lead-free solder bump electrodes) are provided over the external bump electrode attaching lands 28a and 28b, respectively.

A logic chip 2 (an integrated circuit chip having a logic circuit and a CPU, etc.), such as an SOC (System-On-Chip), is mounted over the top surface 1a of the organic wiring board 1 in a face-down manner. The logic chip 2 includes: a semiconductor substrate layer 2s; a rear surface insulating film 16 provided on the rear surface 2b side (upper side) of the semiconductor substrate layer; a premetal layer 11 provided on the top surface 2a side (lower side) thereof; a multilayer wiring layer 12 provided over the premetal layer 11; a bonding pad 50 provided over the multilayer wiring layer 12; a final passivation film 15; and the like. In this example, the bonding pad 50, etc., is, for example, aluminum-based bonding pads; however, they may be copper-based bonding pads, palladium-based bonding pads, or bonding pads whose principal components are other metal materials.

In this example, each of the bonding pads 50 and each of the lands 44 for flip-chip bonding are electrically connected with one another via chip top surface bump electrodes 80 that form each of the first group 81 of the bump electrodes and the second group 82 of the bump electrodes, respectively. In this example, the first group 81 of the bump electrodes are used for supplying a power supply potential to the first integrated circuit region 3 (internal circuit region), while the second group 82 of the bump electrodes are used for supplying a ground potential to the first integrated circuit region 3 (internal circuit region). Since a power supply potential is thus supplied to the first integrated circuit region 3 (internal circuit region) via the first group 81 of the bump electrodes, a voltage drop in the region can be effectively prevented. Similarly, because a ground potential is thus supplied to the first integrated circuit region 3 (internal circuit region) via the second group 82 of the bump electrodes, a potential variation in the region can be effectively prevented.

The logic chip 2 has groups of metal through electrodes such as the first group 31 of the metal through electrodes and the second group 32 of the metal through electrodes each penetrating the semiconductor substrate layer 2s. In this example, the first group 31 of the metal through electrodes have, for example, TSV (Through-Silicon Via) electrodes such as the first metal through electrodes 34, while the second group 32 of the metal through electrodes have TSV electrodes such as the second metal through electrodes 35. The upper end portion of each of the first metal through electrodes 34 that form the first group 31 of the metal through electrodes is electrically connected to the first metal land 21 via the first bonding wire 61. Similarly, the upper end portion of each of the second metal through electrodes 35 that form the second group 32 of the metal through electrodes is electrically connected to the second metal land 22 via the second bonding wire 62. In this example, the first group 31 of the metal through electrodes are used for supplying a power supply potential to the second integrated circuit region 4 (I/O circuit region), while the second group 32 of the metal through electrodes are used for supplying a ground potential to the second integrated circuit region 4 (I/O circuit region). Since a power supply potential is thus supplied to the second integrated circuit region 4 (I/O circuit region) via the first group 31 of the metal through electrodes, a power supply variation can be sufficiently suppressed, even when a power supply potential is not supplied from other pathways, or even when it is not sufficiently supplied from other pathways. Similarly, because a ground potential is thus supplied to the second integrated circuit region 4 (I/O circuit region) via the second group 32 of the metal through electrodes, a ground potential variation can be sufficiently suppressed, even when a ground potential is not supplied from other pathways, or even when it is not sufficiently supplied from other pathways.

In this case, the number of the metal through electrodes, which form the first group 31 of the metal through electrodes or the second group 32 of the metal through electrodes, may be one or more. By providing multiple metal through electrodes, it becomes easier to sufficiently secure the supply of a power supply potential or ground potential.

Herein, the material for the first bonding wire 61 and the second bonding wire 62 can be preferably exemplified by a copper wire. The material for the bonding wires can be preferably exemplified by a gold wire, silver wire, palladium wire, or the like, other than a copper wire.

Subsequently, a sealed body, in which the semiconductor chip 2 and the bonding wires 61 and 62, etc., in FIG. 25 are sealed with a sealing resin (e.g., an epoxy-based sealing resin, i.e., a thermosetting sealing resin), will be illustrated in FIG. 26. As illustrated in FIG. 26, a resin-sealed body 47 is formed near to the top surface 1a of the organic wiring board 1.

Subsequently, an enlarged sectional view of the peripheral region R8 of the upper end portion of each of the metal through electrodes in FIG. 25 will be illustrated in FIG. 27 (the respective TSV electrodes have the same structures as each other, but herein the metal through electrode 34 will be described as an example). As illustrated in FIG. 27, the semiconductor substrate layer 2s, such as the logic chip 2, is located below, and the upper end portion of the metal through electrode 34 protrudes from the substrate layer. Almost all of the side surface of the metal through electrode 34 is covered with a TSV barrier metal film 55 such as, for example, a titanium nitride film. Almost all of the side surface of the metal through electrode 34, excluding a portion near to the upper end portion of the side surface, is covered with a liner insulating film 54 such as, for example, a silicon oxide-based insulating film. Further, the portion of the metal through electrode 34, the portion protruding from the rear surface 2b of the semiconductor substrate layer 2s (single crystal silicon substrate in this example), and the rear surface 2b (upper surface) of the semiconductor substrate layer 2s are covered with the rear surface insulating film 16 such as, for example, a silicon nitride-based insulating film.

Herein, the bonding wire 61, etc., is bonded to the upper end portion of the metal through electrode 34.

5. Additional Description of The Embodiments (Including Variations) and Consideration of The Whole Description (Mainly FIGS. 28 and 30)

Figure 28:
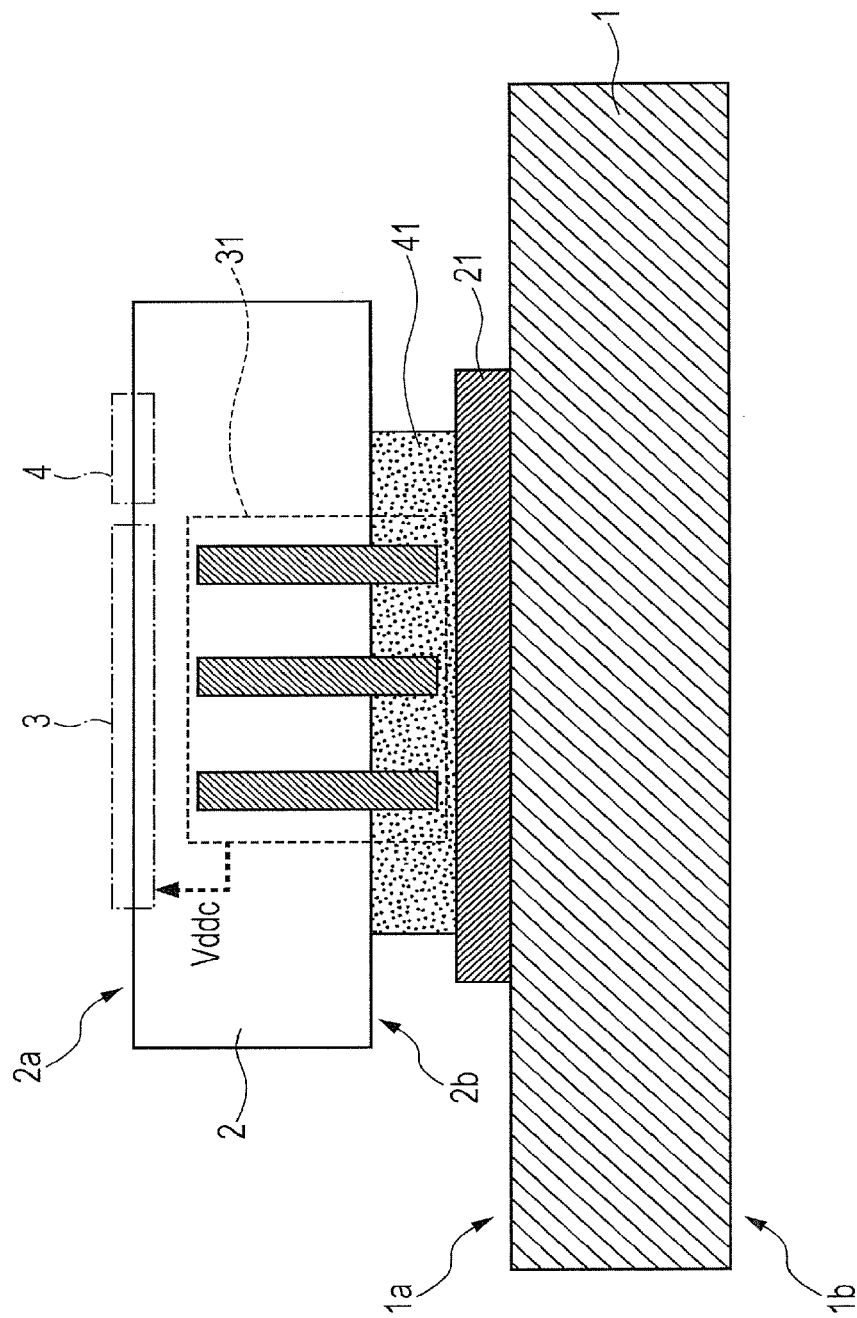
FIG. 28 is a schematic overall sectional view almost corresponding to FIG. 4, for explaining the outline, etc., of the one embodiment (including variations)
Figure 29:
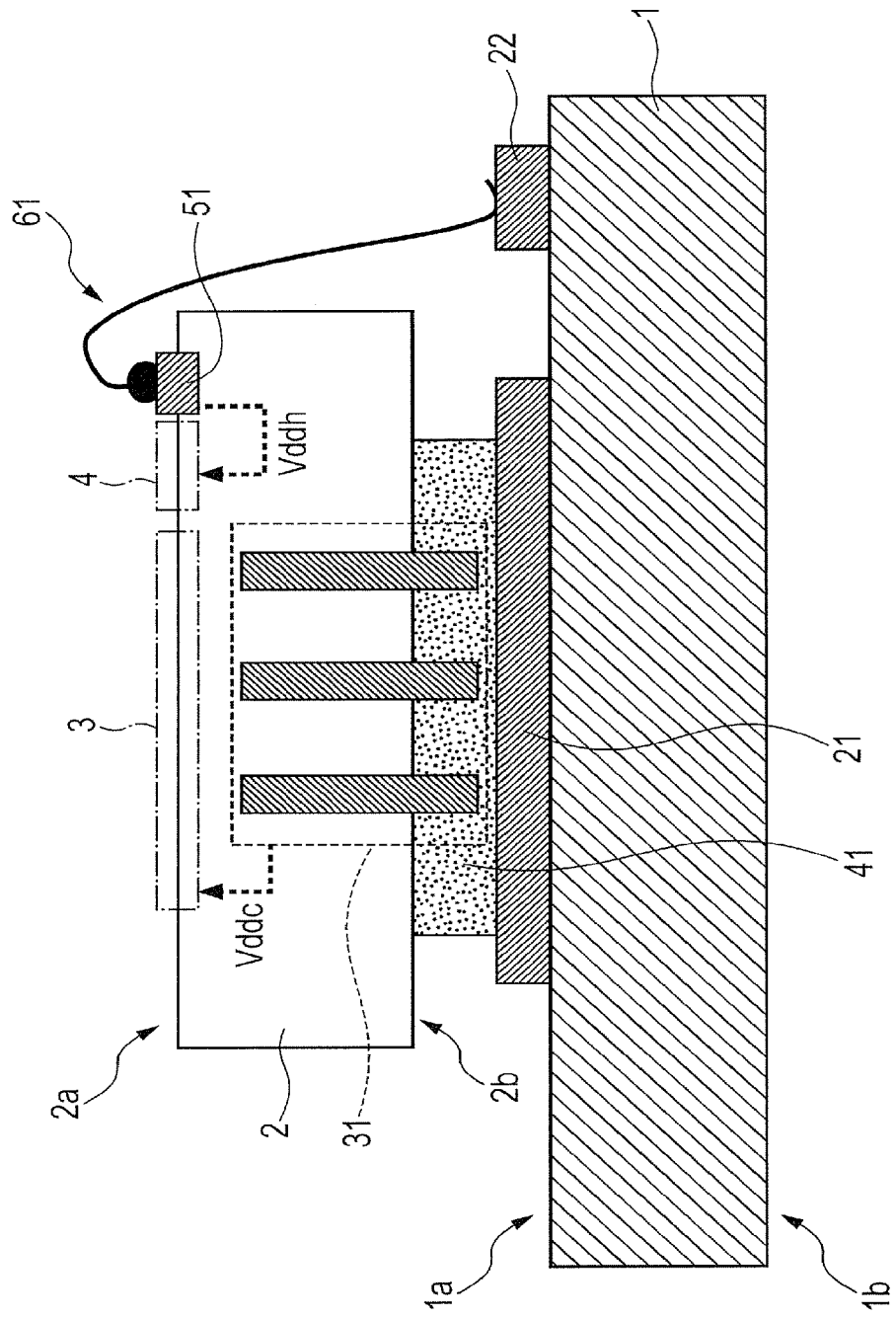
FIG. 29 is a schematic overall sectional view almost corresponding to FIG. 4 (FIG. 28), for explaining the outline, etc., of other parts of the one embodiment (including variations)
Figure 30:
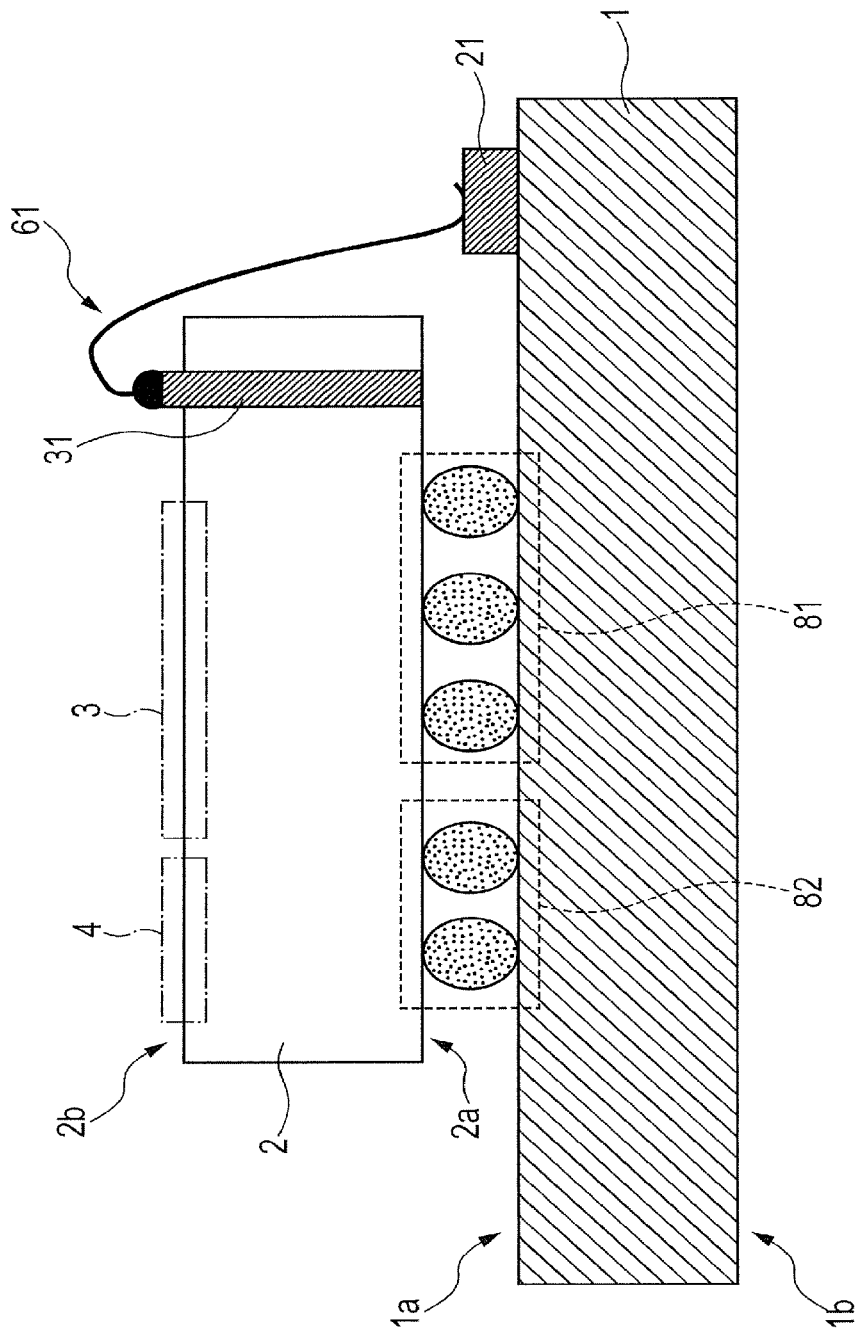
FIG. 30 is a schematic overall sectional view almost corresponding to FIG. 4 (FIGS. 28 and 29), for explaining the outline, etc., of the another embodiment (including variations)
Figure 31:
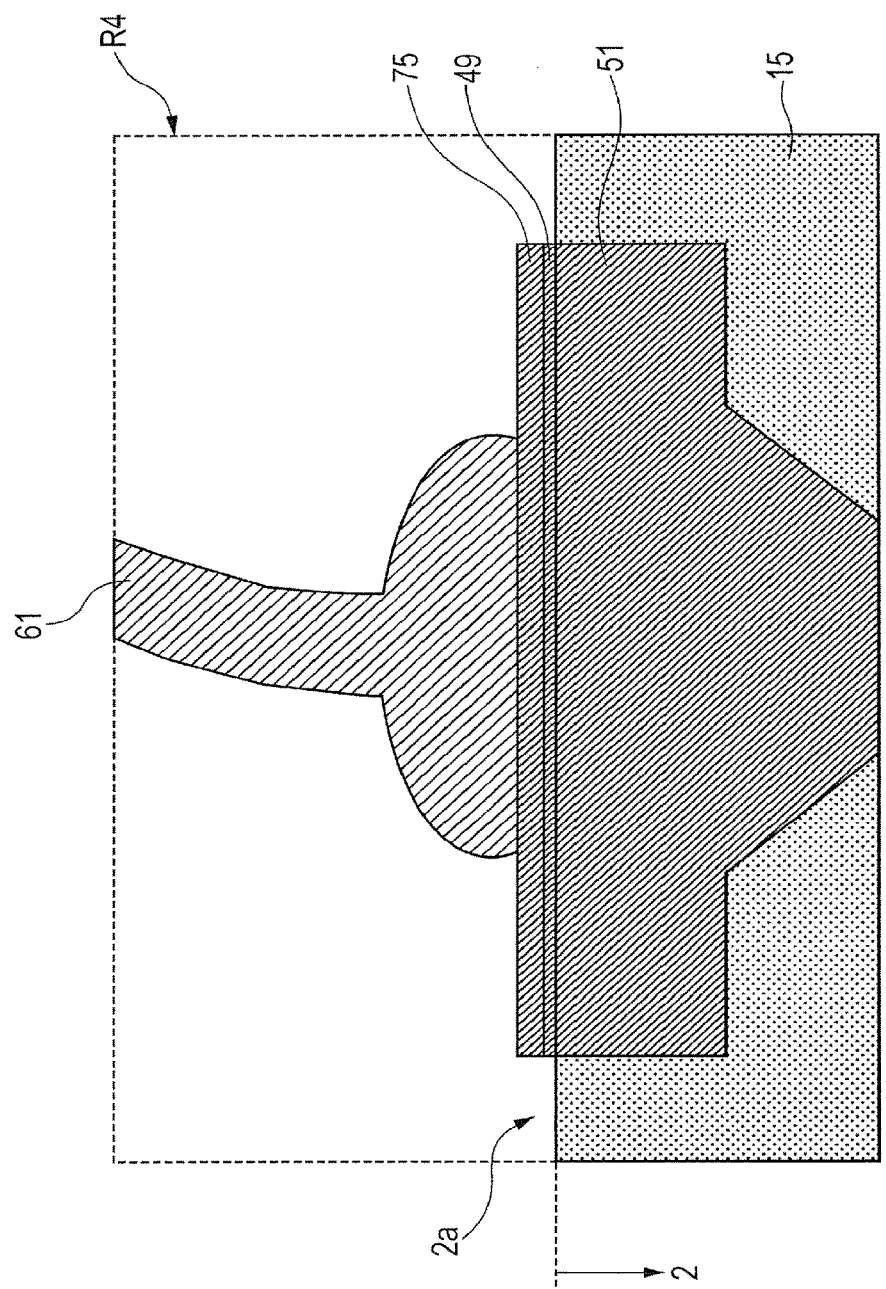
FIG. 31 is an enlarged sectional view of the peripheral region R4 of the bonding pad over the top surface of the chip in FIG. 13, for explaining a variation of the structure in FIG. 16.
Figure 32:
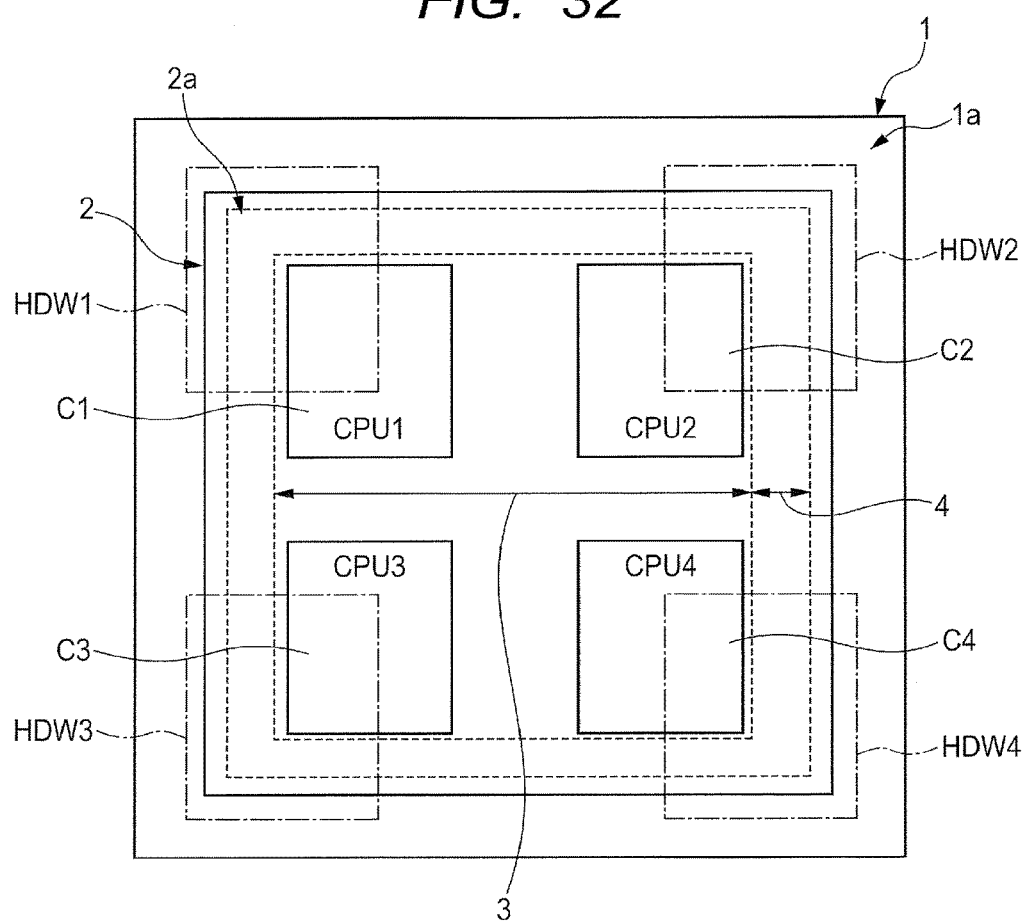
FIG. 32 is an overall top view of a BGA, etc., corresponding to FIG. 3, for making additional description and consideration for technical challenges, etc., with respect to the embodiments (including variations)
Figure 33:
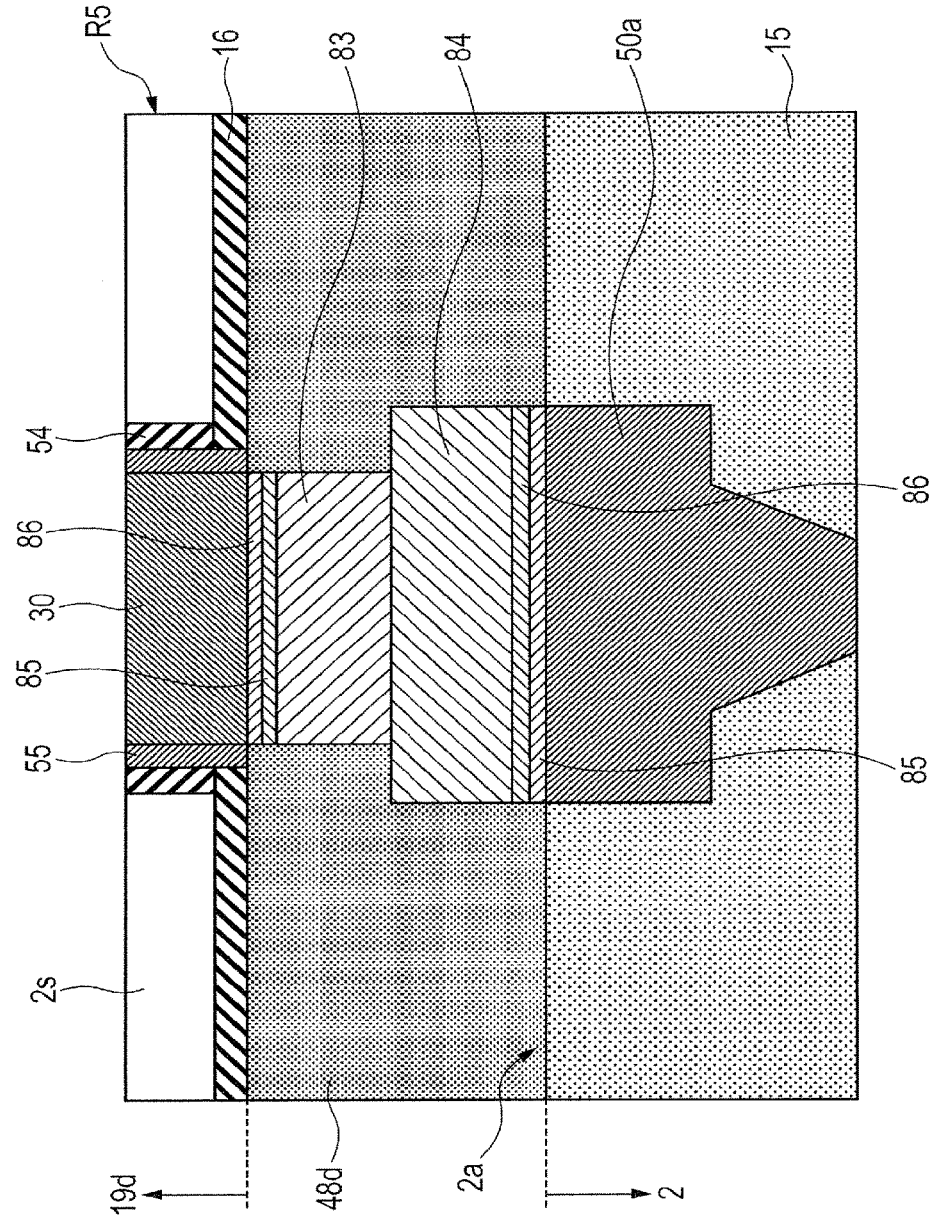
FIG. 33 is an enlarged sectional view of the connection region R5 between the system chip, etc., and the memory chip laminated body in FIG. 13, for explaining a variation of FIG. 15 (the metal adhesive layer 70, etc., is illustrated in a state before junction is formed, according to custom; the same shall apply hereinafter)

FIG. 28 is a schematic overall sectional view almost corresponding to FIG. 4, for explaining the outline, etc., of the one embodiment (including variations). FIG. 29 is a schematic overall sectional view almost corresponding to FIG. 4 (FIG. 28), for explaining the outline, etc., of other parts of the one embodiment (including variations). FIG. 30 is a schematic overall sectional view almost corresponding to FIG. 4 (FIGS. 28 and 29), for explaining the outline, etc., of the another embodiment (including variations). FIG. 31 is an enlarged sectional view of the peripheral region R4 of the bonding pad over the top surface of the chip in FIG. 13, for explaining a variation of the structure in FIG. 16. FIG. 32 is an overall top view of a BGA, etc., corresponding to FIG. 3, for making additional description and consideration for technical challenges, etc., with respect to the embodiments (including variations). FIG. 33 is an enlarged sectional view of the connection region R5 between the system chip, etc., and the memory chip laminated body in FIG. 13, for explaining a variation of FIG. 15 (the metal adhesive layer 70, etc., is illustrated in states before junction is formed, according to custom; the same shall apply hereinafter). FIG. 34 is an enlarged sectional view of the connection region R6 between the memory chips in FIG. 19, for explaining a variation of FIG. 21 (the metal adhesive layer 70, etc., is illustrated in state before junction is formed, according to custom; the same shall apply hereinafter). Additional description of the embodiments (including variations) and consideration of the above whole description will be made with reference to these views.

(1) Additional Description and Consideration of Technical Challenges, etc., with respect to the Embodiments (including Variations) (Mainly FIG. 32):

An example of a schematic planar layout of a BGA, in which a multi-core type logic chip 2 that is a main target of the embodiments is mounted, will be illustrated in FIG. 32. In the multi-core type logic chip 2, a plurality of (e.g., four in this example) CPU 1 (C1), CPU 2 (C2), CPU 3 (C3), and CPU 4 (C4) are arranged over the chip, as illustrated in FIG. 32. Accordingly, in the case of, for example, flip-chip bonding (face-down), the wiring over the organic wiring board 1 (BGA interposer) near to the corner portions of the chip 2 become overcrowded in wiring-overcrowded regions HDW1, HDW2, HDW3, and HDW4, and hence there occur places where many terminals for reinforcement of power supply and grounding cannot be arranged. Namely, it has been made clear that, even if the supply of a power supply potential (or a ground potential) to the internal circuit region 3 or the I/O circuit region 4 is intended to be reinforced, terminals cannot be arranged because there is no space for arranging them, and as a result, a problem is caused, in which a power supply potential is decreased near to the places (near to the internal circuit region 3 and the I/O circuit region 4).

(2) Description of Outline, etc., of the One Embodiment (including Variations) (Mainly FIG. 28):

Accordingly, the outline of the device structure in the one embodiment can be summarized as follows: as illustrated, for example, in FIG. 28, the semiconductor chip 2 is mounted over the top surface 1a of the first organic wiring board 1 in a face-up manner, and the first group 31 of the metal through electrodes in the semiconductor chip 2 and the first metal land 21 over the top surface 1a of the first organic wiring board 1 are electrically connected with one another via the first conductive adhesive member film 41. Thereby, a power supply potential Vddc is supplied to the internal circuit region 3 via the first group 31 of the metal through electrodes.

(3) Description of Outline, etc., of Other Issues of the One Embodiment (including Variations) (Mainly FIG. 29):

The outline of other issues with respect to the device structure in the one embodiment can be summarized as follows: as illustrated, for example, in FIG. 29 in addition to FIG. 28, the first bonding pad 51, on the side of the top surface 2a of the semiconductor chip 2, and the second metal land 22, on the side of the top surface 1a of the first organic wiring board 1, are electrically connected with one another via the first bonding wire 61, and thereby a power supply potential Vddh is supplied to the second integrated circuit region 4.

(4) Description of Outline, etc., of the Another Embodiment (including Variation) (Mainly FIG. 30):

The outline of the device structure in the another embodiment described in Section 4 can be summarized as follows: as illustrated, for example, in FIG. 30, the semiconductor chip 2 is mounted over the top surface 1a of the first organic wiring board 1 in a face-down manner, and the first group 31 of the metal through electrodes and the first metal land 21 over the top surface 1a of the first organic wiring board 1 are electrically connected one another near to the rear surface 2b of the semiconductor chip 2, via the first bonding wire 61. Herein, the semiconductor chip 2 is flip-chip bonded by groups of bump electrodes including the first group 81 of the bump electrodes and the second group 82 of the bump electrodes.

(5) Description of Variation of the Structure in FIG. 16 (Mainly FIG. 31):

In the structure in FIG. 16 described in Subsection (1) in Section 3, for example, an intermediate metal layer can be interposed over the upper surface of the bonding pad 51 (e.g., copper bonding pad), as illustrated in FIG. 31. The intermediate metal layer can be exemplified, for example, by an UBM film 49 (such as, for example, a titanium film, TiW film, nickel film, tantalum film, or the like), which is used as a lower layer film, and by a bonding metal film 75 (such as an aluminum film, gold film, palladium film, or the like).

(6) Description of Variation of FIG. 15 in Subsection (1) in Section 3 (Mainly FIG. 33):

The example to be described in this section is a variation of the structure described with reference to FIG. 15. Accordingly, the portions different from those in FIG. 15 will only be described in principle. For convenience and in principle, the following also describes a state before junction is completed in the same way as before.

The example illustrated in FIG. 33 is characterized by that the metal through electrode 30 does not substantially protrude from the rear surface of the semiconductor substrate layer 2s, unlike the structure in FIG. 15. Thereby, there is the advantage that a memory chip can be easily manufactured.

Corresponding to this, for example, a nickel film 85 is provided as a barrier metal film over the top surface of the bonding pad 50a (e.g., copper bonding pad), and, for example, a gold film 86 is provided thereover as an antioxidant film, and, for example, a lower solder film 84 including lead-free solder, etc., is provided thereover as a bonding member, as illustrated in FIG. 33.

On the other hand, for example, a nickel film 85 is provided as a barrier metal film over the lower surface of the metal through electrode 30, and, for example, a gold film 86 is provided as an antioxidant film over the top surface thereof, and, for example, an upper solder film 83 including lead-free solder, etc., is provided as a bonding member over the top surface thereof.

(7) Description of Variation of FIG. 21 in Subsection (2) in Section 3 (Mainly FIG. 34):

The example to be described in this section is a variation of the structure described with reference to FIG. 21. Accordingly, the portions different from those in FIG. 21 will only be described in principle. For convenience and in principle, the following also describes a state before junction is completed in the same way as before.

The example illustrated in FIG. 34 is characterized by that the metal through electrode 30 does not substantially protrude from the rear surface of the semiconductor substrate layer 2s, unlike the structure in FIG. 21. Thereby, there is the advantage that a memory chip can be easily manufactured. Further, because a copper core ball is used, there is the advantage that the gap between the memory chips can be made relatively large for wire bonding.

Corresponding to this, for example, a TiW film 87 (in addition to this, a chromium film, etc.) and the nickel film 85 are provided, for example, as barrier metal films over the bonding pad 50b (aluminum-based metal bonding pad), and, for example, the gold film 86 is provided as an antioxidant film over the top surface of the nickel film 85, as illustrated in FIG. 34. In this example, a copper core ball 88, which is coated, for example, with the lower solder film 84, is provided over these UBM films.

On the other hand, for example, the nickel film 85 is provided as a barrier metal film over the lower end surface of the metal through electrode 30, and, for example, the gold film 86 is provided as an antioxidant film over the top surface thereof, and, for example, the upper solder film 83 including lead-free solder, etc., is provided as a bonding member over the top surface thereof.

Herein, for example, the inter-chip insulating adhesive layer 48a (under-fill layer) is provided between the upper and lower chips in the same way as that in FIG. 21.

6. Summary

The present invention made by the present inventors has been specifically described above based on preferred embodiments; however, the invention should not be limited thereto, and it is needless to say that the invention may be modified variously within a range not departing from the gist thereof.

For example, a copper damascene structure (embedded wiring) and a copper pad structure have been mainly and specifically described as examples of the wiring structure and pad layer structure of the logic chip in the aforementioned embodiments; however, it is needless to say that aluminum-based non-embedded wiring may be adopted as the wiring structure and an aluminum-based pad layer structure may be adopted as the pad layer structure.

Similarly, with respect to the memory chip, aluminum-based non-embedded wiring and an aluminum-based pad layer structure have been mainly and specifically described as the wiring structure and pad layer structure; however, it is needless to say that a copper damascene structure (embedded wiring) may be adopted as the wiring structure and a copper pad structure may be adopted as the pad layer structure.

Additionally, a via middle method has been mainly and specifically described as an example of the TSV, etc.; however, it is needless to say that other methods may be adopted.

Additionally, a substrate (four-layered wiring board), in which one build-up layer is added to each of both sides of a glass-epoxy core substrate, has been specifically described as an example of the organic wiring board in the embodiments; however, it is needless to say that other type substrates (of course, the number of the wiring layers is not limited) may be adopted.

What is claimed is:

1. A semiconductor integrated circuit device comprising:
    an organic wiring substrate having a top surface on which a first metal land and a second metal land are formed, and rear surface opposite the top surface;
    a first semiconductor chip having:
        a silicon substrate including a first main surface and a second main surface,
        a first integrated circuit and a second integrated circuit formed on the first main surface of the silicon substrate,
        a first metal through electrode penetrating between the first main surface and the second main surface of the silicon substrate to supply a first voltage to the first integrated circuit,
        a multilayer wiring layer formed on the first main surface of the silicon substrate, and
        a first bonding pad formed over the first main surface of the silicon substrate via the multilayer wiring layer to supply a second voltage to the second integrated circuit,
    wherein the silicon substrate is mounted on the organic wiring substrate such that the second main surface of the silicon substrate faces the top surface of the organic wiring substrate,
    wherein the first metal through electrode is electrically connected to the first metal land via a first conductive member that is provided between the top surface of the organic wiring substrate and the second main surface of the silicon substrate, and
    wherein the first bonding pad is electrically connected to the second metal land via a first bonding wire.

2. The semiconductor integrated circuit device according to claim 1,
    wherein the first integrated circuit is an internal circuit and the second integrated circuit is an I/O circuit region.

3. The semiconductor integrated circuit device according to claim 2,
    wherein the second integrated circuit is arranged around the first integrated circuit.

4. The semiconductor integrated circuit device according to claim 1,
    wherein a third metal land is formed on the top surface of the organic wiring substrate,
    wherein the first semiconductor chip has a second metal through electrode penetrating between the first main surface and the second main surface of the silicon substrate to supply a third voltage different from the first voltage to the first integrated circuit, and wherein the second metal through electrode is electrically connected to the third metal land via a second conductive member that is provided between the top surface of the organic wiring substrate and the second main surface of the silicon substrate.

5. The semiconductor integrated circuit device according to claim 4, wherein a fourth metal land is formed on the top surface of the organic wiring substrate, wherein the first semiconductor chip has a second bonding pad formed over the first main surface of the silicon substrate via the multilayer wiring layer to supply a fourth voltage different from the second voltage to the second integrated circuit, and wherein the second bonding pad is electrically connected to the fourth metal land via a second bonding wire.

6. The semiconductor integrated circuit device according to claim 1, wherein the first conductive member includes a conductive paste member.

7. The semiconductor integrated circuit device according to claim 1, wherein the first conductive member includes a solder member.

8. The semiconductor integrated circuit device according to claim 1, further comprising:

a second semiconductor chip mounted over the first main surface of the first semiconductor chip, wherein the second semiconductor chip includes a silicon substrate penetrated by a second metal through electrode, and wherein the first semiconductor chip has a first pad formed over the first main surface of the silicon substrate via the multilayer wiring layer to electrically connect to the second metal through electrode.

9. The semiconductor integrated circuit device according to claim 8, wherein the second semiconductor chip is a memory chip.

* * * * *